United States Patent [19]

Albrecht et al.

[11] 4,316,259
[45] Feb. 16, 1982

[54] PROGRAMMABLE FUNCTION GENERATOR

[75] Inventors: Charles D. Albrecht, Commack; Edward J. McCormick, Hauppauge, both of N.Y.

[73] Assignee: Grumman Aerospace Corporation, Bethpage, N.Y.

[21] Appl. No.: 131,821

[22] Filed: Mar. 18, 1980

[51] Int. Cl.³ .............................................. G06F 15/34
[52] U.S. Cl. ........................................ 364/718; 371/27
[58] Field of Search ............. 364/718, 851; 324/73 R; 371/27

[56] References Cited

U.S. PATENT DOCUMENTS

| | | | |
|---|---|---|---|
| 3,082,374 | 3/1963 | Buuck | 324/73 R |
| 3,631,229 | 12/1971 | Bens | 324/73 R X |
| 3,651,315 | 3/1972 | Collins | 324/73 R X |
| 3,662,160 | 5/1972 | Hoppes | 364/718 |
| 3,694,632 | 9/1972 | Bloomer | 324/73 AT X |
| 3,764,995 | 10/1973 | Helf, Jr. et al. | 324/73 R X |
| 3,771,061 | 11/1973 | Bayer | 324/77 C |
| 3,822,380 | 7/1974 | Forgione | 364/718 |
| 3,969,617 | 7/1976 | Fontanes | 364/718 |
| 4,000,460 | 12/1976 | Kadekia | 324/73 R |
| 4,001,559 | 1/1977 | Osborne et al. | 364/481 |
| 4,064,423 | 12/1977 | Atkisson | 364/718 |
| 4,068,178 | 1/1978 | Tunzi | 364/718 X |
| 4,089,058 | 5/1978 | Murdock | 364/571 |
| 4,104,725 | 8/1978 | Rose et al. | 364/487 |
| 4,114,189 | 9/1978 | Davis | 364/718 |
| 4,125,898 | 11/1978 | DeHart et al. | 364/718 |
| 4,149,235 | 4/1979 | Froyd et al. | 364/101 |
| 4,231,099 | 10/1980 | Stavers | 364/718 |

Primary Examiner—David H. Malzahn
Attorney, Agent, or Firm—Morgan, Finnegan, Pine, Foley & Lee

[57] ABSTRACT

A programmable function generator which provides three independent signal sources for use as test stimuli in automatic test equipment is disclosed.

Each of the three signal outputs are separately programmable as either a function generator, or as a pulse generator. In the function mode, the output is selectable from sine, square, ramp, triangle, or a user defined arbitrary function. In the pulse mode, the output is selectable as a single pulse or a double pulse.

23 Claims, 57 Drawing Figures

| AMPLITUDE CODE: | | | | |
|---|---|---|---|---|
| | | D LATCH | | |
| P2 | | IN | OUT | DAC-IN |
| MSB 19 | | U21-4 | U21-3 | U42-1 |
| ↑ 17 | | U21-5 | U21-6 | U42-2 |
| 15 | | U21-12 | U21-11 | U42-3 |
| 16 | | U21-13 | U21-14 | U42-4 |
| 13 | | U22-4 | U22-3 | U42-5 |
| BIT WEIGHT OF DAC 11 | | U22-5 | U22-6 | U42-6 |
| 7 | | U22-12 | U22-11 | U42-7 |
| 9 | | U22-13 | U22-14 | U42-8 |
| 6 | | U23-4 | U23-3 | U42-9 |
| 5 | | U23-5 | U23-6 | U42-10 |
| ↓ 3 | | U23-12 | U23-11 | U42-11 |
| LSB 1 | | U23-13 | U23-14 | U42-12 |
| LIMIT VALUES | P2 INPUT | DAC U42-IN | TP4 | SIG OUT |
| | FFF HEX | 000 HEX | +10 VDC | MAX |
| | 000 HEX | FFF HEX | ZERO | ZERO |

P2-8    AMPLITUDE CLOCK (POSITIVE EDGE)
P2-14    AMPLITUDE CLEAR (ACTIVE LOW)

FIG. 8A

| BIAS CODE: | | | | |
|---|---|---|---|---|
| P2 | D LATCH IN | D LATCH OUT | | DAC-IN |
| MSB 63 | U14-4 | U14-2 | | U36-1 |
| 65 | U14-5 | U14-6 | | U36-2 |
| 64 | U14-12 | U14-11 | | U36-3 |
| 61 | U14-13 | U14-14 | | U36-4 |
| 59 | U15-4 | U15-3 | | U36-5 |
| 57 | U15-5 | U15-6 | | U36-6 |
| 55 | U15-12 | U15-11 | | U36-7 |
| 56 | U15-13 | U15-14 | | U36-8 |
| 54 | U16-4 | U16-3 | | U36-9 |
| 51 | U16-5 | U16-6 | | U36-10 |
| 49 | U16-12 | U16-11 | | U36-11 |
| LSB 47 | U16-13 | U16-14 | | U36-12 |

(BIT HEIGHT OF DAC, MSB → LSB)

| LIMIT VALUES | P2 INPUT | U36-IN | TP2 | SIG OUT |
|---|---|---|---|---|
| | 7FF HEX | 000 HEX | +10 VDC | -10 VDC |
| | 800 HEX | FFF HEX | -10 VDC | +10 VDC |

P2-53  BIAS CLOCK  (POSITIVE EDGE)
P2-62  BIAS CLEAR  (ACTIVE LOW)

| SHAPE CODE: | | | |
|---|---|---|---|
| P2 | D LATCH IN | D LATCH OUT | DAC-IN |
| MSB 46 | U18-2 | U18-6 | U38-5 |
| 41 | U18-12 | U18-9 | U38-6 |
| 48 | U17-2 | U17-5 | U38-7 |
| 45 | U17-12 | U17-9 | U38-8 |
| 35 | U20-2 | U20-5 | U38-9 |
| 33 | U20-12 | U20-9 | U38-10 |
| 40 | U19-2 | U19-5 | U38-11 |
| LSB 37 | U19-12 | U19-9 | U38-12 |

(BIT WEIGHT OF DAC)

WITH: P2-32  LOW  (FUNCTION MODE)
      P2-30  LOW  (SCALE 2)
      AMPLITUDE  FFF HEX
      BIAS       000 HEX

| LIMIT VALUES | P2 INPUT | U38-IN | SIG OUT |
|---|---|---|---|
| | 7F HEX | FF HEX | +10 VDC |
| | 81 HEX | 01 HEX | -10 VDC |

P2-43  SHAPE CLOCK   (POSITIVE EDGE)
P2-39  SHAPE CLEAR   (ACTIVE LOW)
P2-38  SHAPE PRESET  (ACTIVE LOW)

(CLEAR = ZERO VOLT PK-TO-PK; PRESET = -1 LSB OF PK-TO-PK = -80mV)

FIG. 8B

PROGRAMMABLE FUNCTION GENERATOR

BACKGROUND OF THE INVENTION

This invention relates to the field of high performance function generators, and more particularly to a programmable function generator which provides three independent signal sources for use in computer controlled automatic test equipment (ATE).

Typically, sophisticated ATE configured as an automatic test station finds wide application in the avionics instrumentation field. Examples of such ATE are found in the computerized automatic testers (CAT-series) sold by the assignee herein, Grumman Aerospace Corporation. Automatic testing of the various electronic systems and subsystems of an aircraft may be readily conducted by means of such automatic test equipment.

In many applications, a particular unit-under-test (UUT) requires a variety of test stimuli in order to check out its performance characteristics. Such test stimuli may include, for example, pulse, square, sine, ramp, triangular or user defined functions. Furthermore, many UUT's require the application of several different kinds of test stimuli simultaneously. It is apparent that the quantity and complexity of test stimuli increases as the functional performance requirements of the UUT are made more complex.

An optimal function generator for providing test stimuli to a UUT would have several basic capabilities. First, the function generator should be versatile and reliable. It should be able to provide a variety of independent signal sources, including standard pulse, square, sine, ramp, triangular or user defined functions simultaneously to the UUT. Second, the function generator should be capable of being synchronized by either an external trigger or an internal signal. Third, the function generator should be compatible with the software. It should work in a high level language environment, such as, for example, ATLAS, operate off the IEEE-488 general purpose interface bus and be easy to program. And finally, the function generator should be cost effective.

It is believed that prior to the present invention, there has not been available a programmable function generator having the capability of providing multiple independent outputs and corresponding phase related sync output signals.

It is accordingly a general object of the present invention to provide a programmable function generator which has characteristics more nearly approaching the optimal attributes described above, particularly those applicable to ATE applications.

It is a particular object of the invention to provide a programmable function generator having multiple independent signal outputs.

Other objects will be apparent in the following detailed description and the practice of the invention.

SUMMARY OF THE INVENTION

The foregoing and other objects and advantages which will be apparent in the following detailed description of the preferred embodiment, or in the practice of the invention, are achieved by the invention disclosed herein, which generally may be characterized as apparatus for generating an analog function in conjunction with an external data pattern comprising: programmable function generating means responsive to said data pattern for generating a plurality of digital words representative of said analog function, said programmable function generating means including digital logic means activated by external clocking means; control means for selectively transferring said data pattern to said programmable function generating means, said control means including microprocessor means adapted to receive said data pattern via interface means; and synthesizing means responsive to said programmable function generating means for converting said plurality of digital words to said analog function.

BRIEF DESCRIPTION OF THE DRAWINGS

Serving to illustrate an exemplary embodiment of the invention are the drawings of which:

FIGS. 8a and b illustrates the analog output network data input coding for the function and pulse modes.

DESCRIPTION OF THE PREFERRED EMBODIMENT

In order to afford a complete understanding of the invention and an appreciation of its advantages, a description of a preferred embodiment is presented below.

Figure 1:
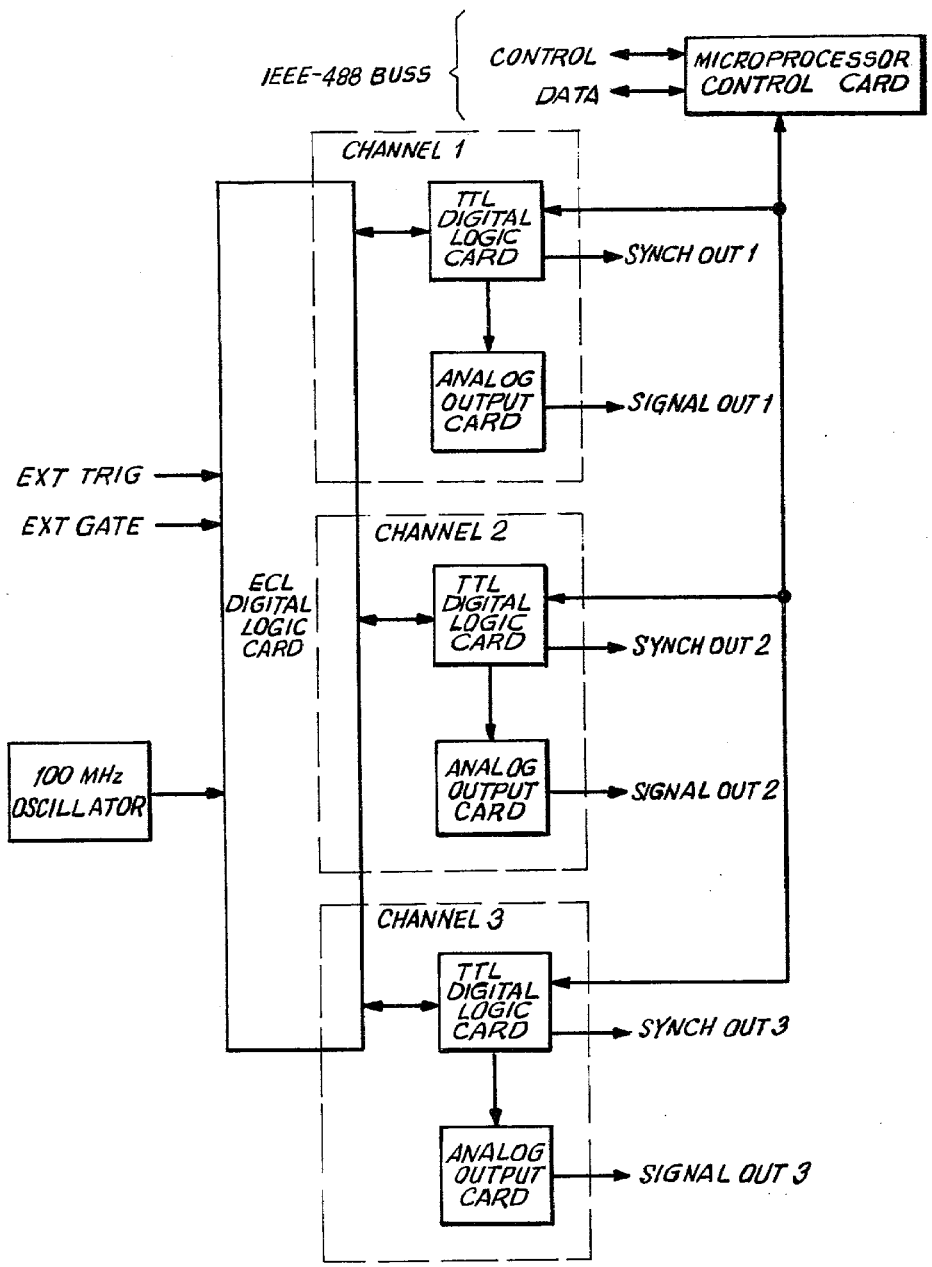
FIG. 1 is an overall block diagram of the programmable function generator.
Figure 2A:
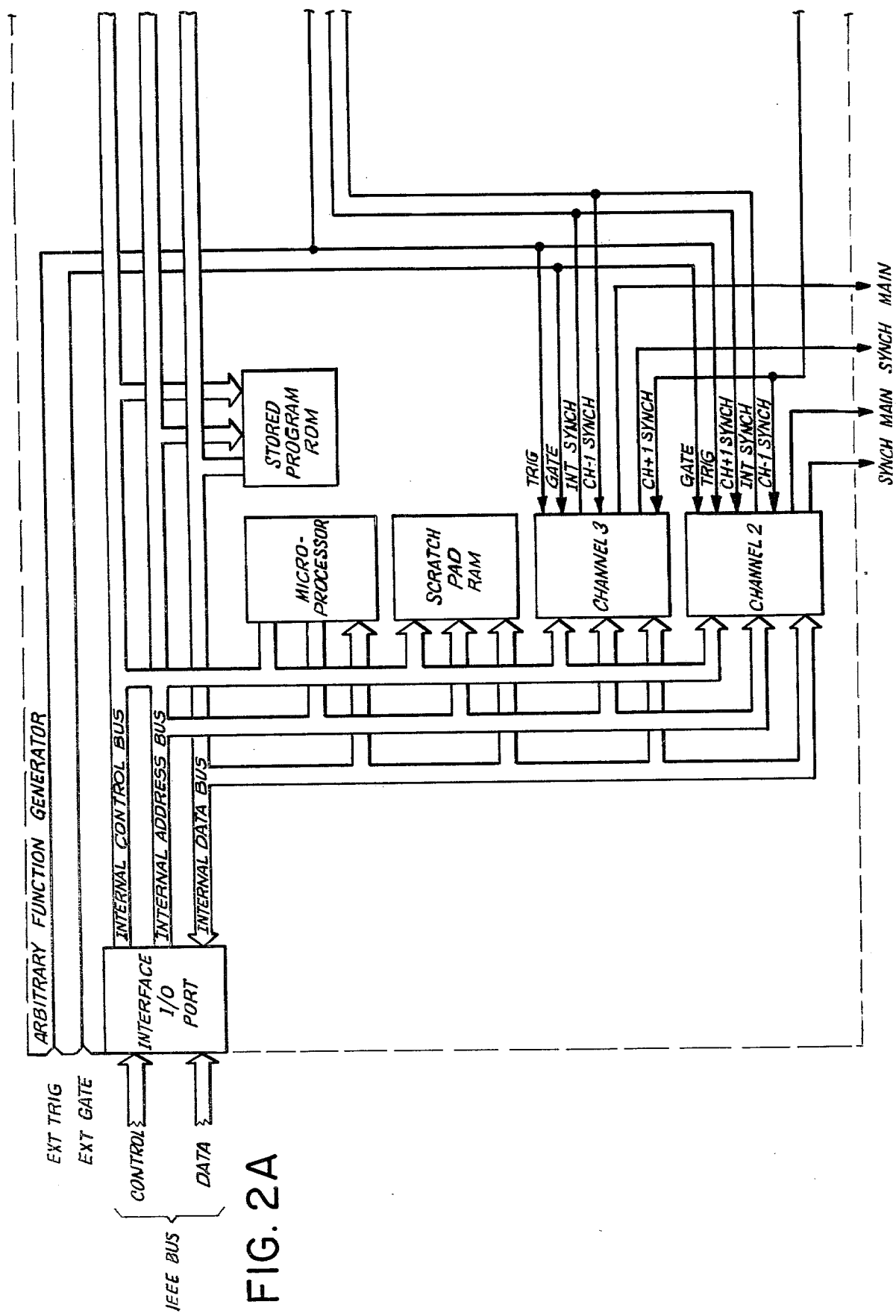
FIGS. 2a, b and c is a functional block diagram of the programmable function generator.
Figure 2B:
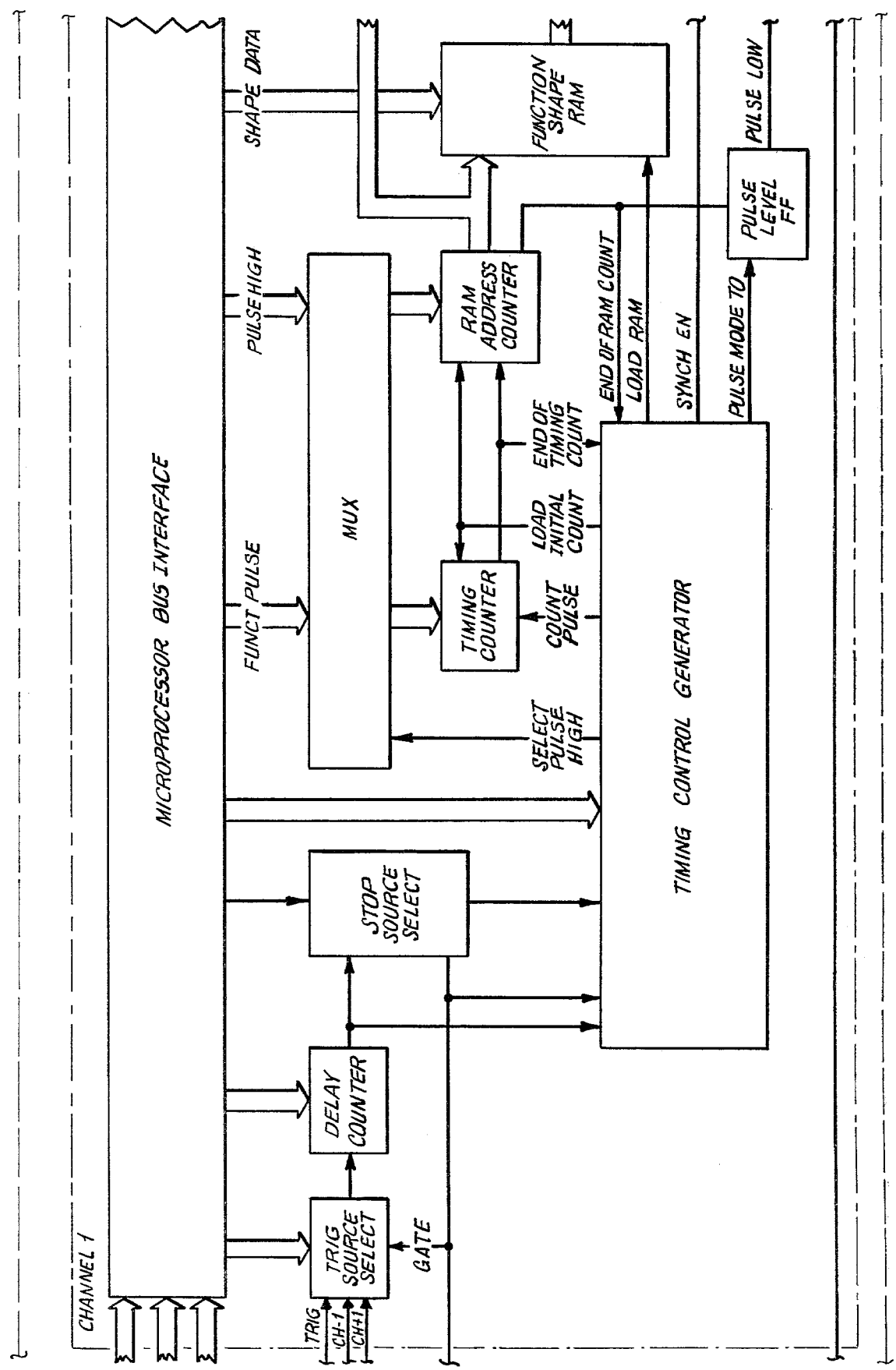
Figure 2C:
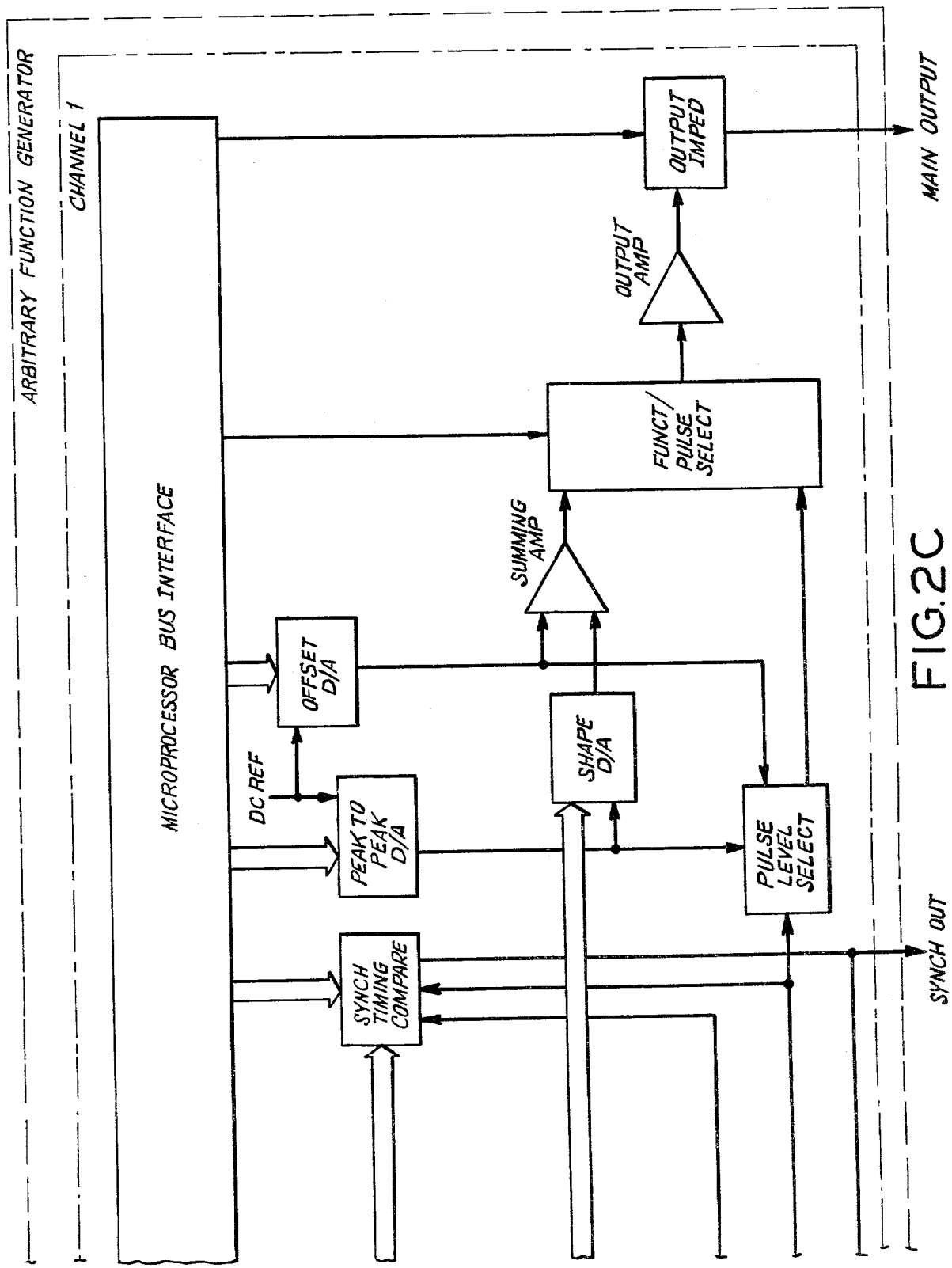

An overall block diagram of the programmable function generator is illustrated in FIG. 1 and a functional block diagram of the generator is illustrated in FIGS. 2a–c. As shown therein, the function generator consists of a Microprocessor Control subsystem and a Function/Pulse Generator subsystem. A host computer (not shown) which is part of an automatic test station is interfaced with the programmable function generator by means of the industry IEEE-488 GPIB communication bus.

As configured, the Function/Pulse Generator subsystem consists of three independent channels. However, it is noted that a minimum configuration programmable function generator would contain one channel.

As depicted in FIGS. 1 and 2a–c, and as explained in more detail below, each of the three channels has the same capability and can be independently programmed to be triggered and/or gated by an external trigger and external gate input signals. Each channel can be programmed to generate a SYNCH OUT signal. The SYNCH OUT signal can trigger one, or both, of the other two generators and provide a timing relationship between the signals generated. When one of the three channels is in the function mode, the phase relationship (time delay) of its SYNCH OUT can be varied from 0° to 360° with respect to its main output. In addition to the standard outputs (Single and Double Pulse, Square, Cosine, Ramp, and Triangle), the user can define his own arbitrary functions for any, or all, of the three channels. For nonpulsed modes, the functions are synthesized by outputting up to 1024 voltage values per period. When a channel is being triggered or synchronized while generating a sinusoidal wave, the timing between triggers and output is referenced to a cosine wave, plus or minus a phase shift, in order to avoid introduction of amplitude errors for less than 1024 point wave forms.

The Microprocessor Control subsystem receives commands and data over an IEEE-488 digital interface bus. ASCII character string data is received and checked with illegal, or bad, data. Valid data is processed and, at the appropriate time, the interpreted data for the requested output is loaded into the specified channels. The signal and sync outputs are generated in accordance with data stored and/or entered in 20, 8 bit (1 byte) data ports.

Figure 3:
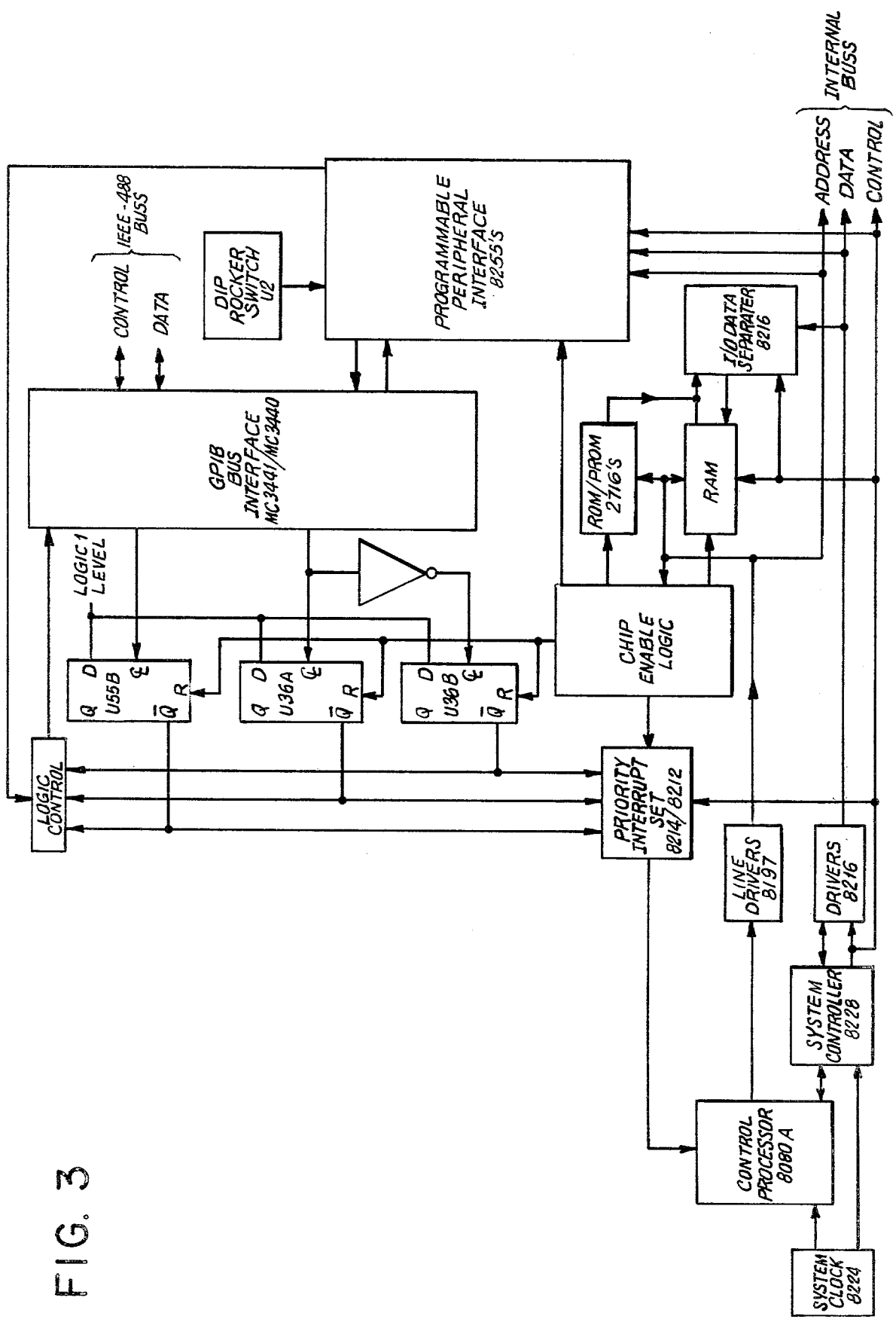
FIG. 3 is a functional block diagram of the microprocessor control subsystem.

Referring now to FIG. 3, a functional block diagram of the Microprocessor Control subsystem is illustrated. As shown therein, the circuitry can be divided into the following four networks: CPU set; system bus drivers; IEEE-488 interface; and memory circuits.

The CPU set consists of the Intel 8080A Control Processor, the Intel 8228 System Controller and the Intel 8224 System Clock. The CPU set performs all system processing functions and provides a stable timing reference for the system circuits. All address and control signals necessary to access the memory and all I/O ports in the system are initiated by the CPU set. All 78 instructions of the 8080A instruction set can be fetched and executed by the CPU set. The CPU set can respond to interrupt requests originating within or without the Microprocessor Control subsystem. In addition, it responds to wait requests from memory and/or I/O ports, which have an access time slower than the 8080A's cycle time. The CPU contains six 8-bit general purpose registers, an accumulator, a sixteen-bit program counter, a sixteen-bit stack pointer, a sixteen-line address bus and an eight-line bidirectional data bus. The six general purpose registers may be addressed individually or in pairs to provide both single and double precision operators. The sixteen-bit stack pointer may be used to address a last-in/first-out data storage area, located in any part of memory for the temporary storage of the program counter, status flags, accumulator, and any or all general purpose registers to provide almost unlimited testing of subroutines. The entire instruction set of the 8080A is available for the generation of the programmable function generator control programs. The accumulator group instructions include arithmetic and logical operations with direct, register indirect, and immediate address-modes. Move, load, and store instructions allow the movement of data, 8 or 16 bits between memory, the accumulator and/or any of the general purpose registers, using any of the available addressing modes. Jumps, conditional jumps, and computed jumps, allow branching to various parts of the program. Conditional and unconditional calls and returns from subroutines are included as are single-byte call instructions (Restarts) for interrupt operations. The accumulator, memory, or each of the six general purpose registers may be incremented or decremented. Extended incrementing or decrementing is available for adjusting register pairs and the stack pointer. Arithmetic and interrupt handling capability of the 8080A is extended by the inclusion of double precision operators such as stack manipulation and double add instructions. The 8080A CPU is a dynamic MOS, CPU requiring clock pulses at all times. It operates continually, fetching, decoding, and executing instructions at a rate determined by the Intel 5224 System clock generator. The clock provides stable crystal controlled two-phased timing inputs for the 8080A. It also provides two outputs at a TTL level to be used for generating synchronized reset and ready signals for the CPU. 'Ready' and 'Reset' inputs, which are essentially asynchronous inputs, are synchronized to system timing within the 8224 chip to provide the required inputs to the CPU. All processing activities of the CPU set are referred to the period of the two clock signals. The 8228 System Controller generates all signals required to interface directly the 8080A with system RAM, ROM, and I/O ports. It isolates the 8080A data bus from the system bus. The 8228 generates the correct control signals to allow the use of multiple byte instructions in response to an Interrupt Acknowledge by the 8080A.

Tri-state, high power System Bus Drivers are provided on all address, data and control outputs of the CPU set.

Figure 4:
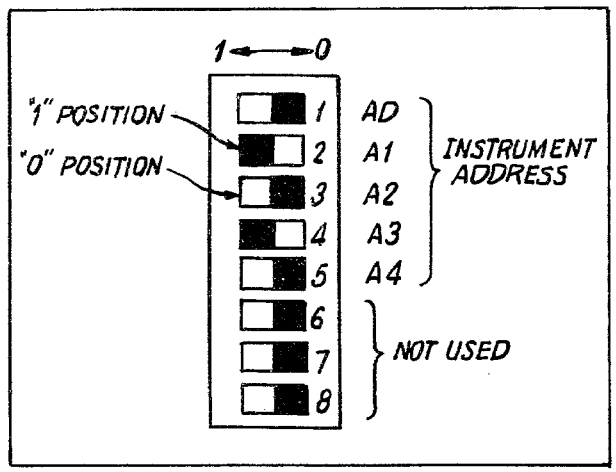
FIG. 4 illustrates the programmable function generator DIP rocker switch positions.

The IEEE-488 Bus Interface (GPIB) circuitry consists of two Intel 8255 Programmable Peripheral Interface microcircuits, the Motorola MC3441 and the Motorola MC3440 GPIB bus interface microcircuit, Priority Interrupt Chip Set (Intel 8214 and Intel 8212) and other conventional flip-flops, gates and decoders. The GPIB circuitry provides all the initial high speed handshake signals required on the GPIB. It provides the proper input impedance and necessary drive capability to operate in a GPIB system. The high speed response to command data, and IFC interrupts, is provided by Command flip-flop (U36A), Data flip-flop (U36B), and IFC flip-flop (U55B). These flip-flops initially set the GPIB bus interface drivers and receivers to their proper state in response to the attention and IFC signals on the GPIB. They simultaneously generate a proper interrupt to the 8080A through the Priority Interrupt Chip Set. The flip-flops will hold the GPIB in the suspended state intially required, until the slower firmware routine is actuated to take over handshake operations on the GPIB. When the firmware takes over, the flip-flops will be reset enabling them to respond to the next interrupt. One register of the input 8255 is used to sense the switch positions of five DIP rocker switches (U2). These are compared to the incoming address on the GPIB to determine if further response is necessary. The five switches are set up (at the time of installation into the system) in accordance with the switch positions and code illustrated in FIG. 4.

The memory circuits of the Microprocessor Control subsystem consist of 10K of ROM/PROM and 4K of RAM. The Random Access Memory (RAM) section provides the user with 4096×8 bits of storage area. This is normally used for storage of variable information used during execution of its instructions. It may also be used for temporary storage of a self-test procedure used during test of the subsystem. The Read Only Memory (ROM/PROM) section consists of five Intel 2716 2048×8 bit EPROMS (Erasable Programmable Read-Only-Memory). The first chip (2048×8) has the IEEE Bus Manager program inserted. There is also a monitor program which allows user interaction with the Microprocessor Control subsystem through the host computer when testing and troubleshooting. Three of the memory circuits contain the programmable function generator system which enables the Microprocessor Control subsystem to perform the previously discussed instructions. The fifth integrated circuit memory chip contains a table of cosine values utilized in conjunction with the programmable function generator system programs.

The function/pulse generator subsystem may be further subdivided into an Emitter Coupled Logic (ECL) digital logic network, a Transistor-Transistor Logic (TTL) digital logic network, and an analog output network.

The ECL network contains the TRIG SOURCE SELECT, STOP SOURCE SELECT, and TIMING CONTROL GENERATOR for each channel. The ECL network generates timing clocks independently for each channel for the delay, timing and RAM address counters. In addition, it also produces the start, stop load counter signals required for accuracy in the frequency of the output signal. All ECL network logic level signals have a termination network at the end of the signal path to eliminate ringing and reflections of the signal.

Figure 5A:
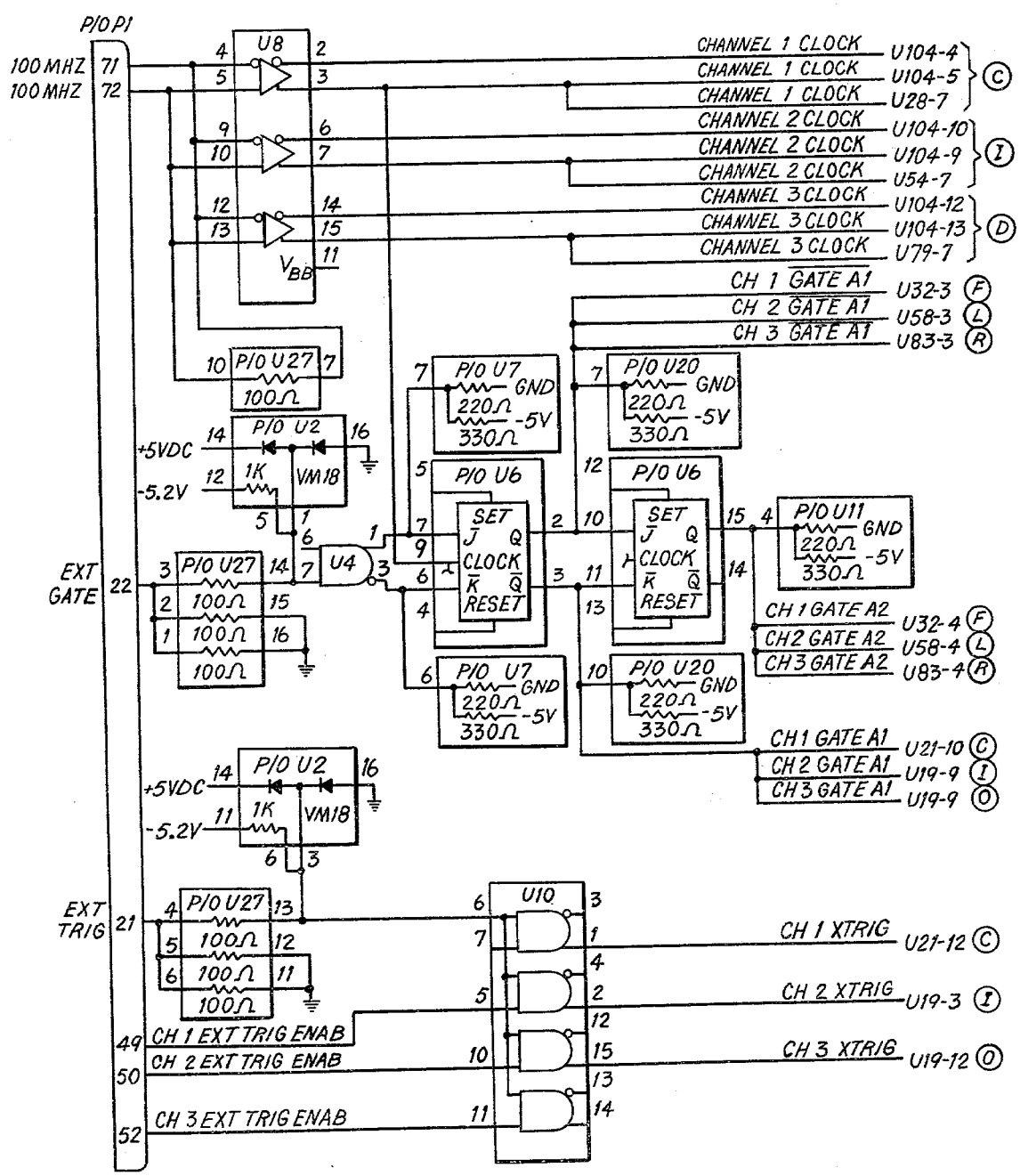
FIGS. 5a–u is a schematic diagram of the ECL digital logic network.
Figure 5B:
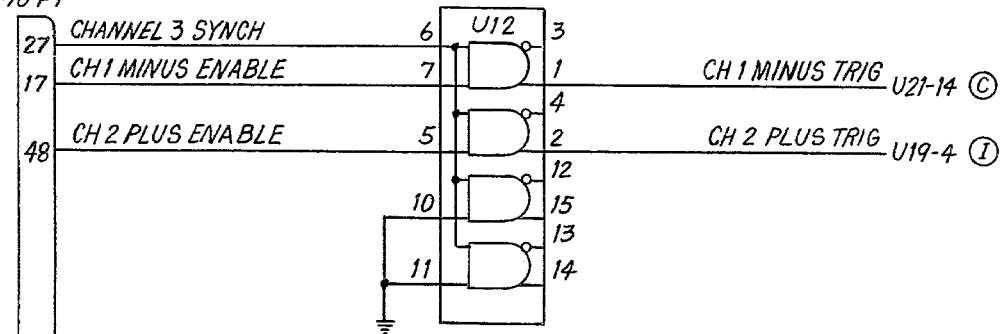
Figure 5B:
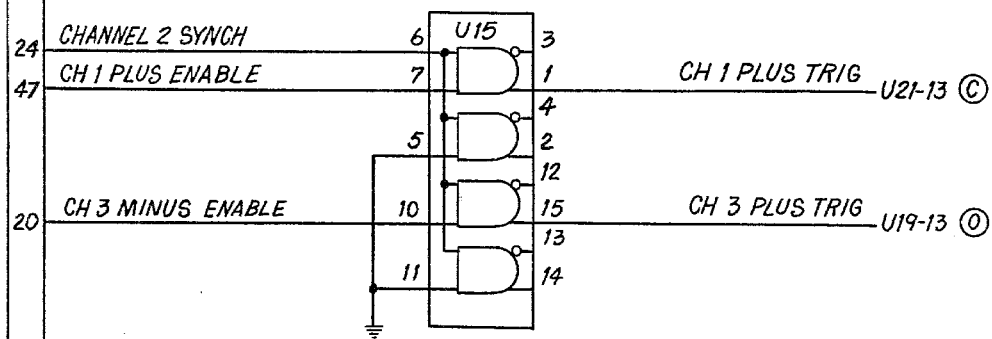
Figure 5B:
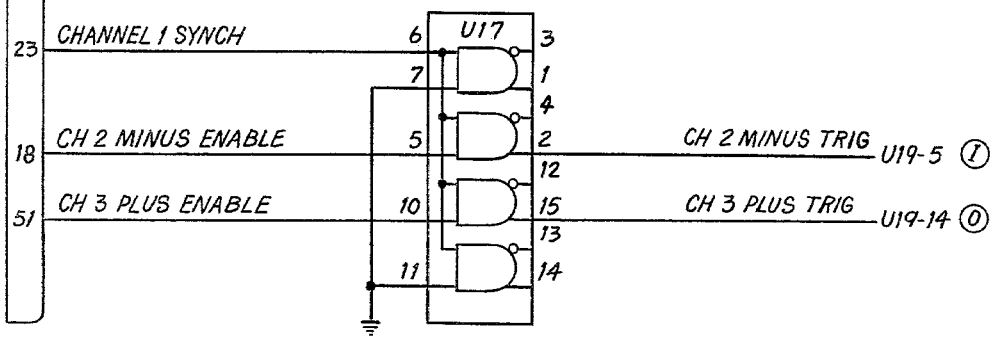
Figure 5C:
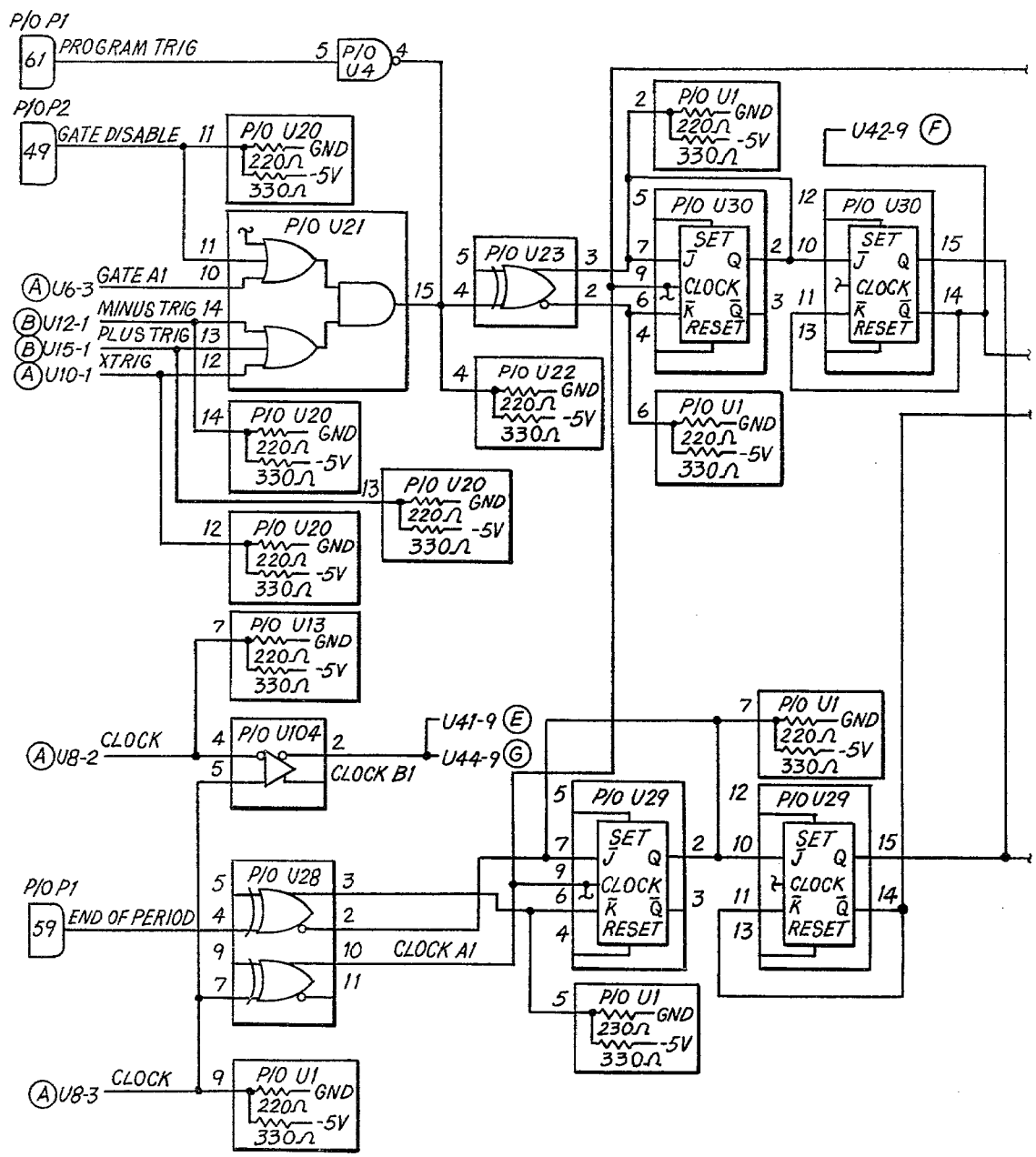
Figure 5D:
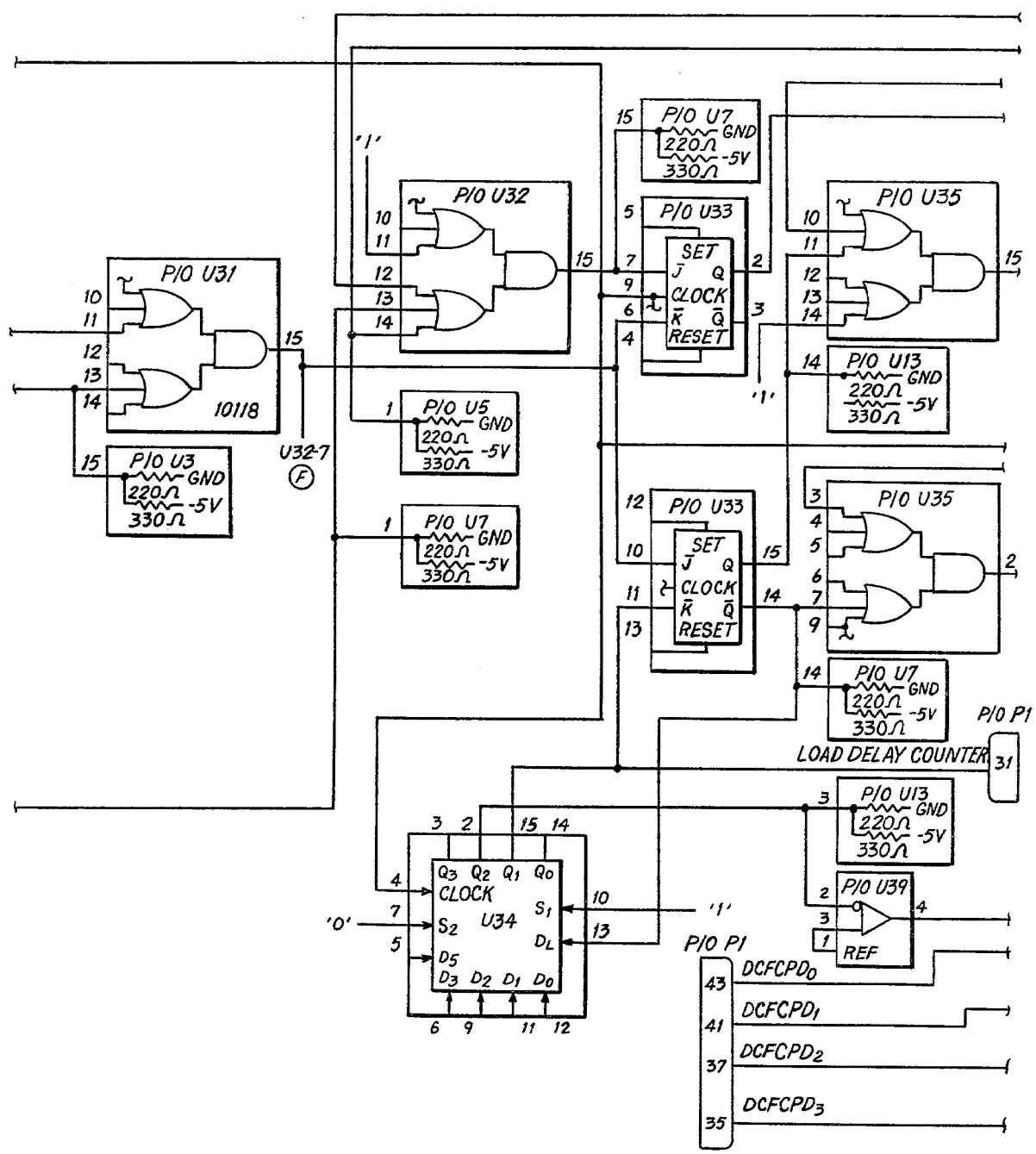
Figure 5E:
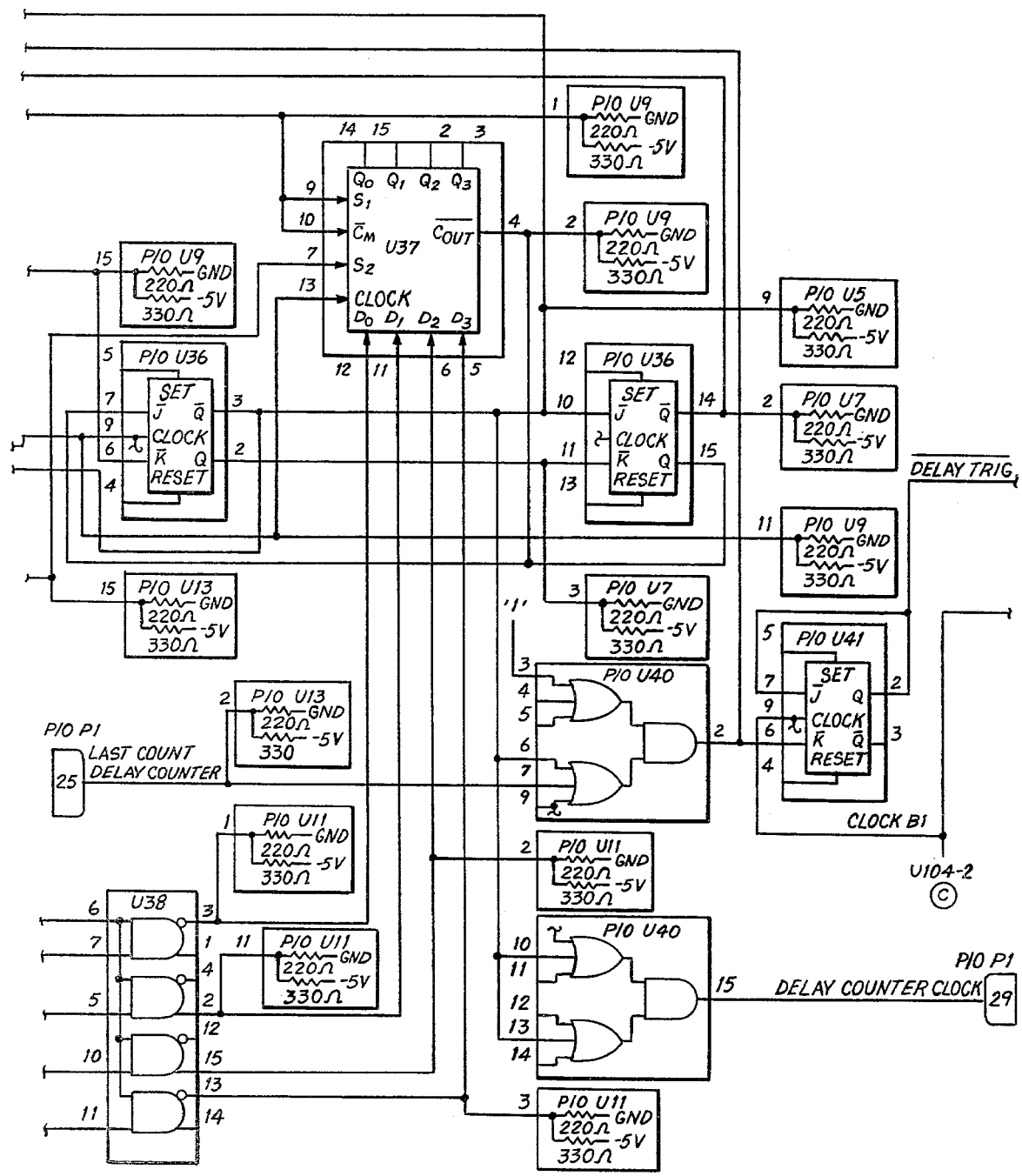
Figure 5F:
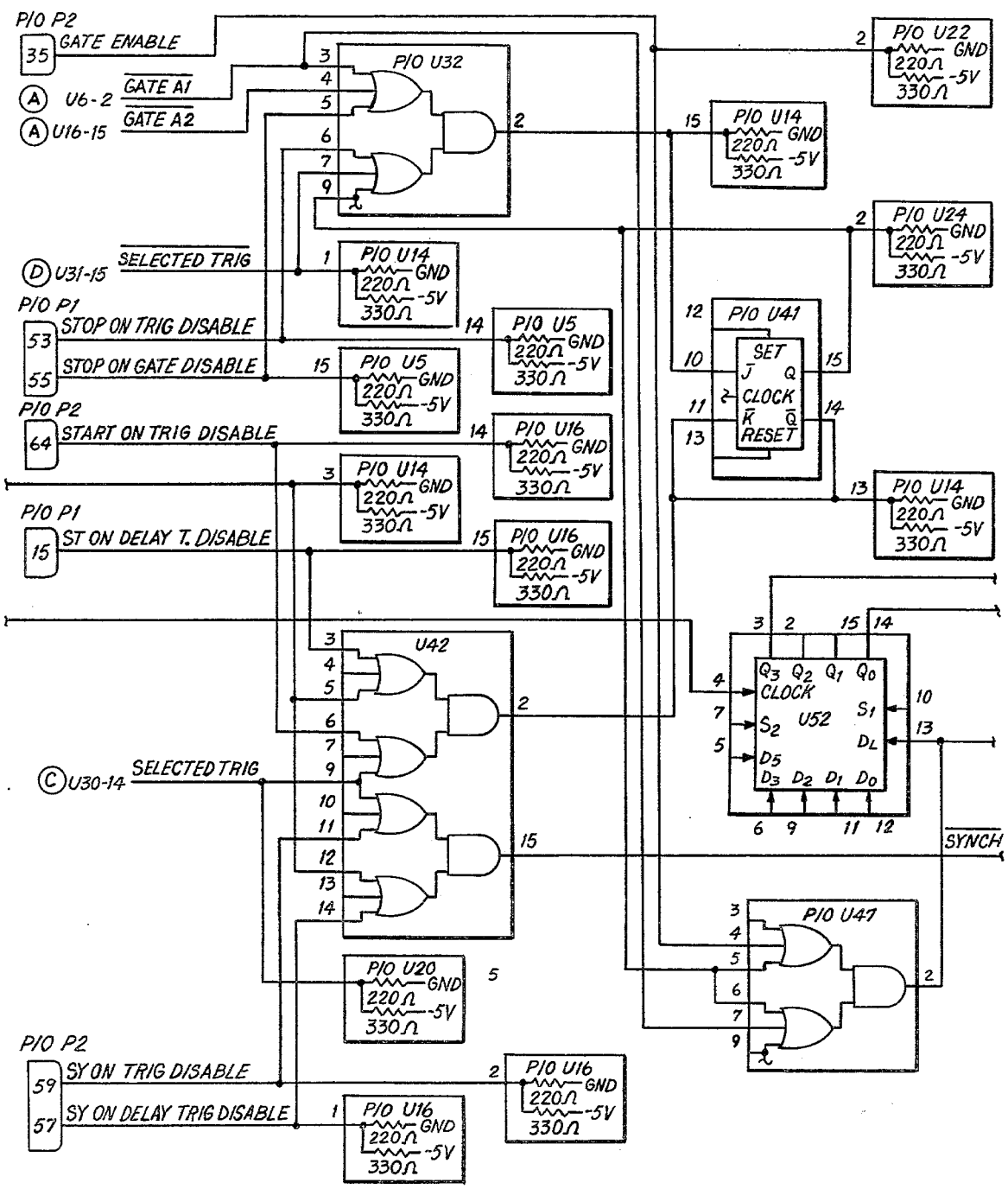
Figure 5G:
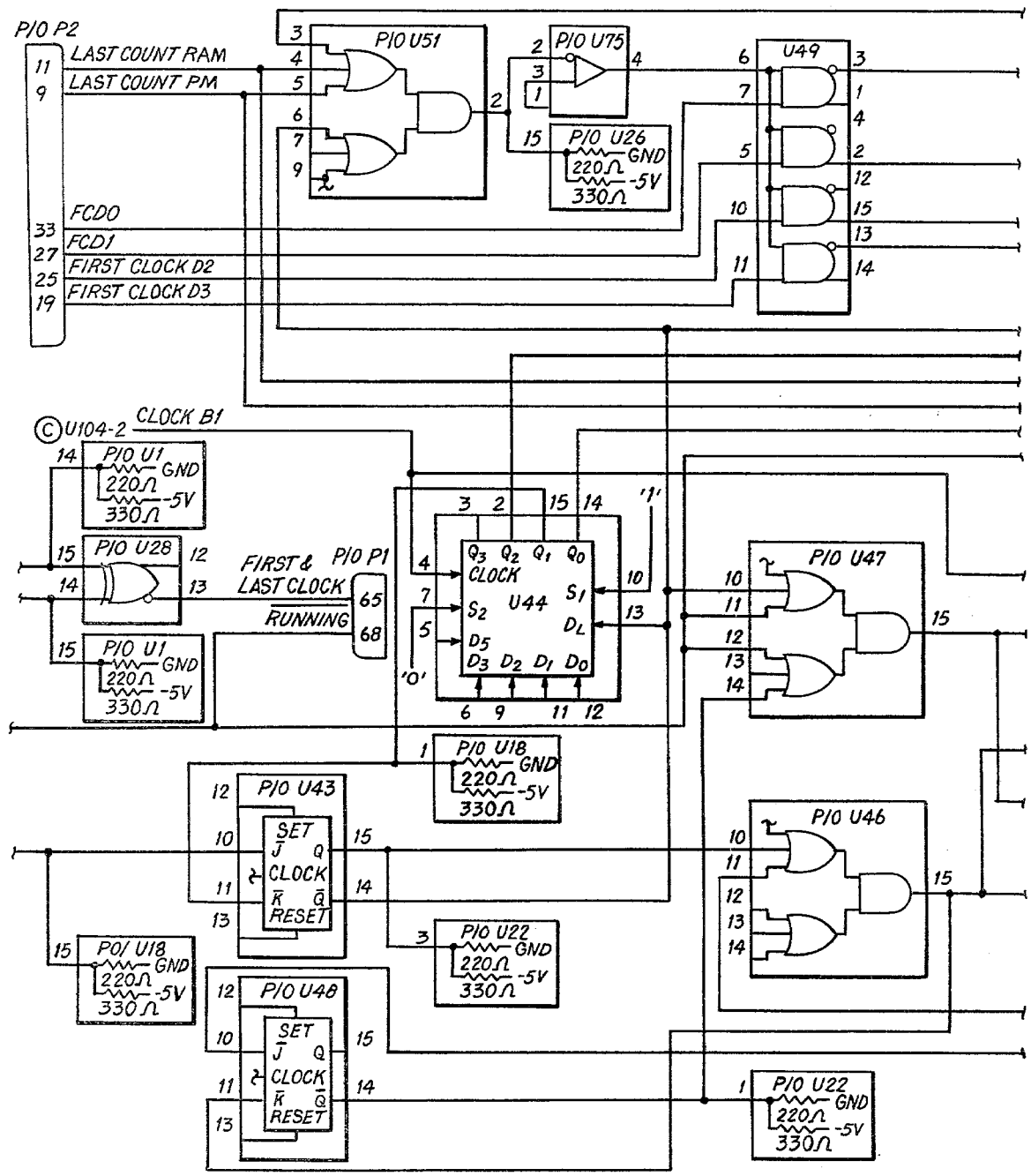
Figure 5H:
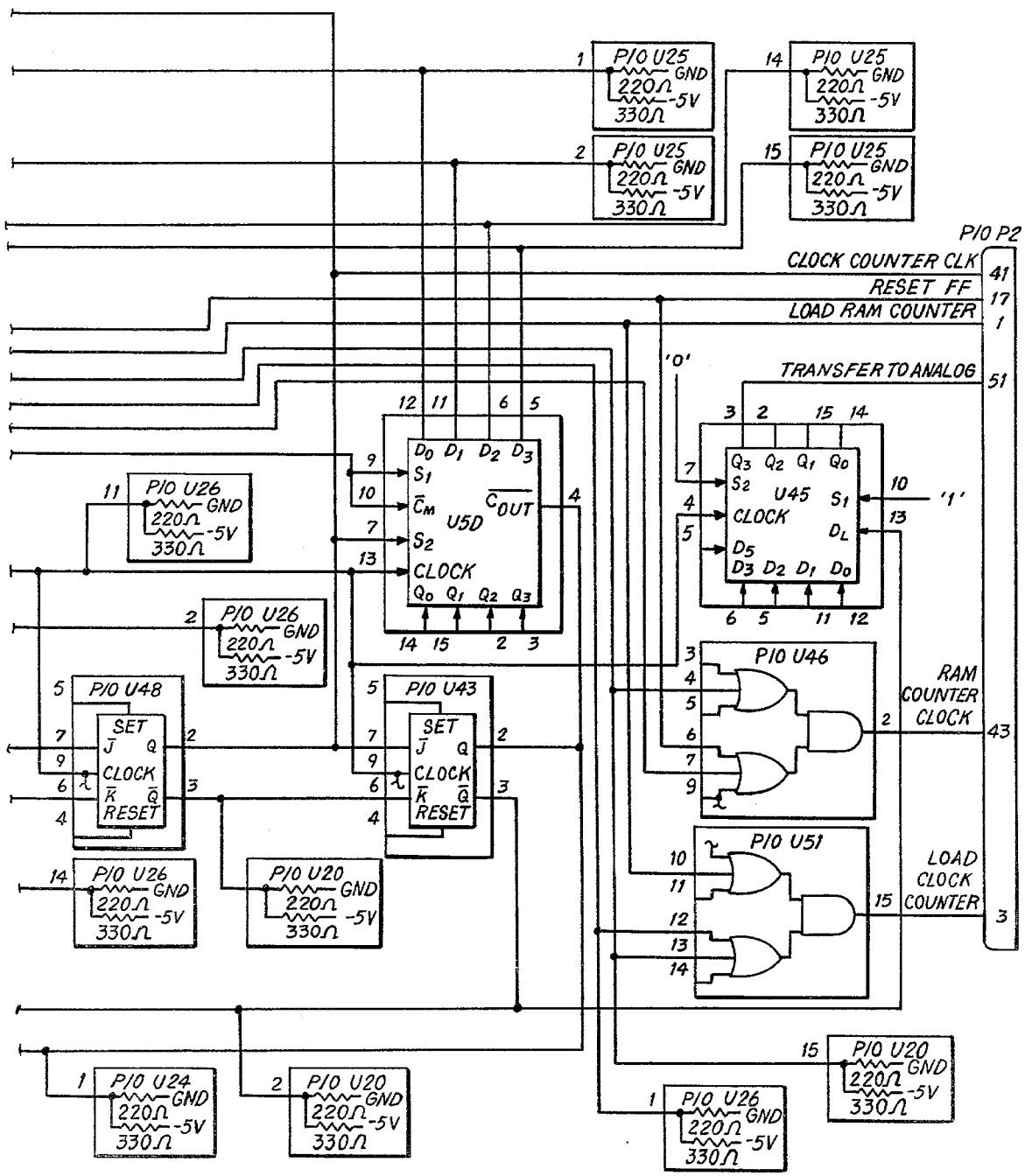
Figure 5I:
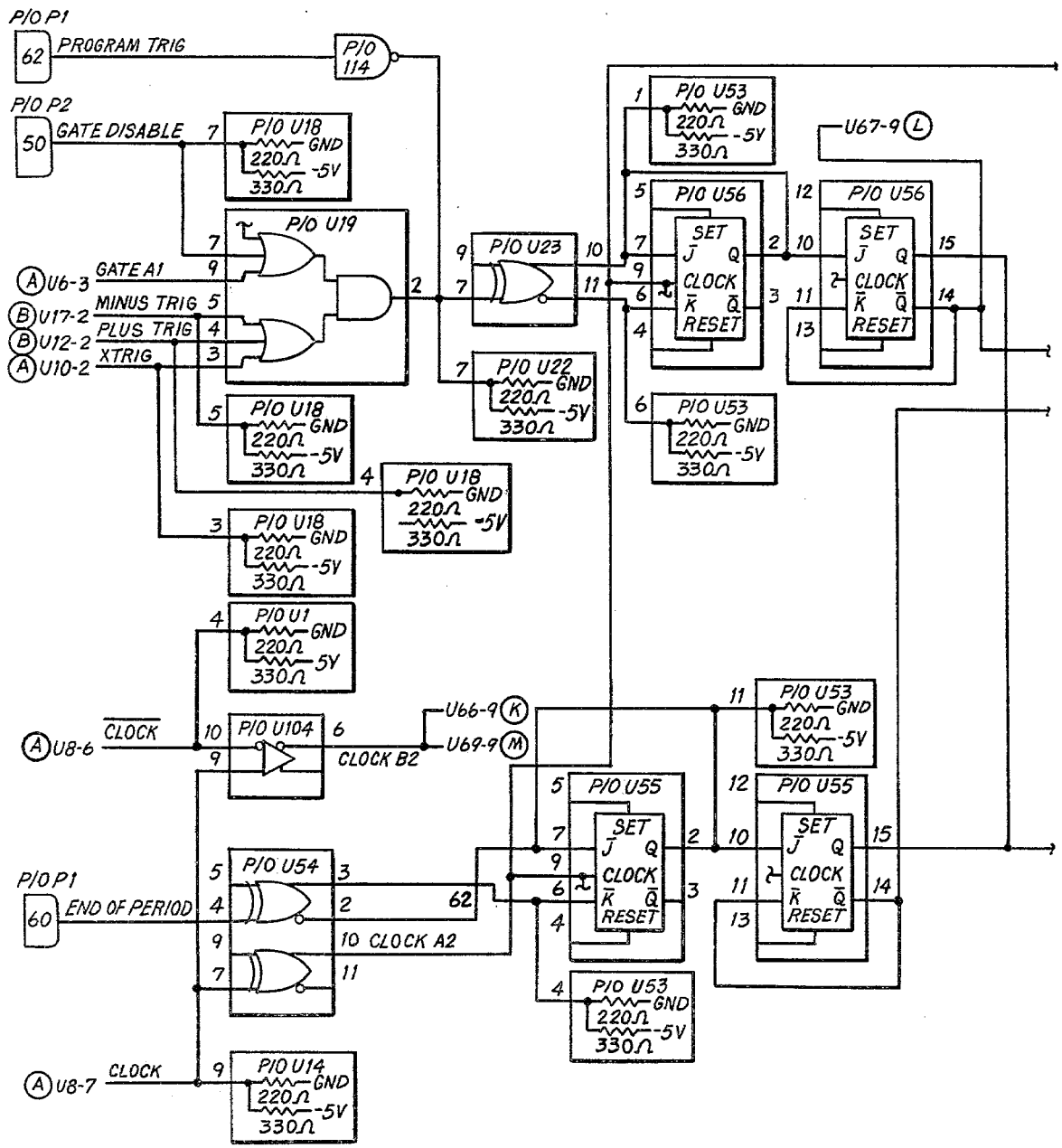
Figure 5J:
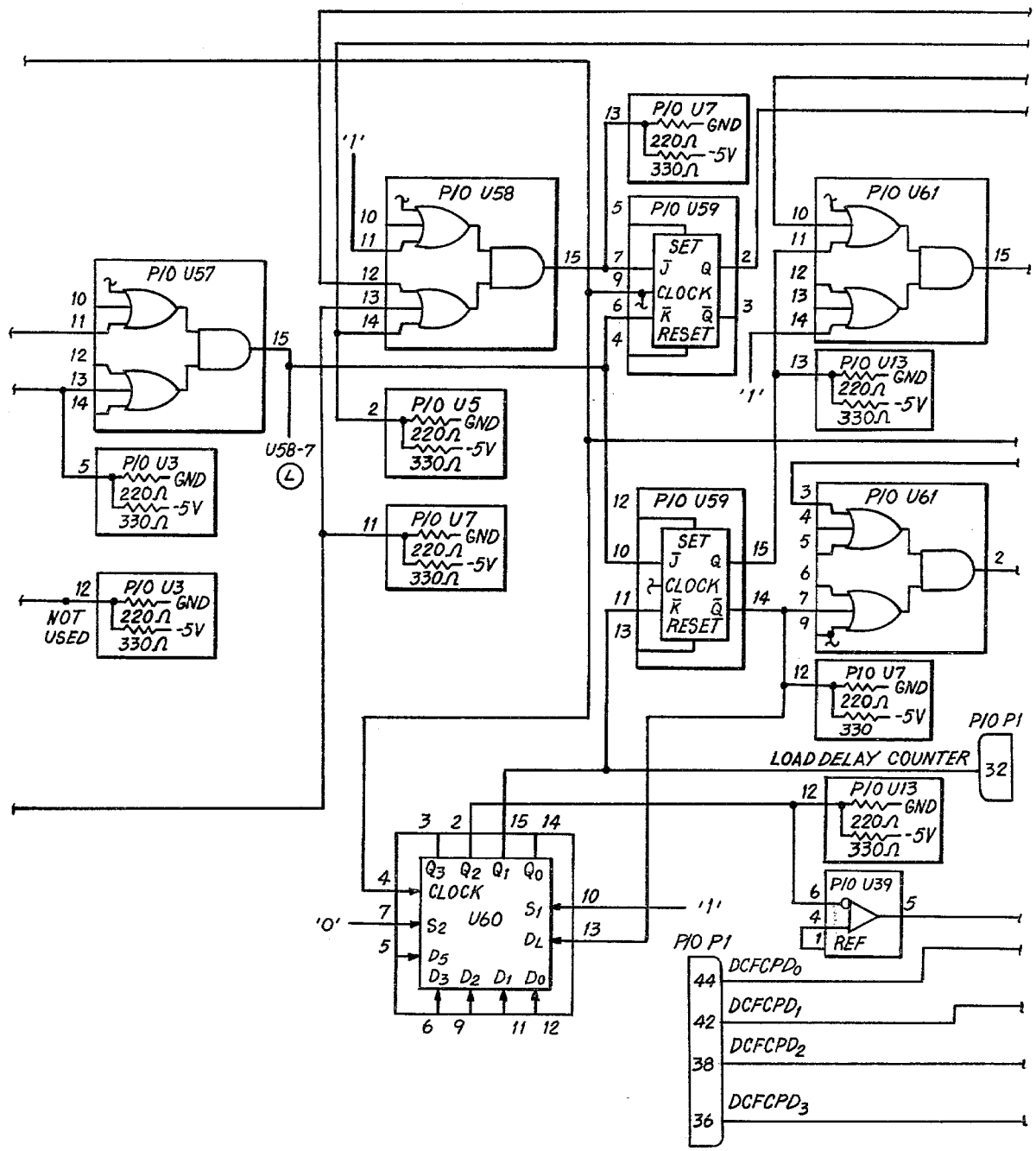
Figure 5K:
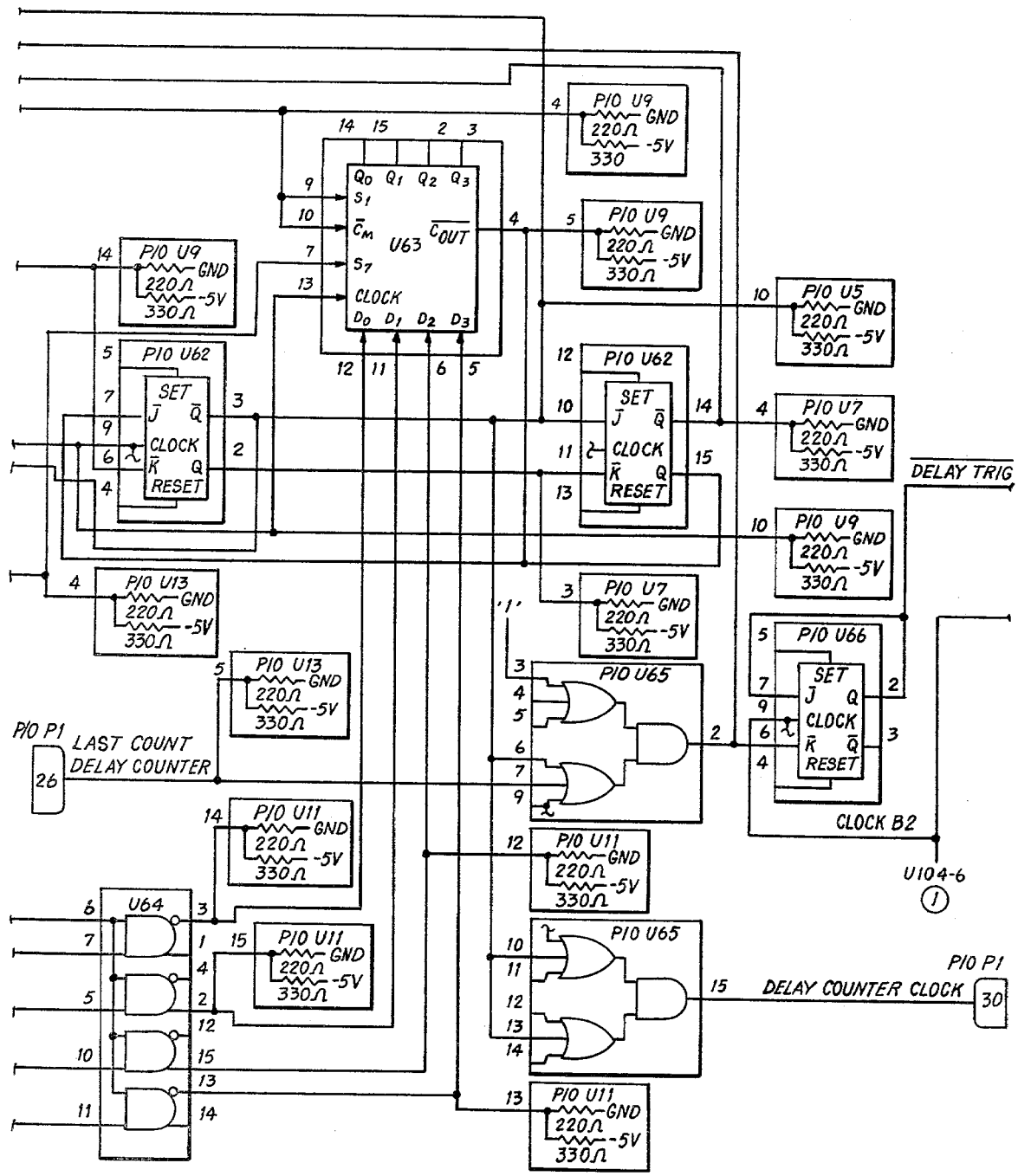
Figure 5L:
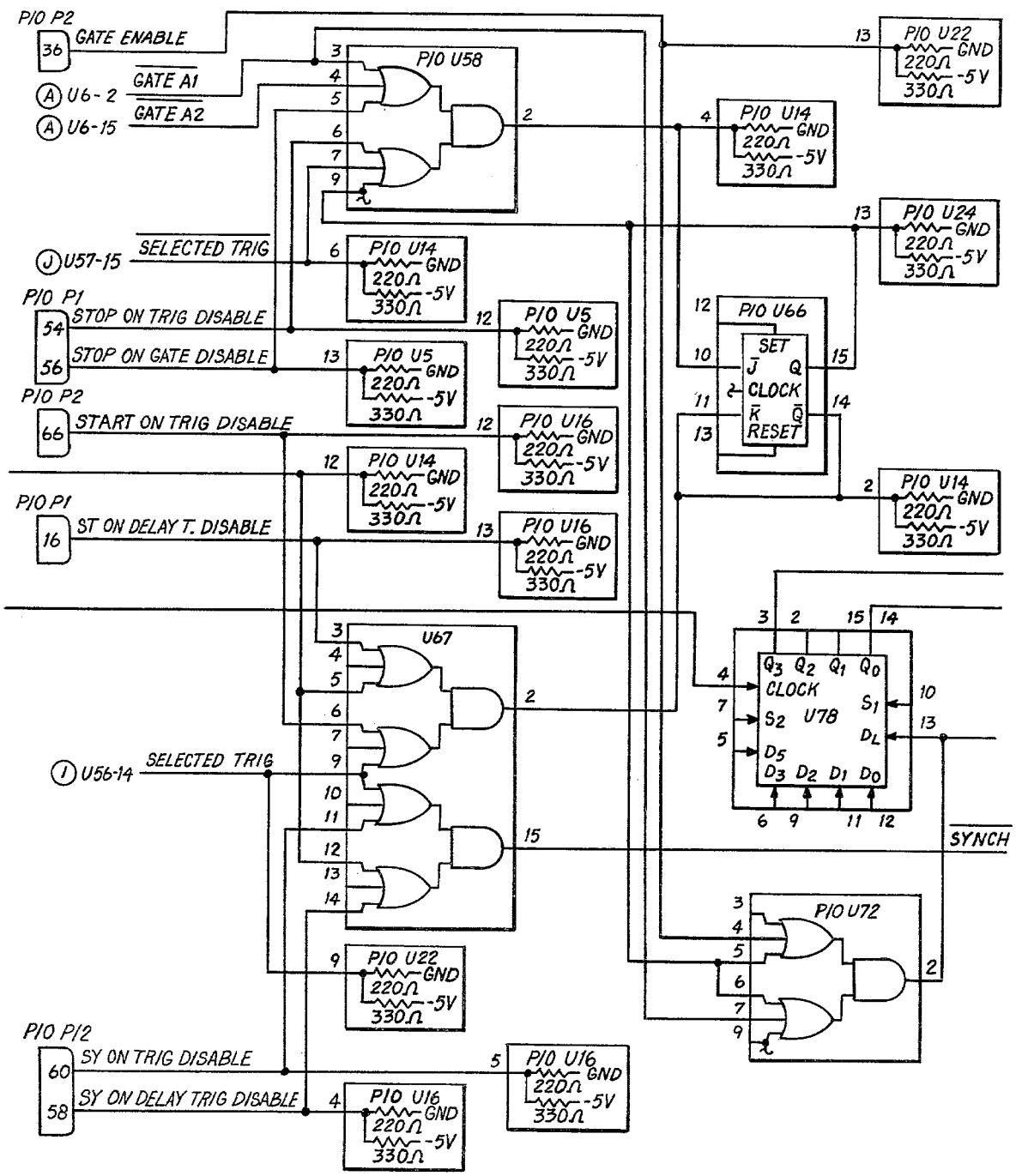
Figure 5M:
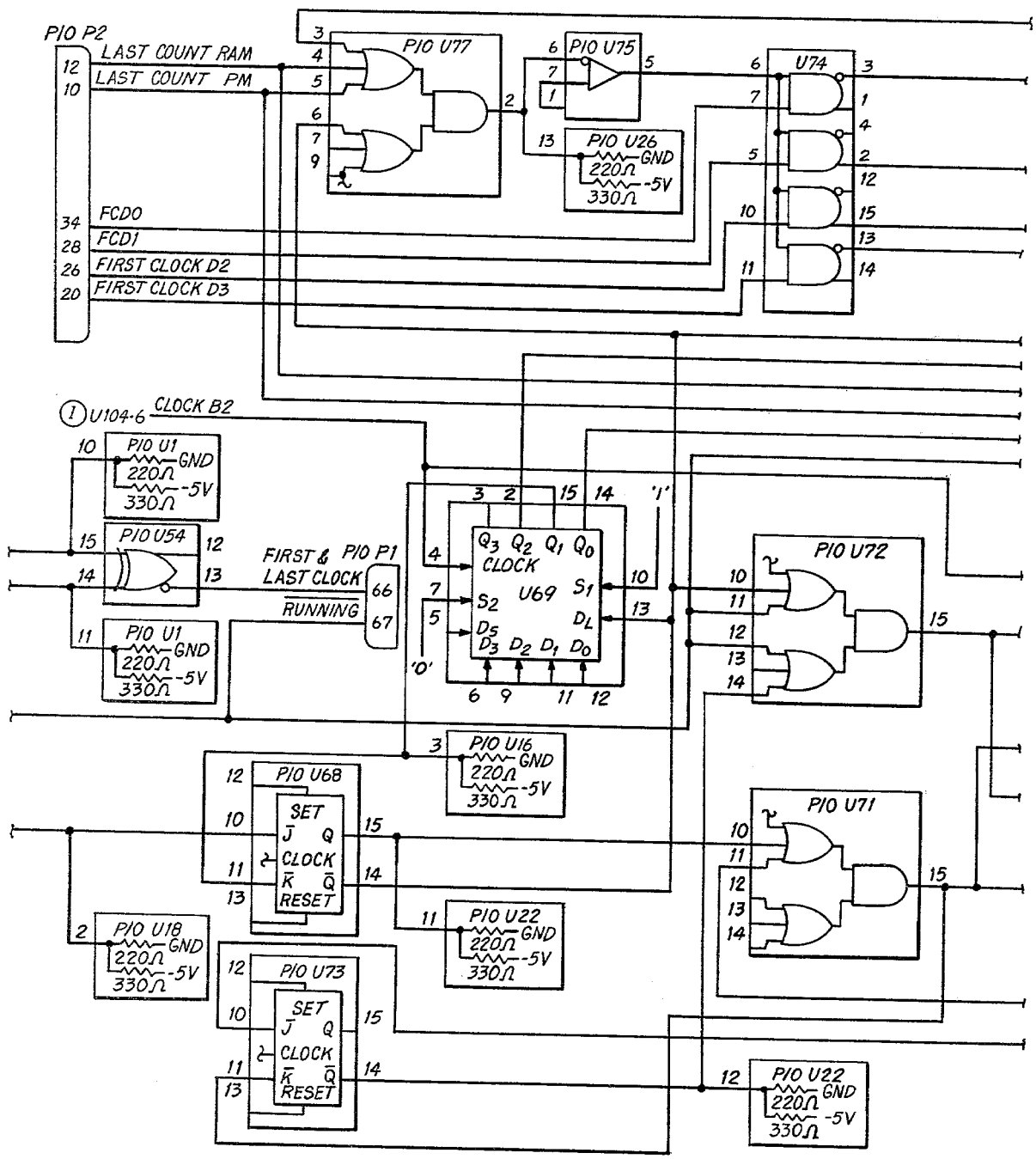
Figure 5N:
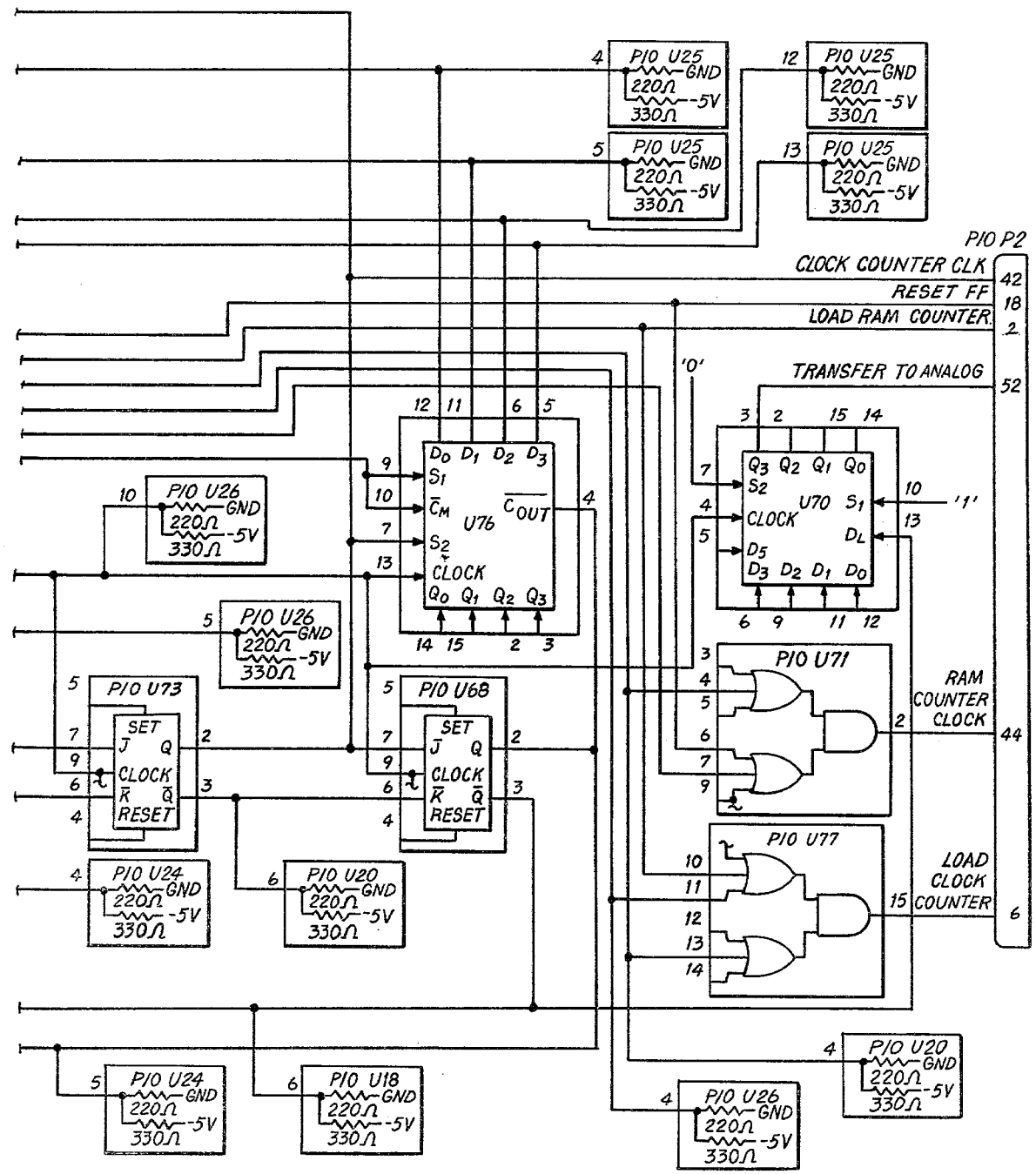
Figure 5O:
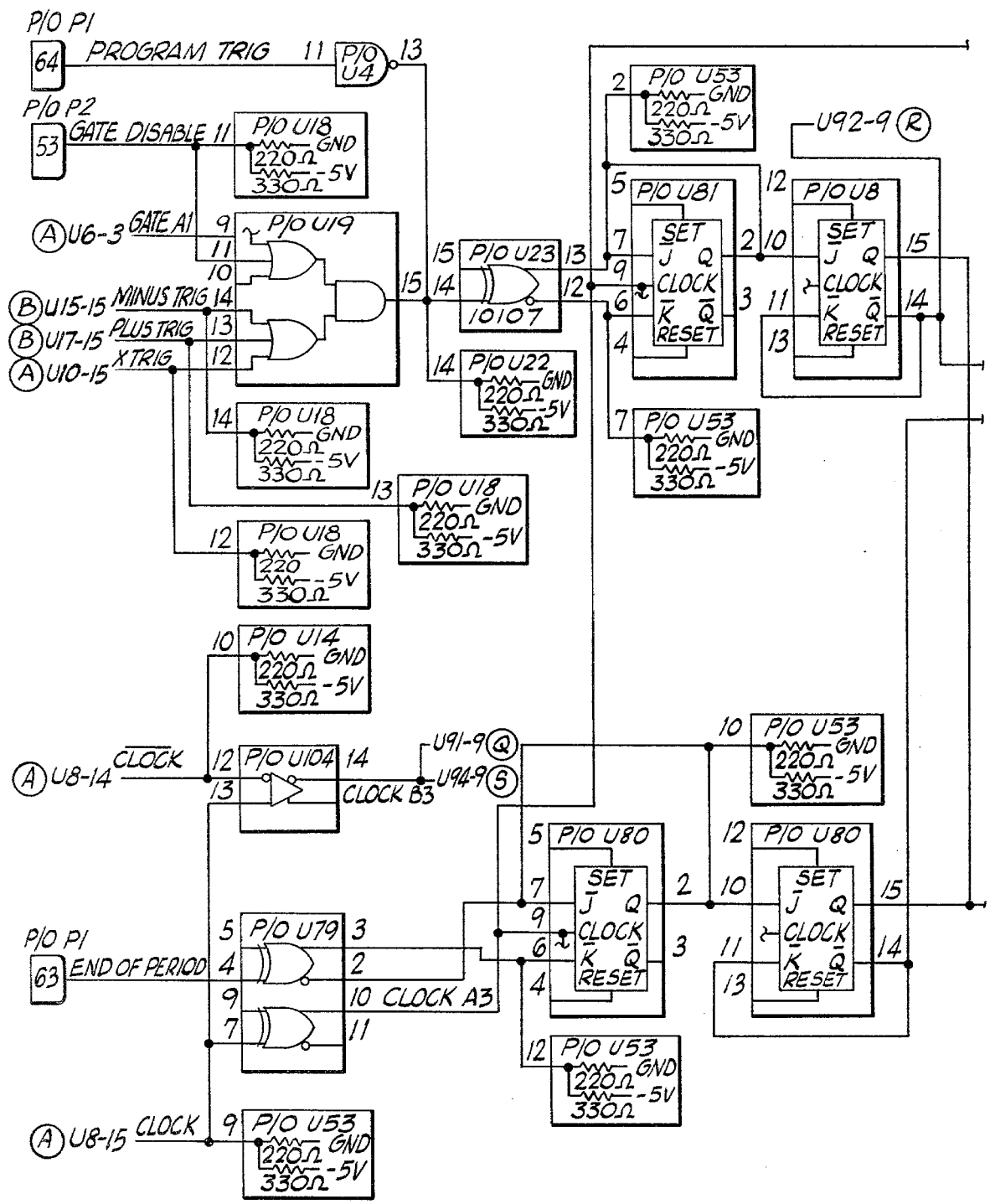
Figure 5P:
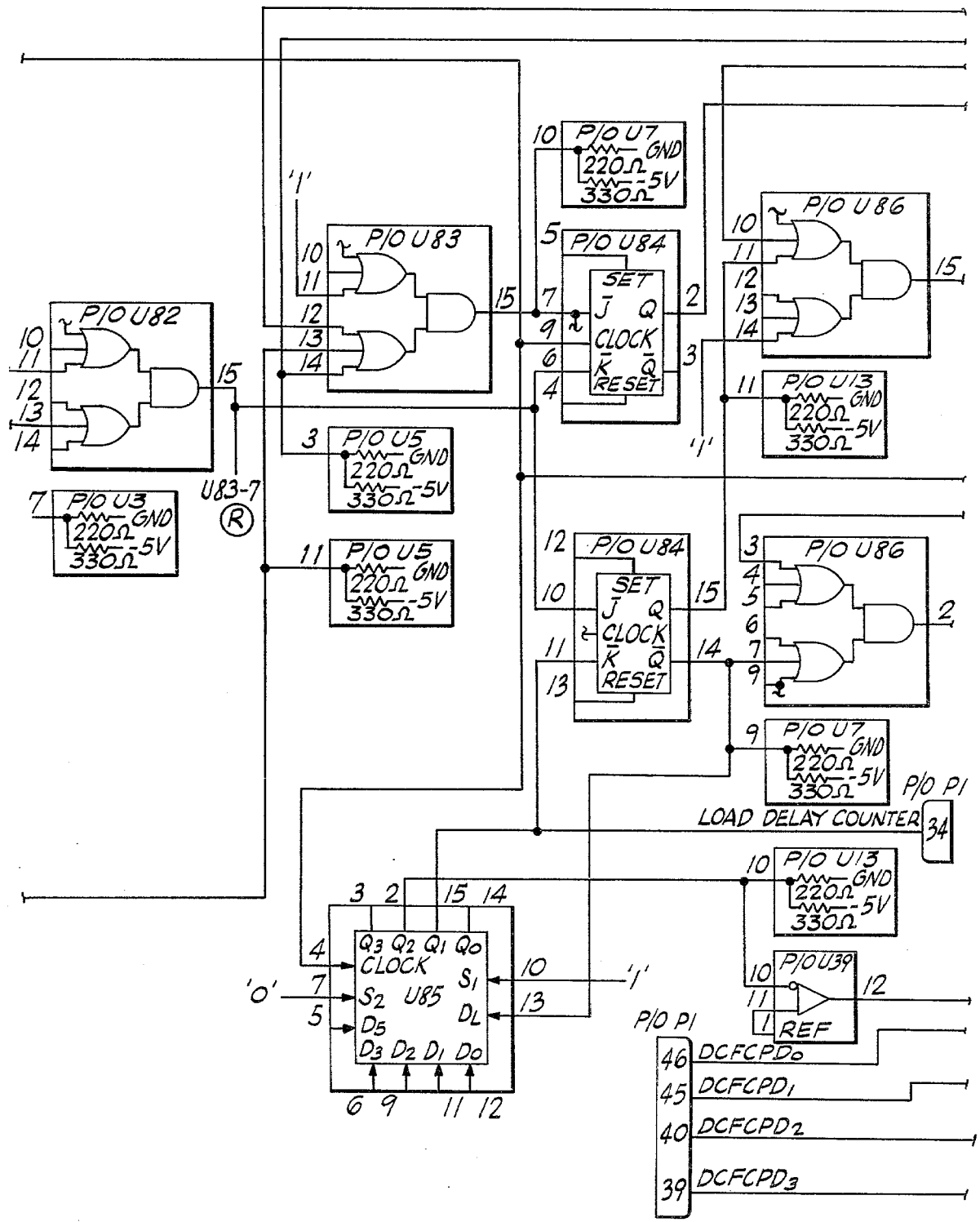
Figure 5Q:
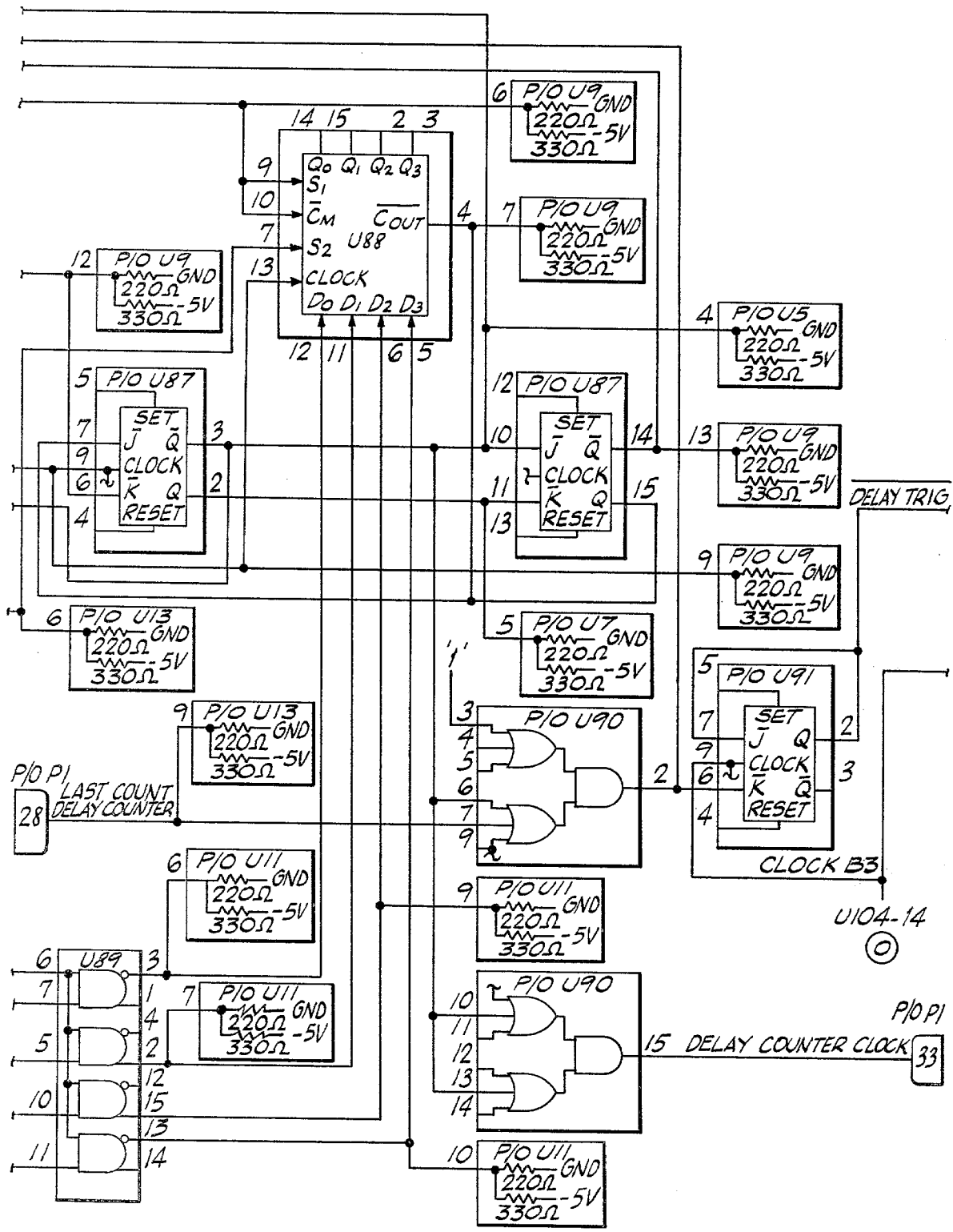
Figure 5R:
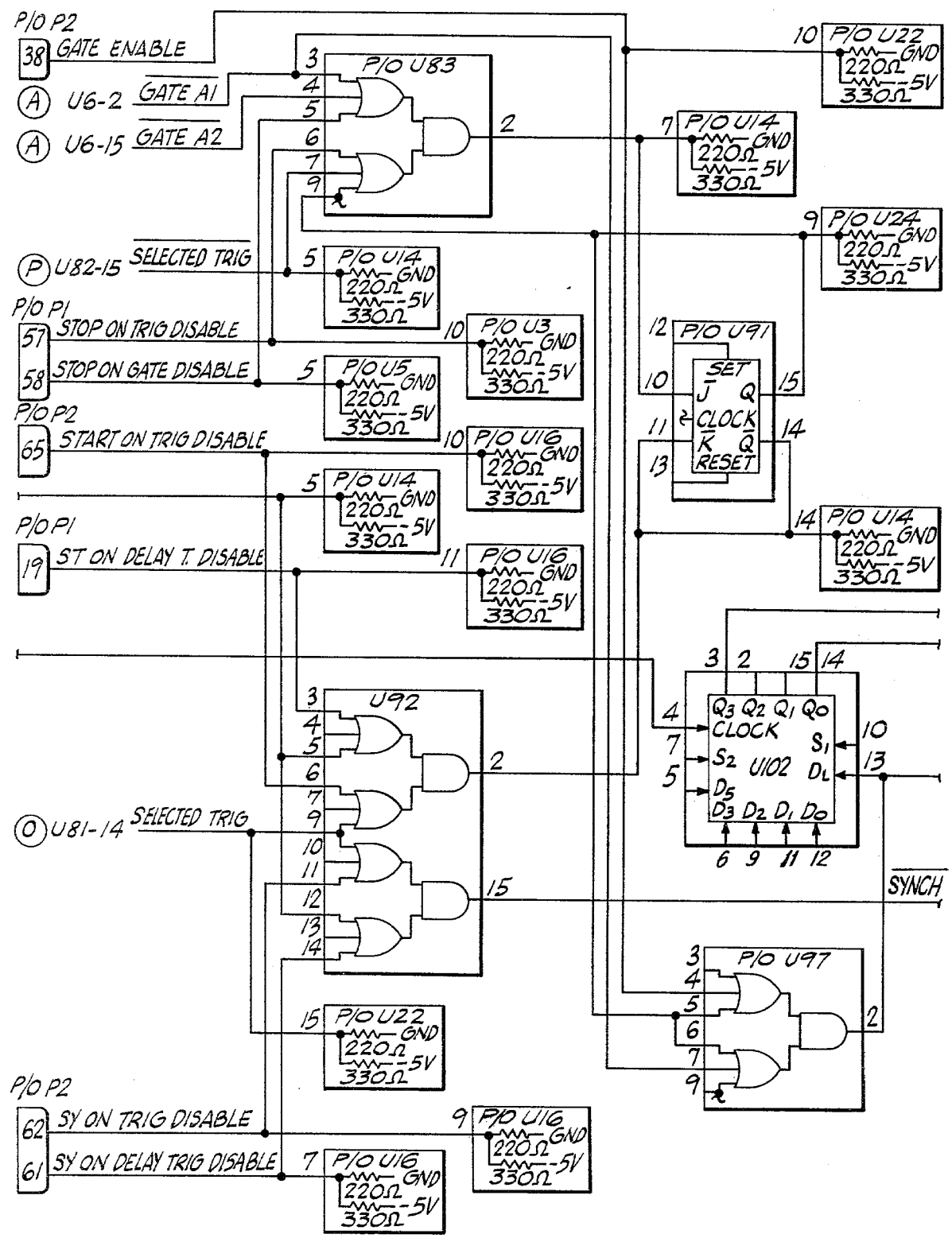
Figure 5S:
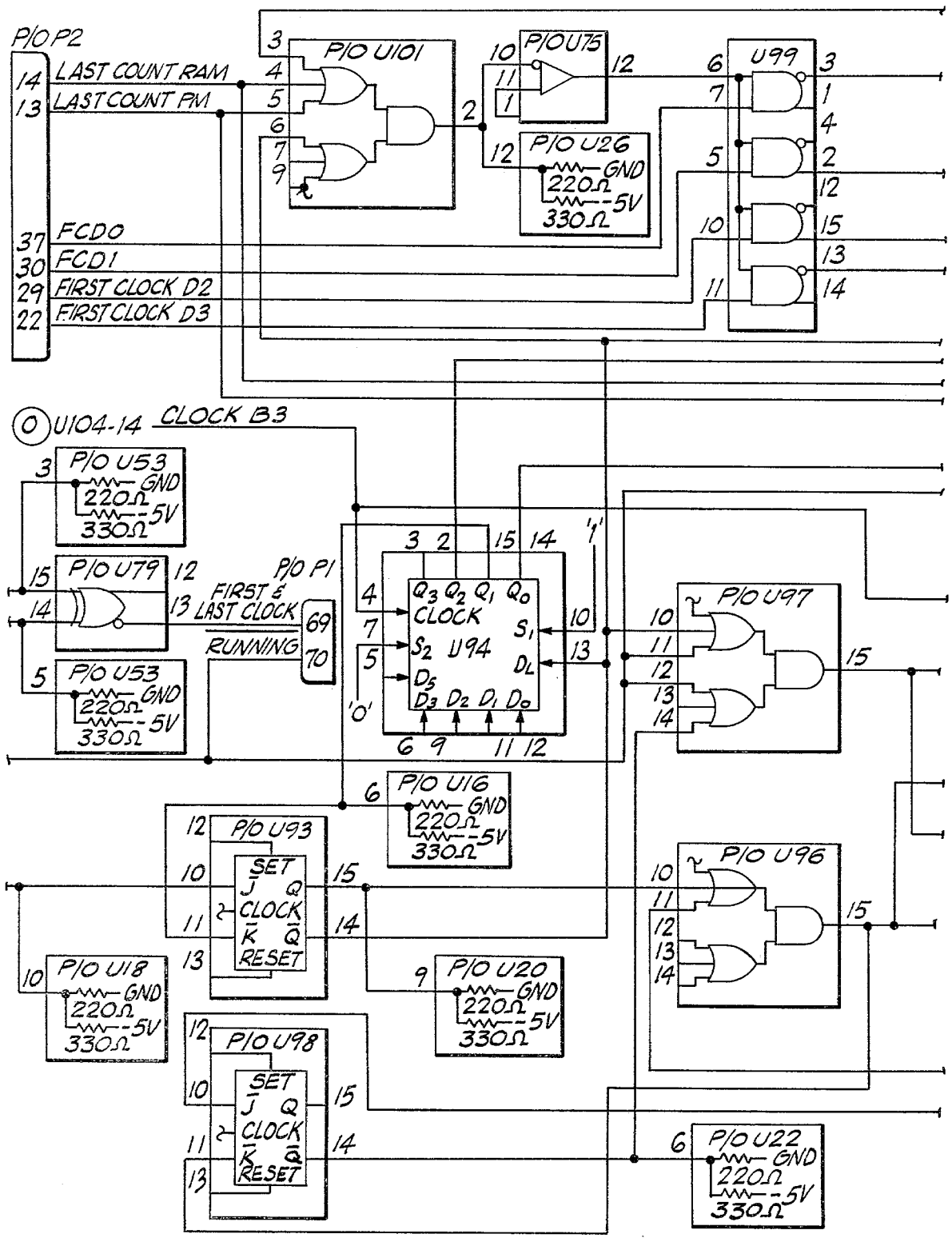
Figure 5T:
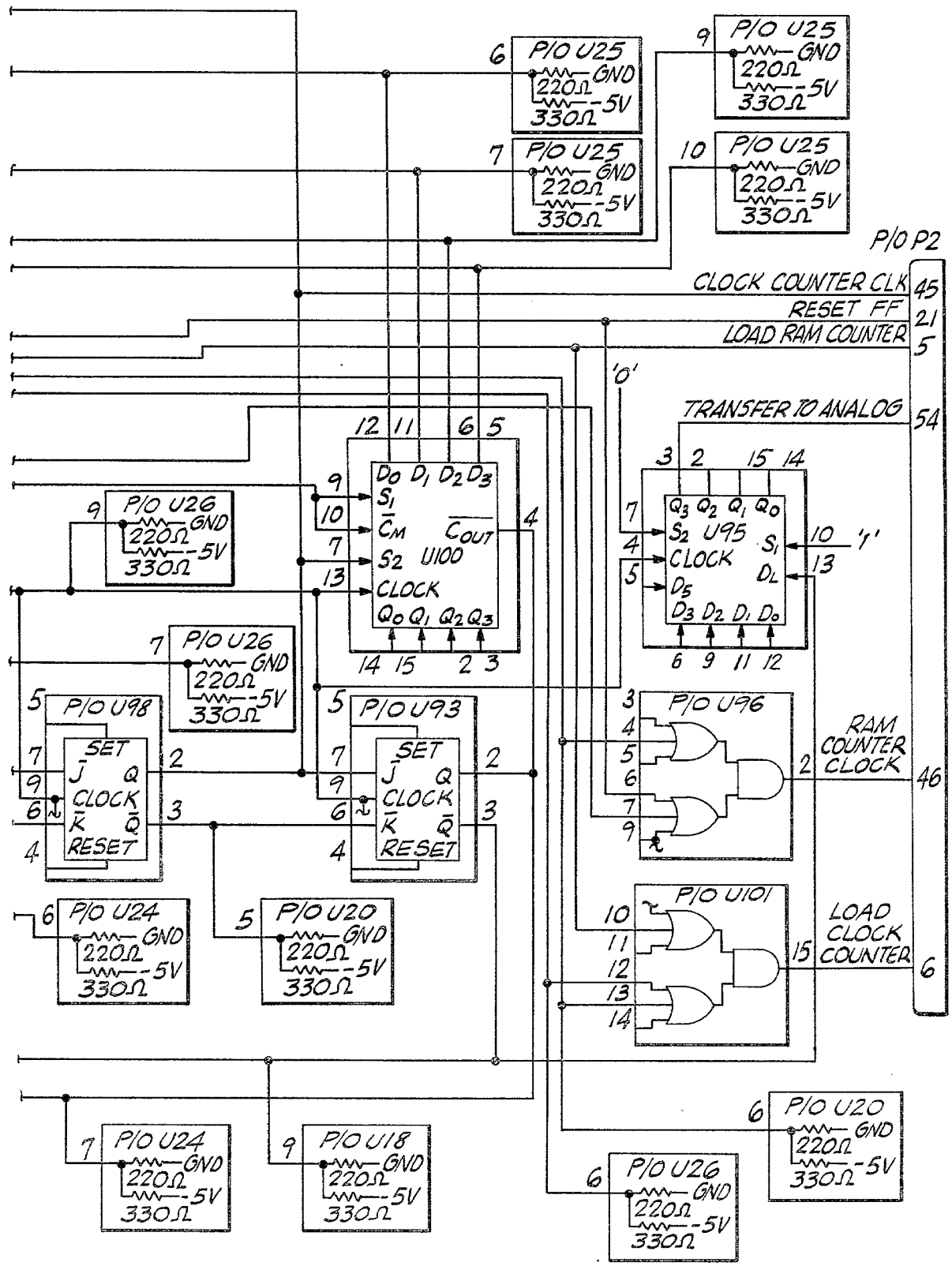
Figure 5U:
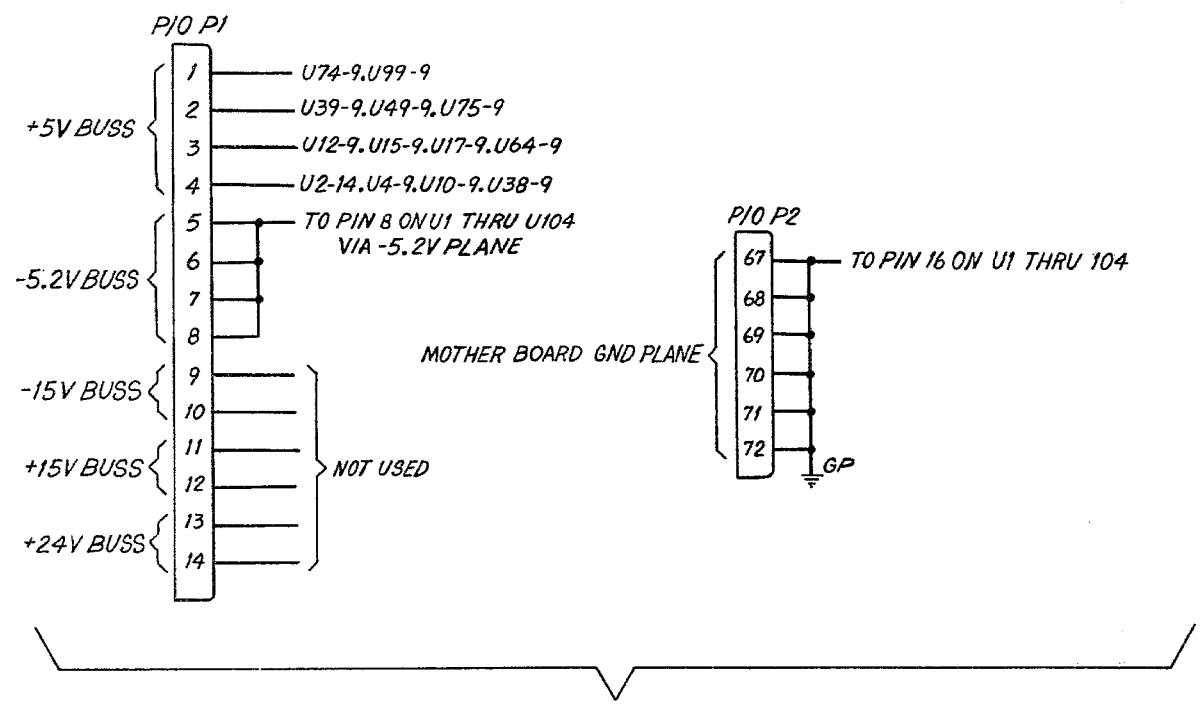

Referring now to FIG. 5a-u, a schematic diagram of the ECL digital logic network is illustrated. As shown therein, a 100 MHz clock signal from an external crystal-controlled oscillator, (not shown), an external trigger, an external gate, and internal sync signals from each channel are routed through common logic. The external trigger and external gate have a 50 ohms termination resistor and excessive-voltage protection circuitry, which limits excursions on these signals to between 0 and +5 Vdc.

The external gate signal is translated to ECL logic levels by TTL/ECL translator U4, internally synchronized by JK flip-flop U6A, and delayed 10 nsec by JK flip-flop U6B. The external trigger signal is translated to ECL logic levels by TTL/ECL translator U10, and can be enabled, or selected, by any or all channels. The 100 MHz clock signal is separated by line receiver U8 for each channel.

The internal synch signal for each of the three channels is independently translated, as follows: the channel 1 synch signal is translated to ECL logic levels by TTL/ECL translator U17, and can be enabled, or selected, by channel 2 and/or channel 3; the channel 2 synch signal is translated to ECL logic levels by the TTL/ECL translator U15, and can be enabled, or selected, by channel 1 and/or channel 3; and the channel 3 synch signal is translated to ECL logic levels by TTL/ECL translator U12, and can be enabled, or selected, by channel 1 and/or channel 2.

Since the remaining ECL network circuitry is identical for each of the three channels, the following discussion will be limited to channel 1.

The 100 MHz clock signal is distributed by either-or/either-nor gate U28, and line driver U104. OR-/AND gate U21 allows the gating of a selected trigger. The Gating function is disabled when a logic one is present at ECL network connector P2, contact 49. Either-OR/either-NOR gate U23, and JK flip-flop U30A, synchronize the selected trigger, and JK flip-flop U30B delays it by 10 nsec. An end-of-period signal generated by the TTL network is synchronized by JK flip-flop U29A, and a 10 nsec pulse marking the leading edge of the end-of-period signal is made by dual JK flip-flop U29B. OR/AND gate U31B combines the NOR output of Either-OR/either-NOR gate U23, the delayed synchronized trigger output of JK flip-flop U30B, and the output of JK flip-flop U29B, to generate a 10 nsec wide negative START Delay Counter signal. OR/AND gate U31A combines similar signals to generate a 10 nsec wide positive INHIBIT STOP of Delay Counter signal.

The START Delay Counter signal resets JK flip-flop U33A, and places hex counter U37 in the load/count mode. The START Delay Counter signal also initiates a LOAD DELAY COUNTER signal from JK flip-flop U33B and shift register U34, to the TTL card hex counters; the clock required to load the TTL card hex counters via OR/AND gates U35 and U40, and JK flip-flop U36; and loading FIRST CLOCK PERIOD data into hex counter U37, via TTL/ECL translator U39, and ECL/TTL translator U38.

Hex counter U37 counts from the value loaded until its HEX value is "F", which causes a CARRY OUT signal to be generated. This initiates a hex counter U37 load cycle, via OR/AND gates U35 and U36 and generates a DELAY COUNTER CLOCK signal for the TTL network.

The FIRST CLOCK PERIOD data obtained from the TTL network allows the first hex counter (U37) count period to be varied from 50 nsec to 140 nsec. When FIRST CLOCK PERIOD is not being loaded, 100 nsec count period data is made available to hex counter U37, by TTL/ECL translator U38. The LAST COUNT signal generated by the TTL card is combined with the Q output of JK flip-flop U36A to initiate a negative 10 nsec DELAY TRIGGER from JK flip-flop U41A; and to generate a STOP DELAY COUNTER signal via OR/AND gate U32B.

The Stop Delay Counter signal sets JK flip-flop U33A, which places hex counter U37 in a HALT mode. If a Start Delay Counter signal is generated prior to completion of the delay count, hex counter U37 is reinitialized and no Delay Trigger is generated. The INHIBIT STOP signal combined in OR/AND circuit U32B insures initialization of a new Delay cycle if the starting trigger period is equal to Delay Time.

OR/AND circuit U42A logically combines selected trigger signals and delay trigger signals. When not completely disabled, U42A generates a negative 10 nsec START signal that resets JK flip-flop U41B. The output of JK flip-flop U41B, and a gate enable signal from JK flip-flop U6B, are logically combined in OR/AND circuit U47A to generate $\overline{\text{RUNNING}}$. When $\overline{\text{RUNNING}}$ is at logic zero, hex counter U50 is placed in the LOAD/RUN mode. Changes in logic levels cause a 30 nsec wide FIRST and LAST clock pulse signal to be generated, via shift register U52 and either-OR/either-NOR circuit U28, for use by the TTL network.

The selected trigger enable signals (with gate signals from JK flip-flop U6) are logically combined in OR-/AND circuit U32A to generate a stop signal that will set JK flip-flop U41B. In addition, OR/AND circuit U47A places hex counter U50 in a Halt mode. OR-/AND circuit U42B logically combines selected trigger signals, delay trigger and enables, to generate a negative 10 nsec synch pulse. This synch pulse will initiate a timing cycle, via JK flip-flop U43 and shift register U44, that will generate RESET FF and LOAD RAM signals, via shift register U44; a LOAD CLOCK COUNTER signal, via shift register U44 and OR-/AND circuit U51; a clock signal for loading both TTL counters, via OR/AND circuit U46B, JK flip-flops U48A and U43A, and OR/AND circuits U47B and U46A; and FIRST CLOCK PERIOD data, via OR-/AND circuit U51A ECL/TTL translator U75, and TTL/ECL translator U49.

Hex counter U50 will be in a 100 nsec timing cylce, like that described above for hex counter U37, except for the first clock signal, which can be as short as 50 nsec. A clock pulse for the TTL network timing clock counter is generated during each timing cycle. A clock pulse is generated for the RAM counter whenever the TTL timing clock counter sends a LAST COUNT PM signal. When the programmable function generator is in the Function mode, the LAST COUNT RAM signal is kept at logic ZERO, which enables LAST COUNT PM to generate LOAD CLOCK COUNTER, via OR-/AND circuit U51B and FIRST CLOCK PERIOD data. If the programmable function generator channel is in the Pulse mode, the LAST COUNT RAM signal is at logic ONE until the TTL RAM Counter reaches its LAST COUNT.

The mode and/or source select and timing data logic signals are supplied by the TTL digital logic network for each channel. The TTL digital logic network (hereinafter referred to as the TTL network) contains the microprocessor bus interface, pulse high-low multiplexer, delay counter, timing counter, RAM address counter, synch timing comparator, function shape RAM, and pulse level flip-flop. The data is entered into the microprocessor bus interface and, at the appropriate time, is loaded into the TTL network counters, shape RAM, synch comparator circuitry, the ECL networks, trigger and stop source timing control generator, analog output network digital-to-analog converters, and mode select logic.

Figure 6A:
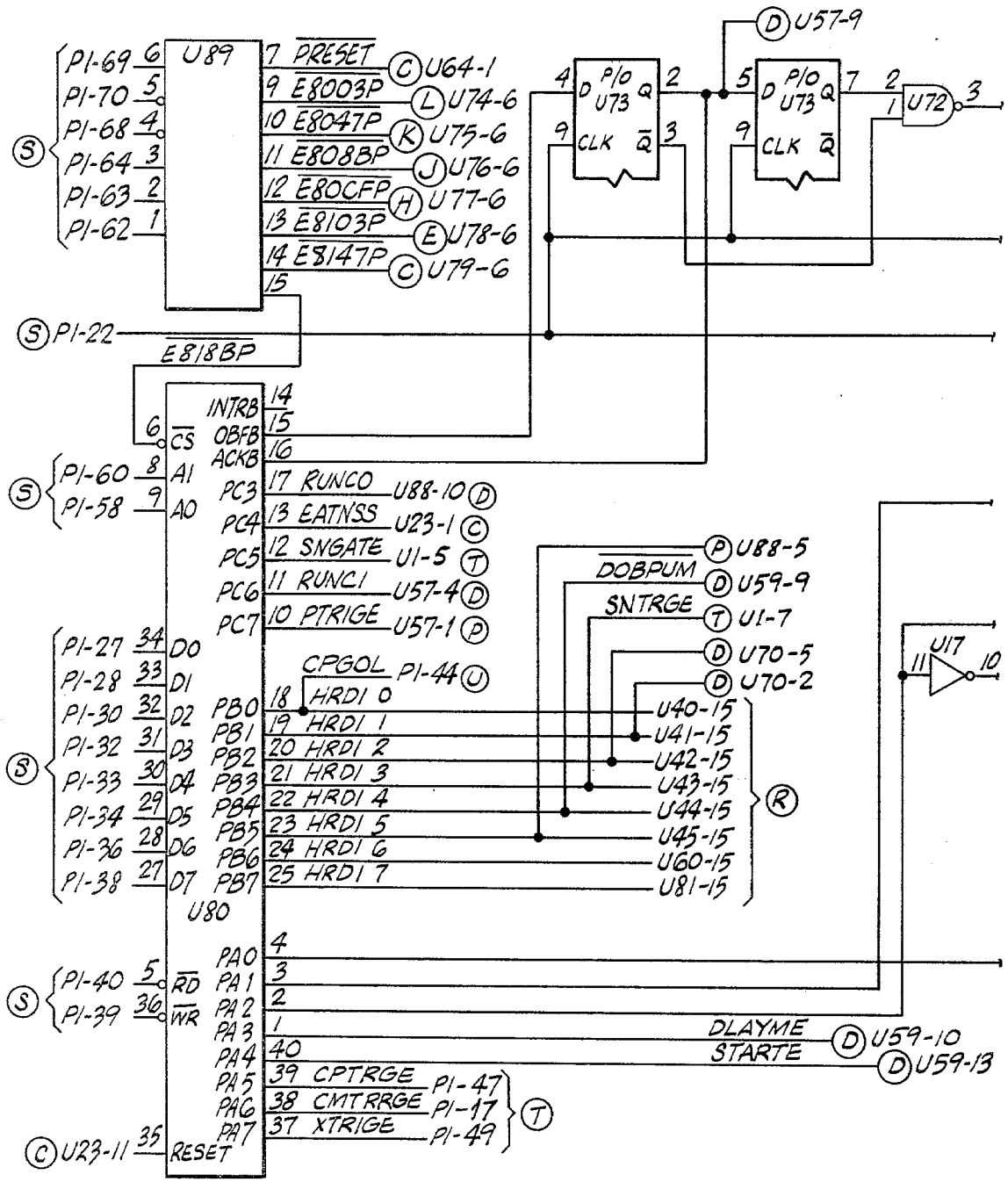
FIGS. 6a–s is a schematic diagram of the TTL digital logic network.
Figure 6B:
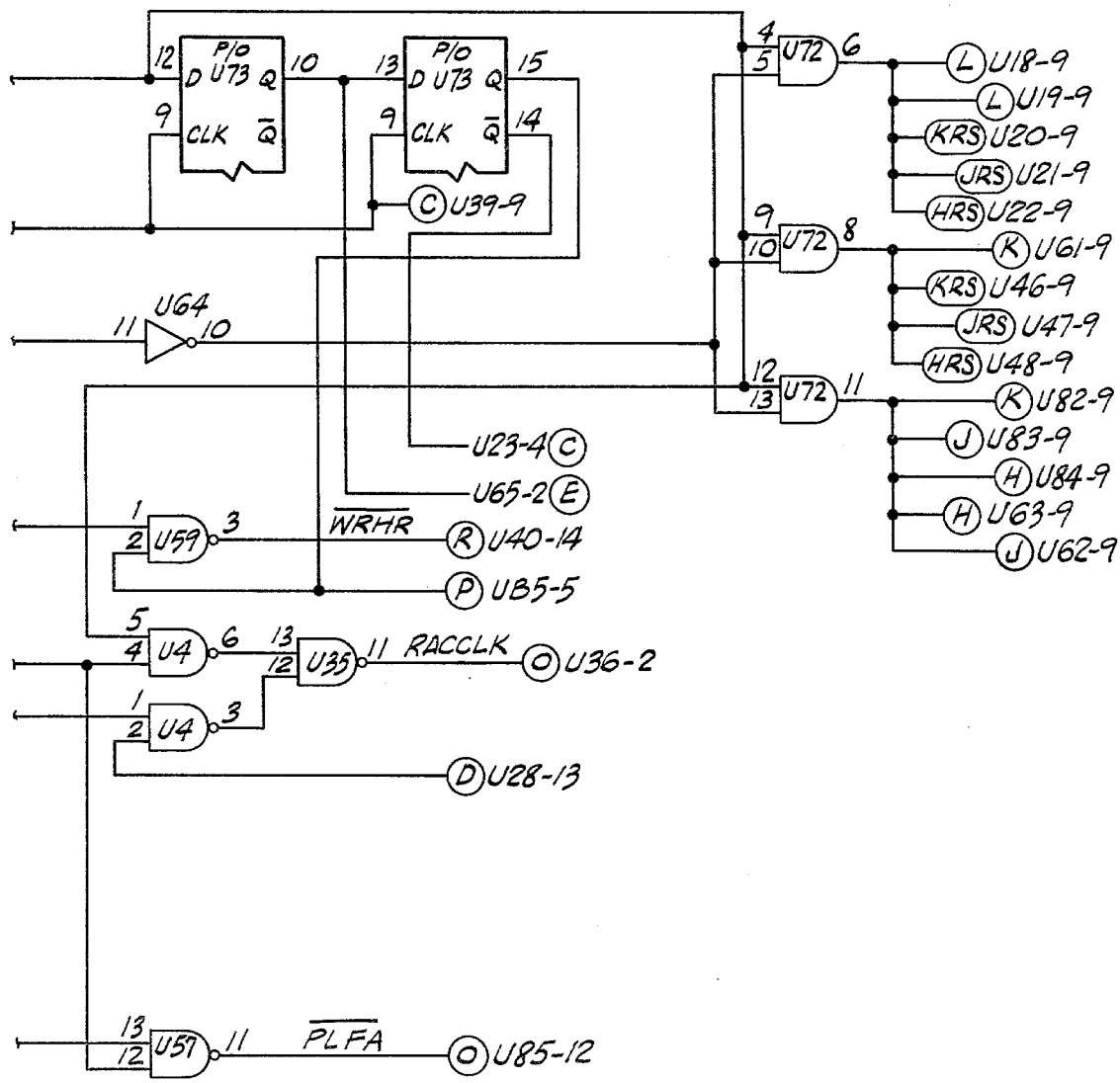
Figure 6C:
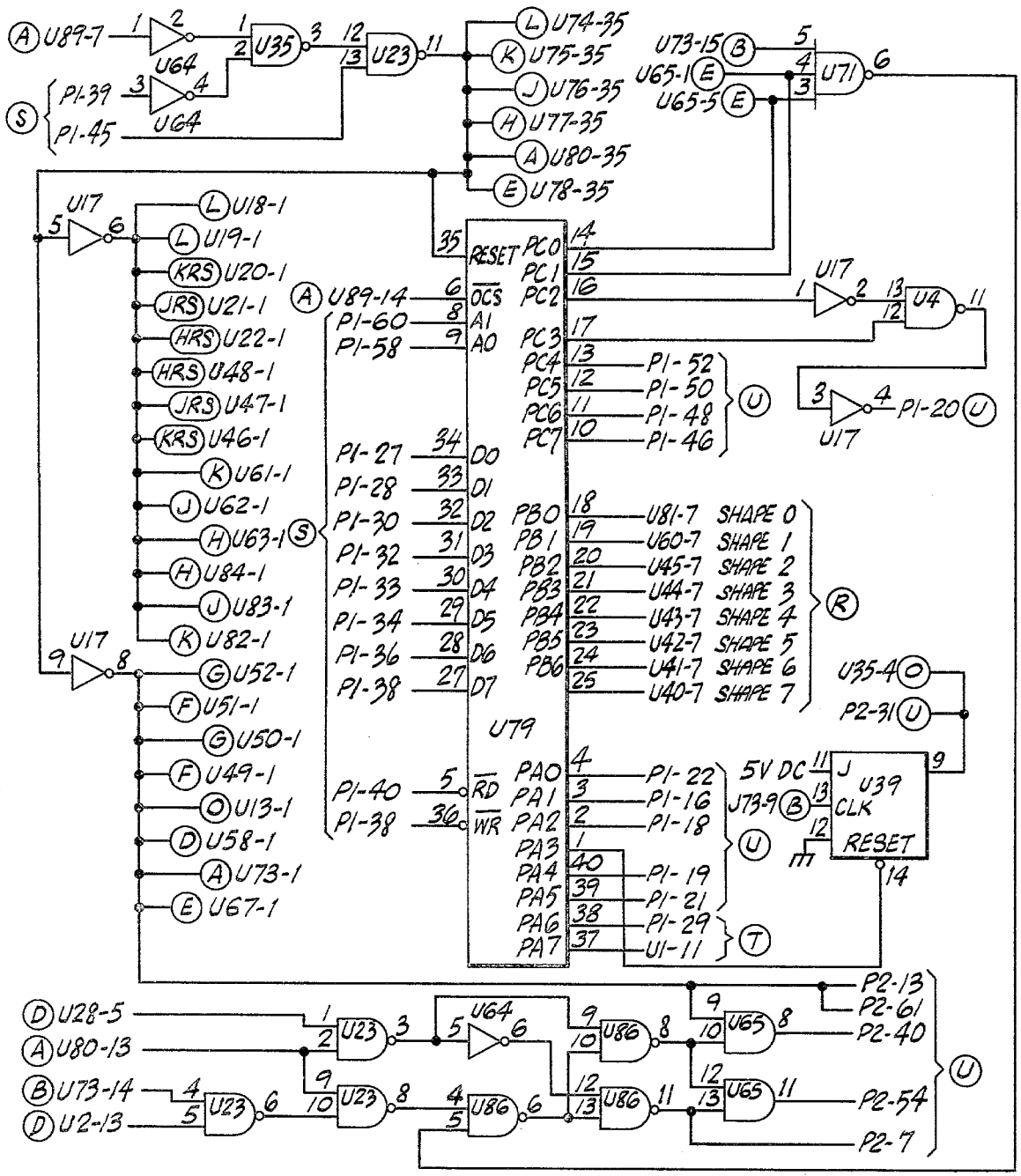
Figure 6D:
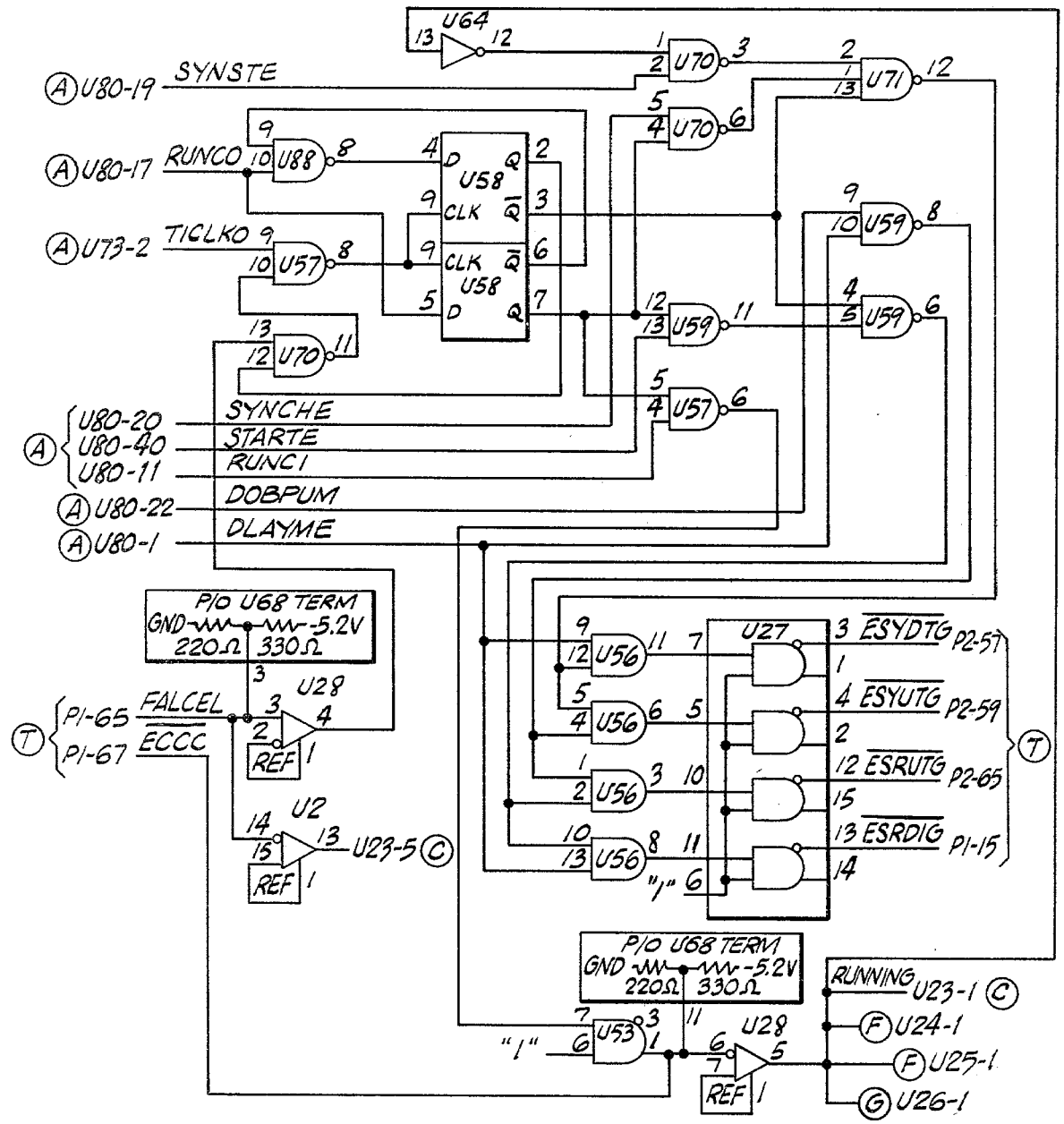
Figure 6E:
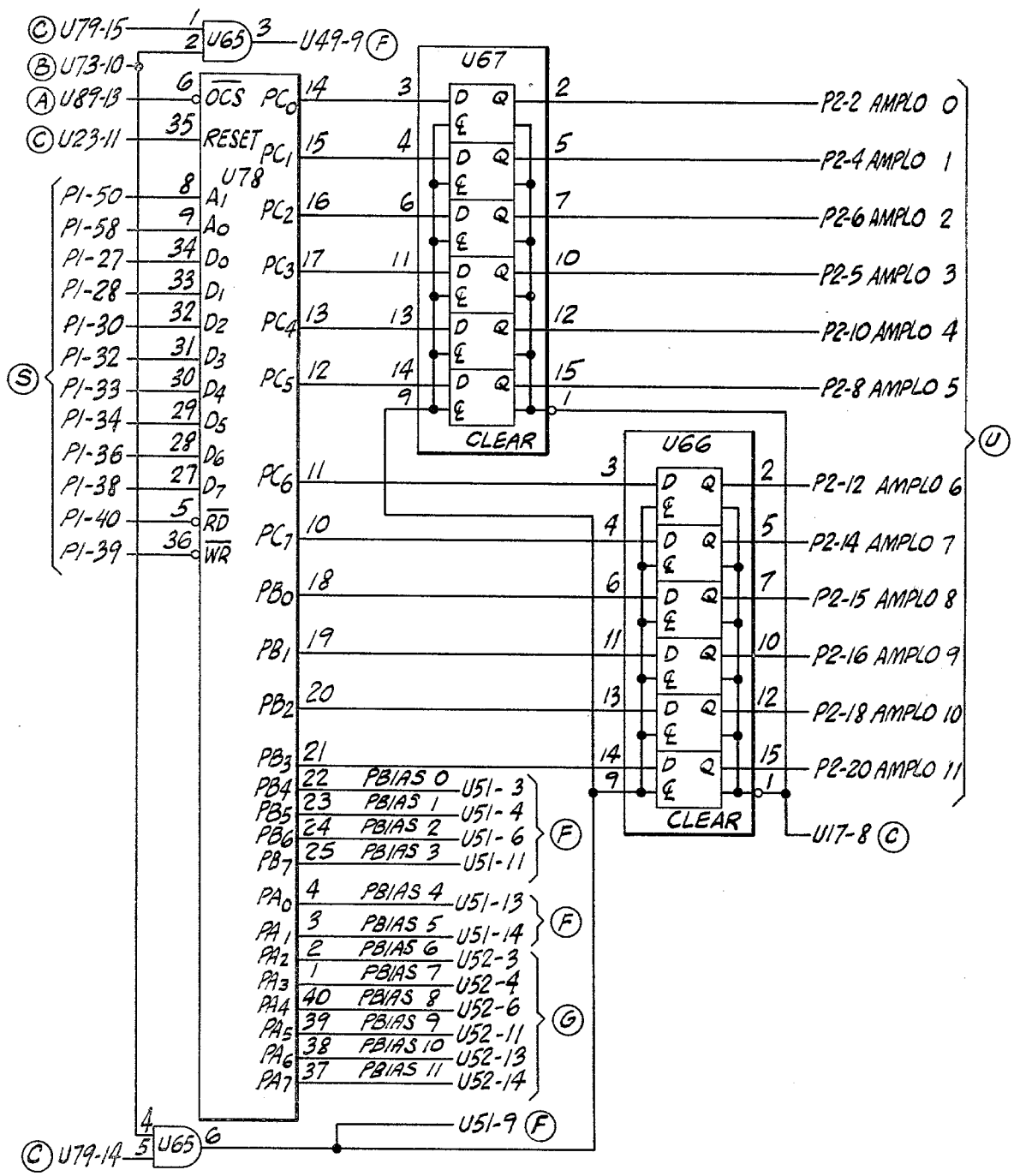
Figure 6F:
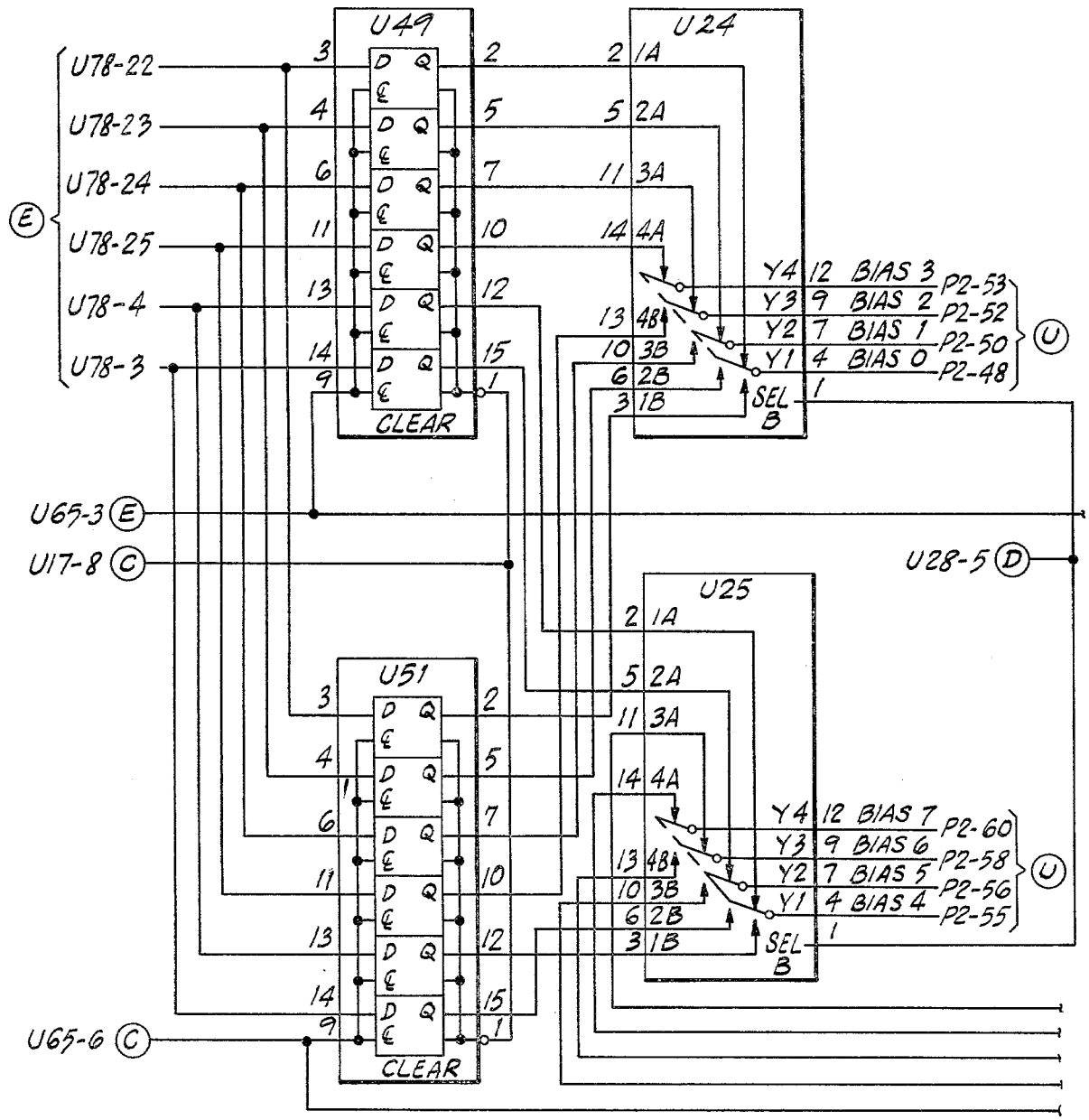
Figure 6G:
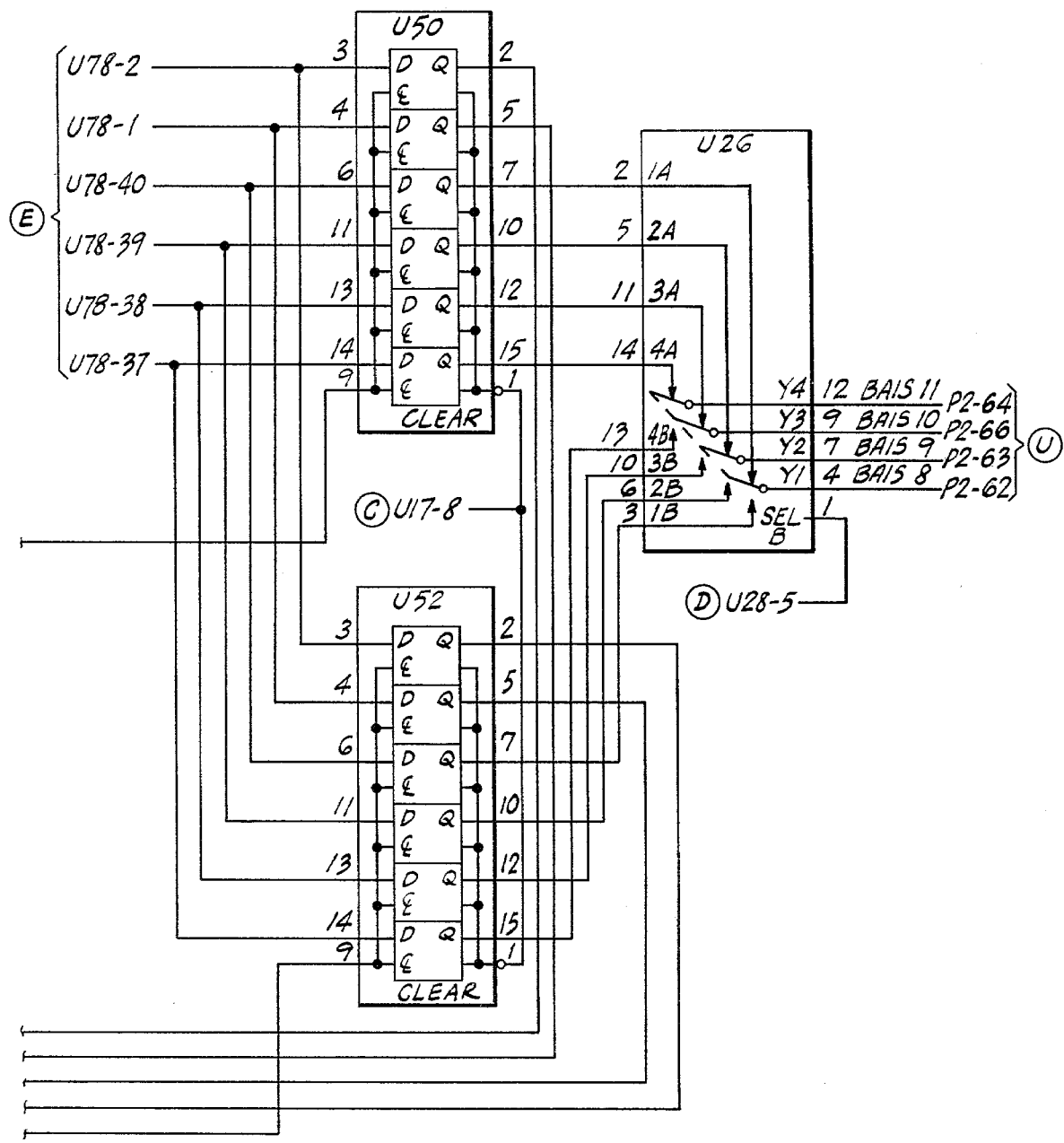
Figure 6H:
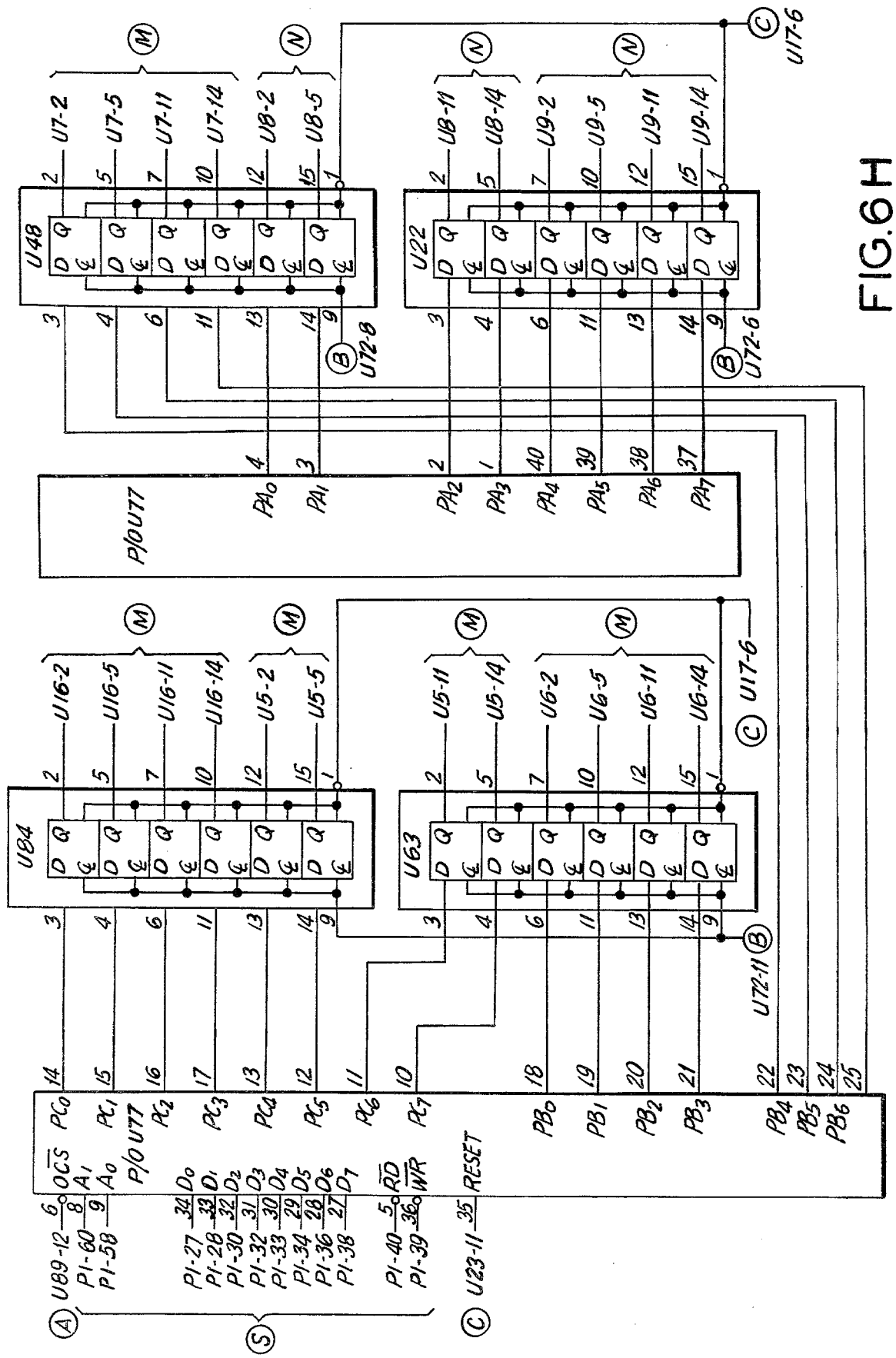
Figure 6I:
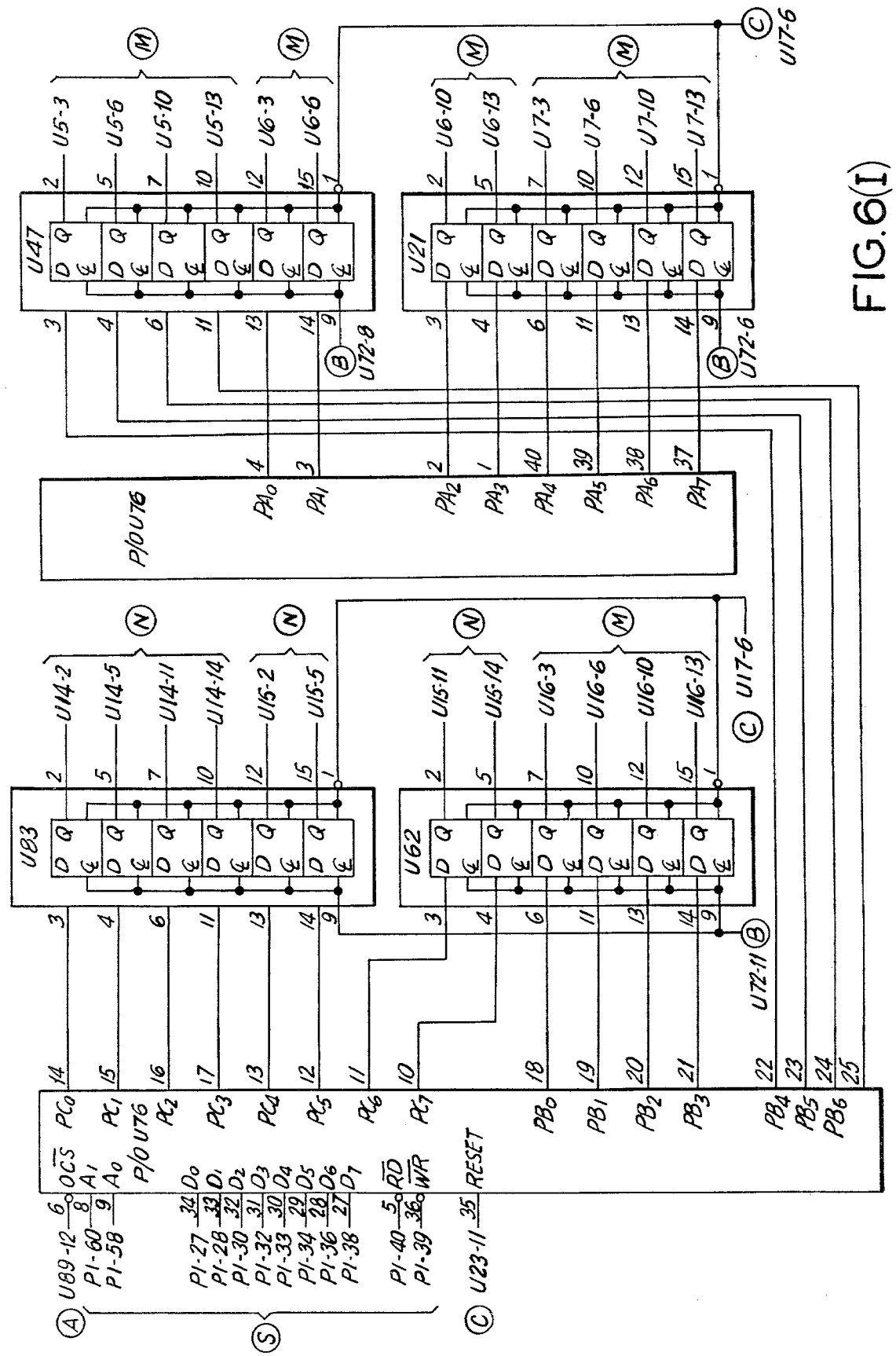
Figure 6J:
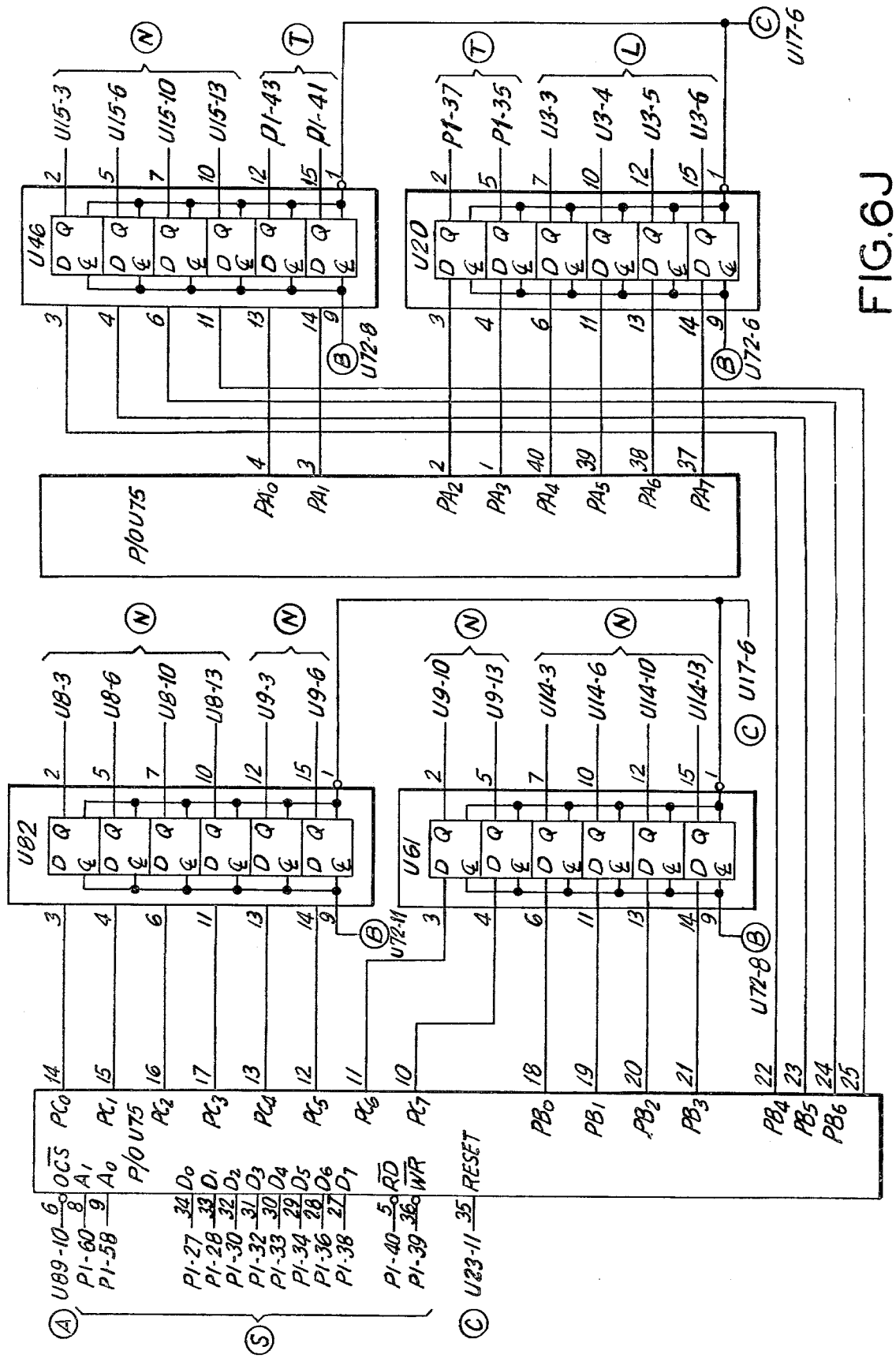
Figure 6K:
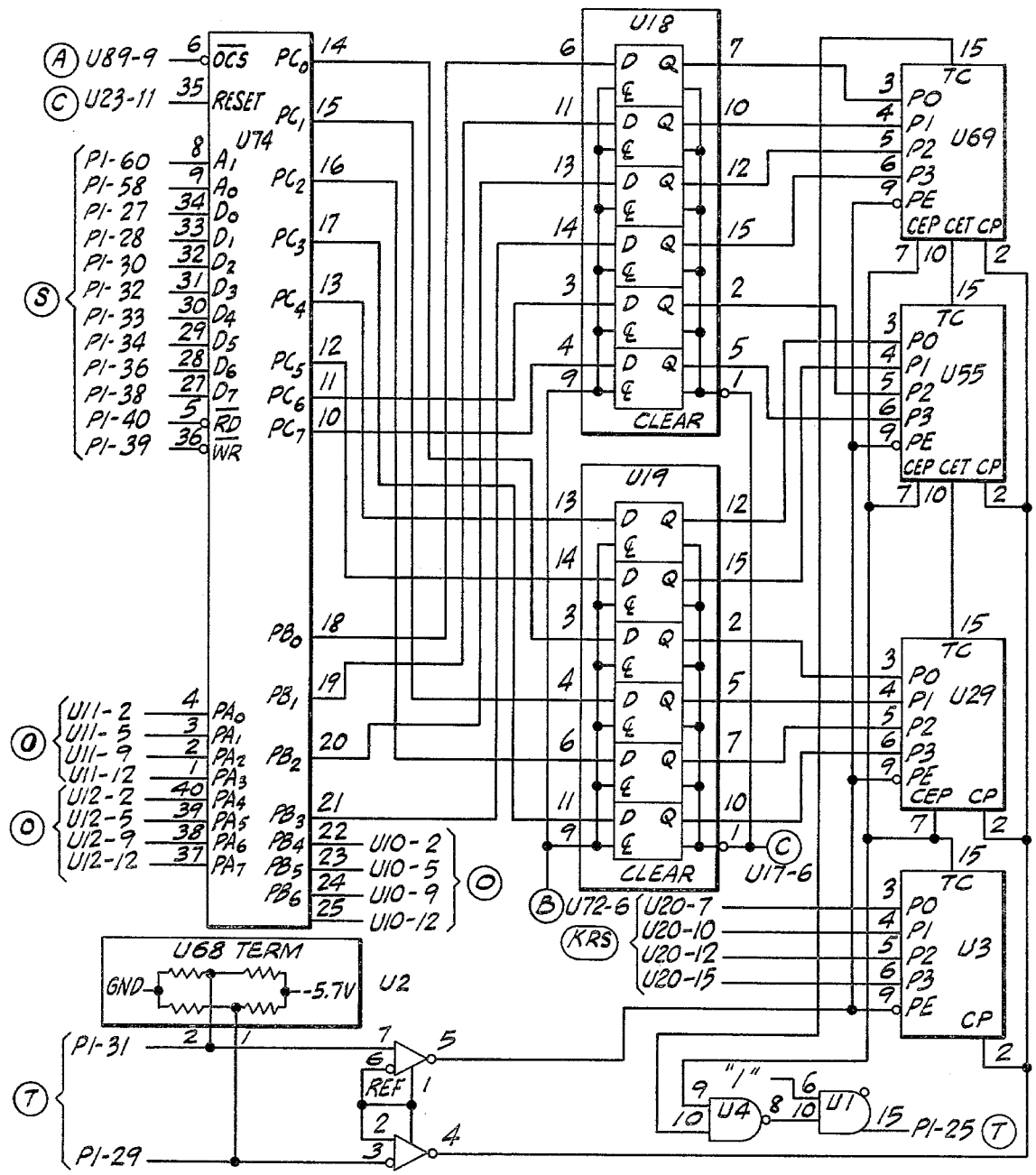
Figure 6L:
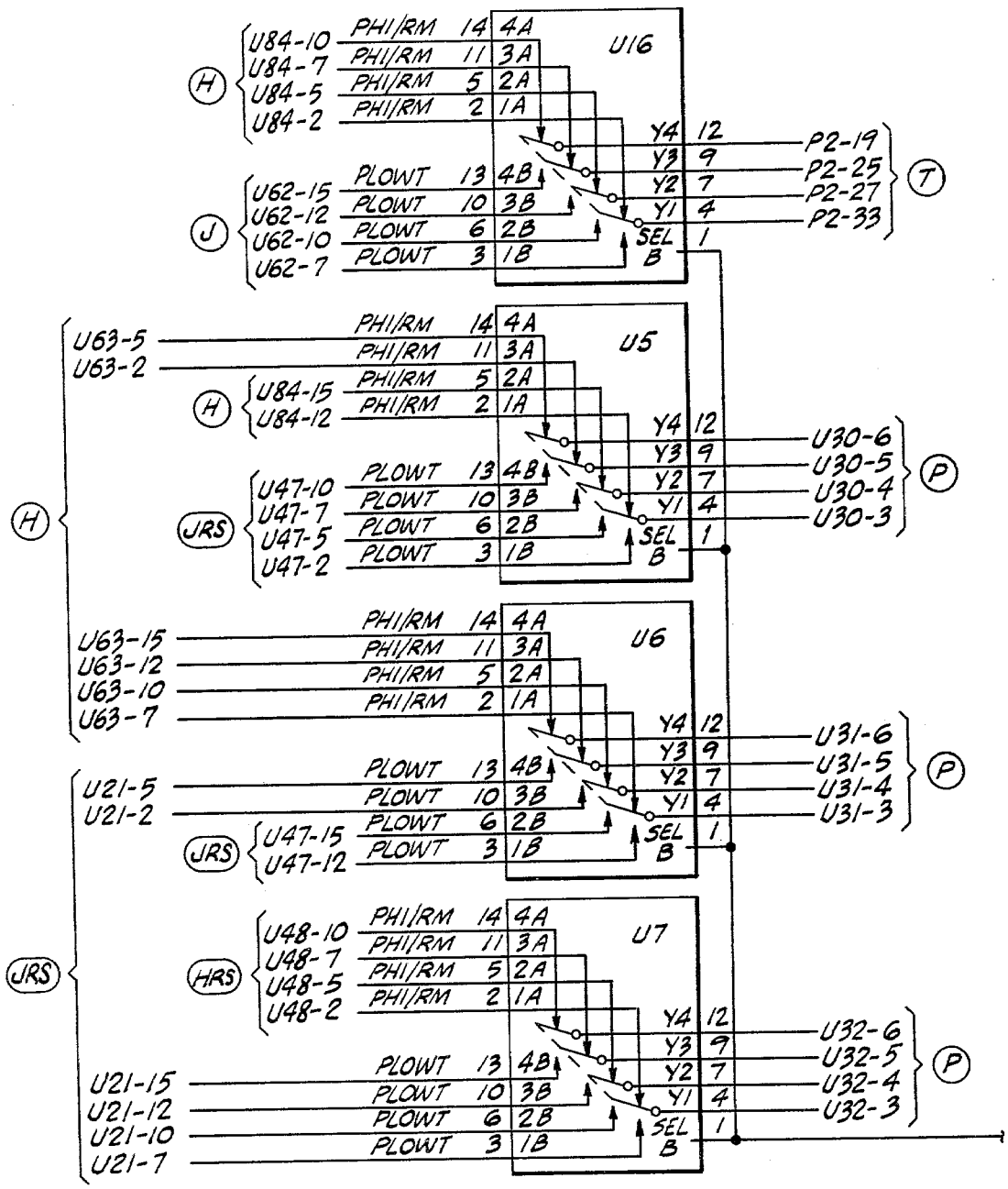
Figure 6M:
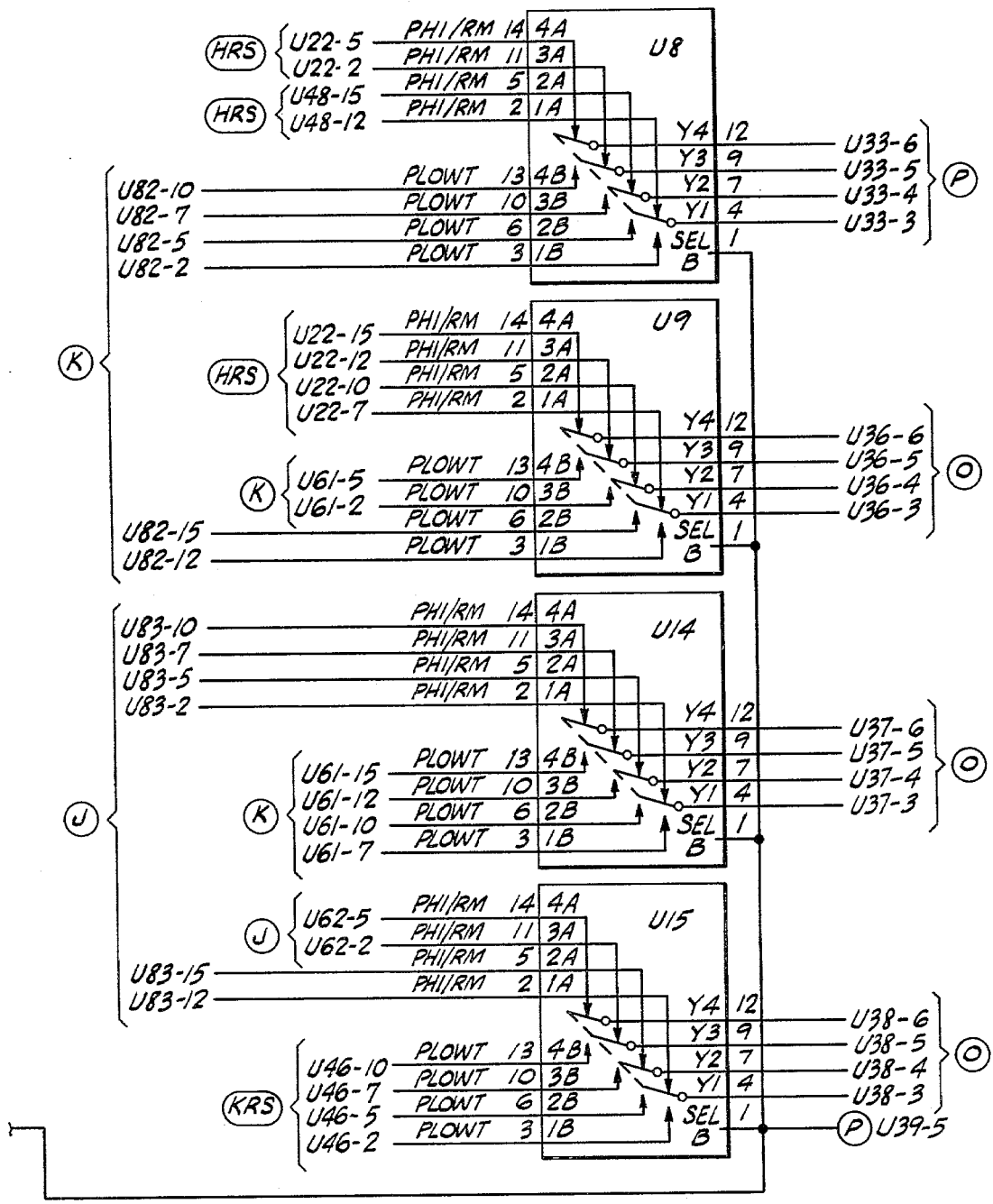
Figure 6N:
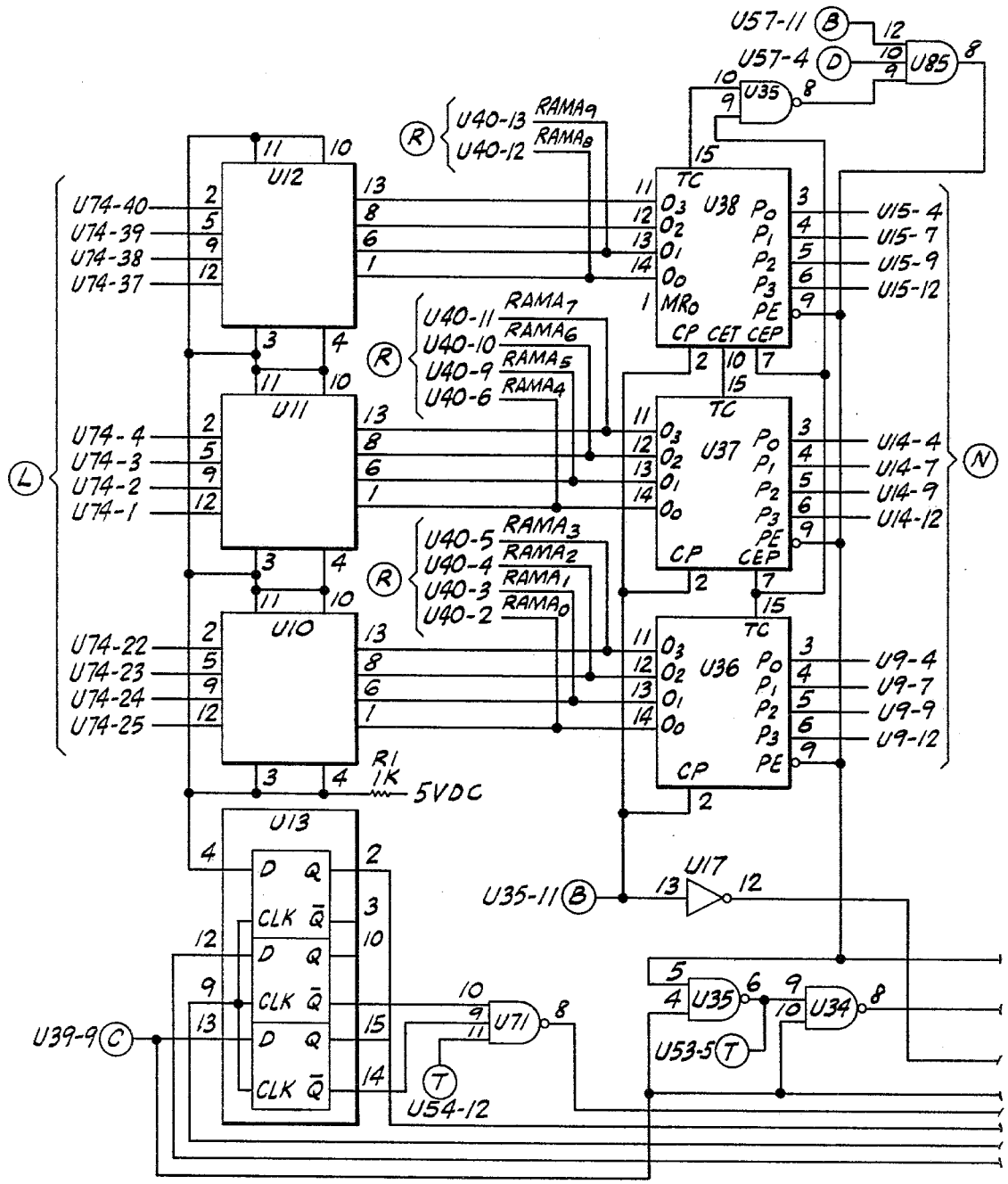
Figure 6O:
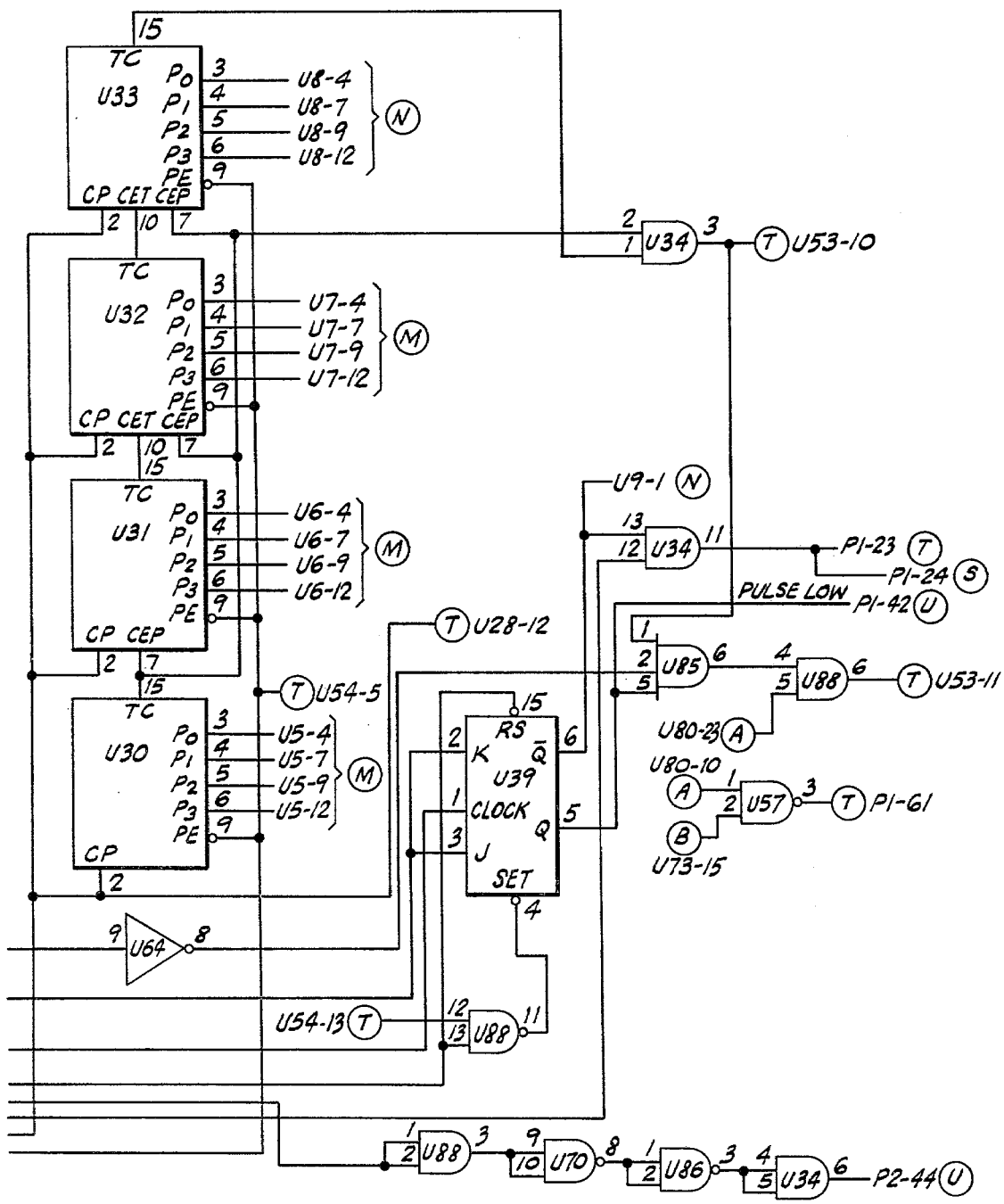
Figure 6P:
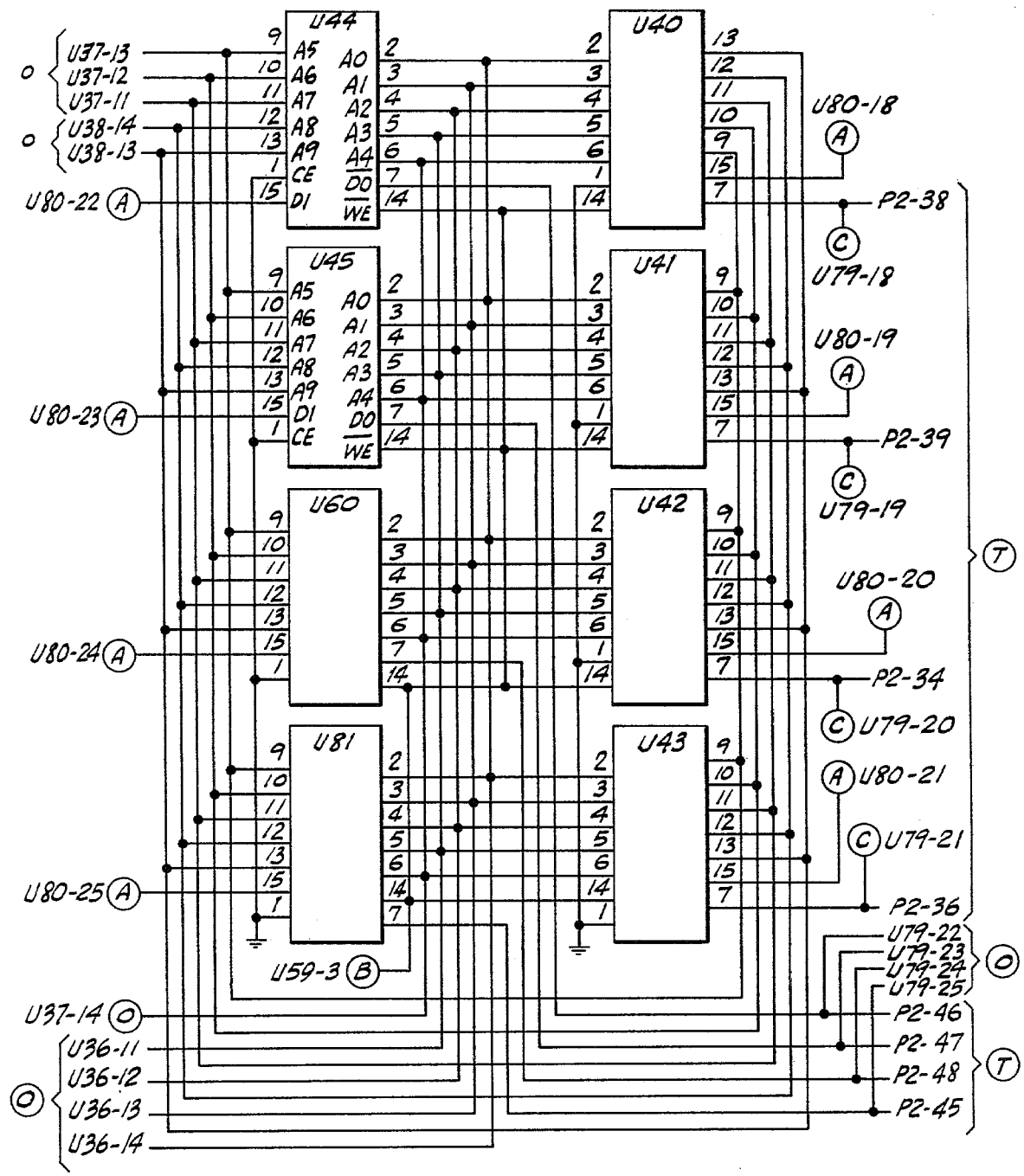
Figure 6Q:
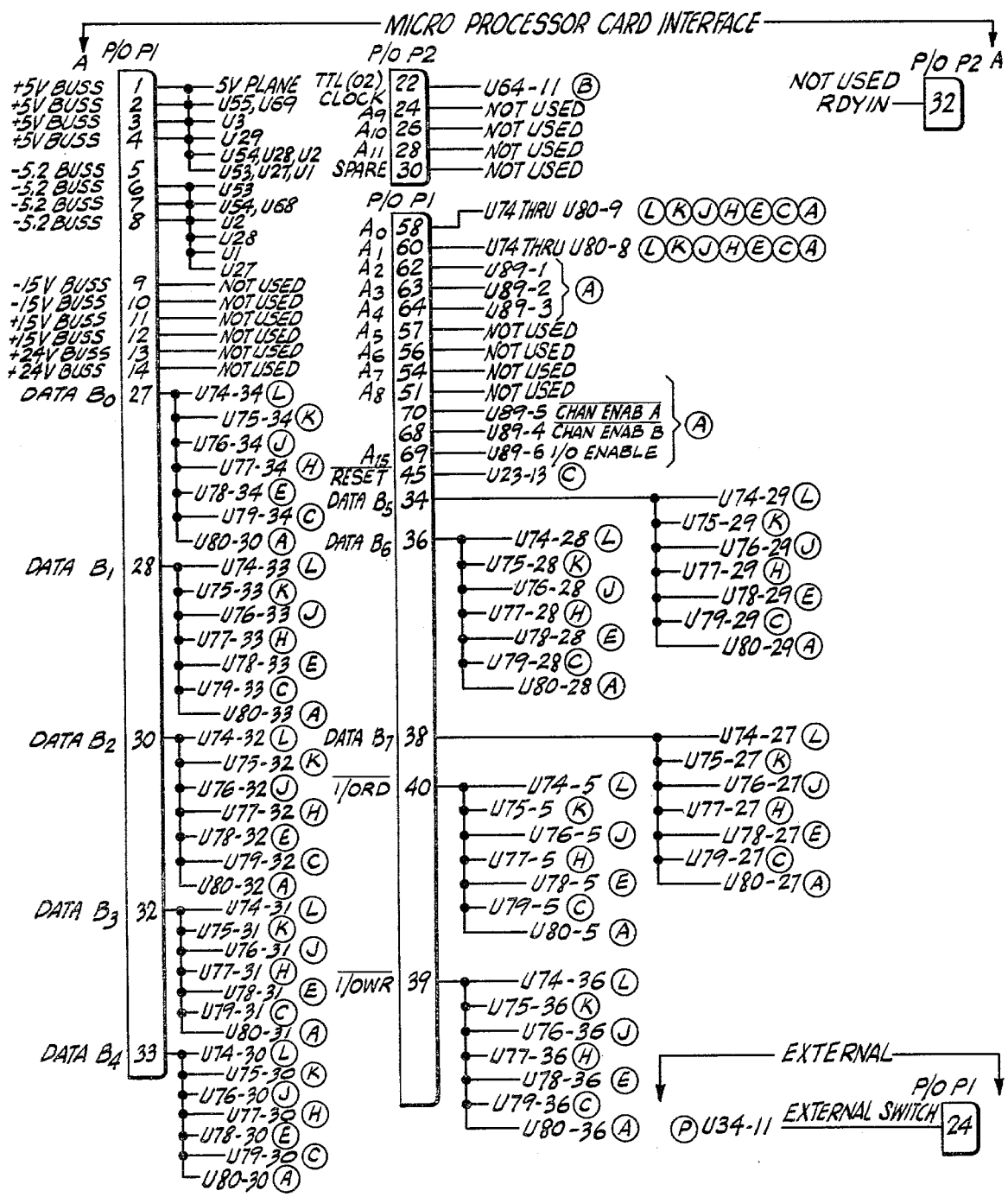
Figure 6R:
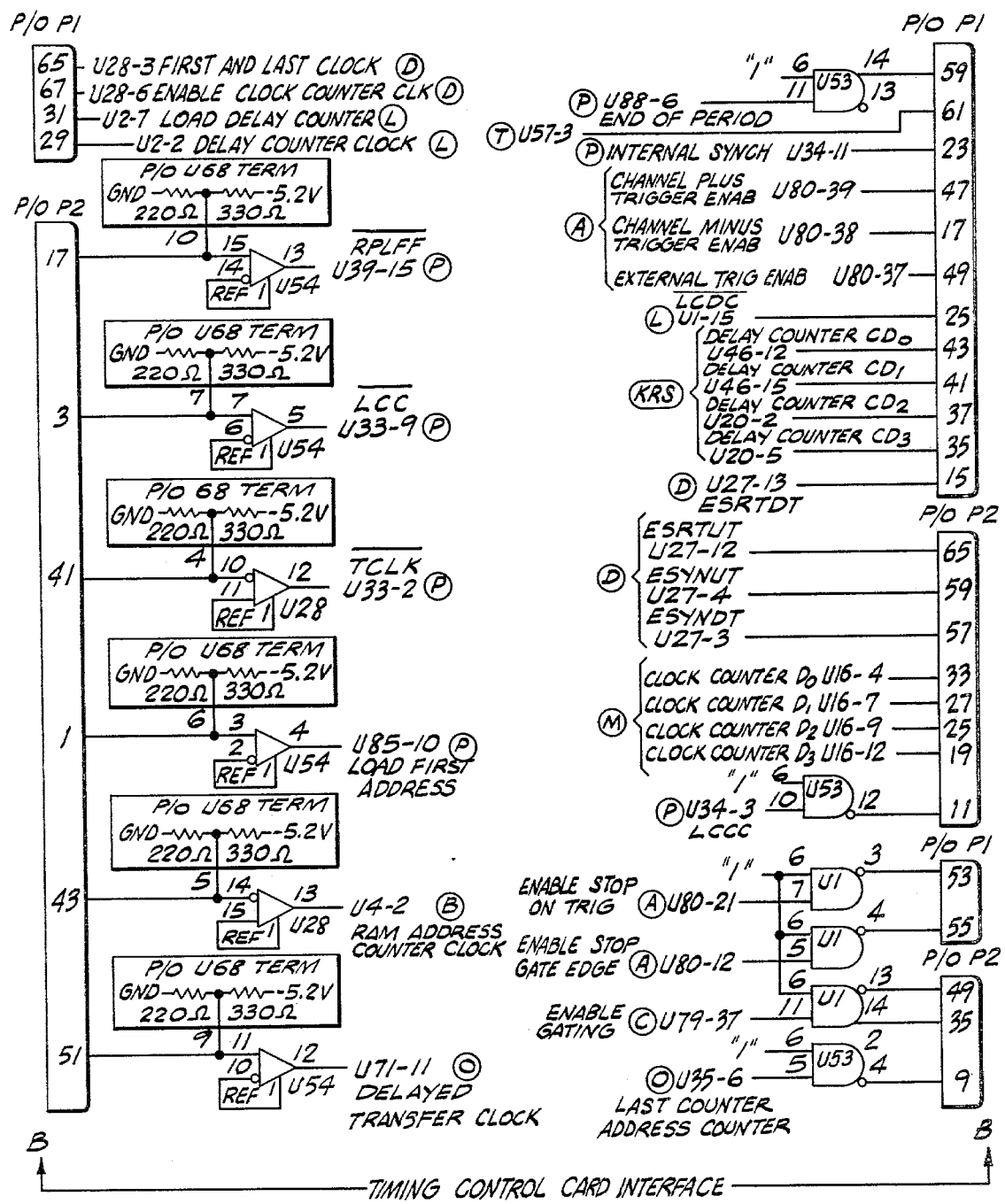
Figure 6S:
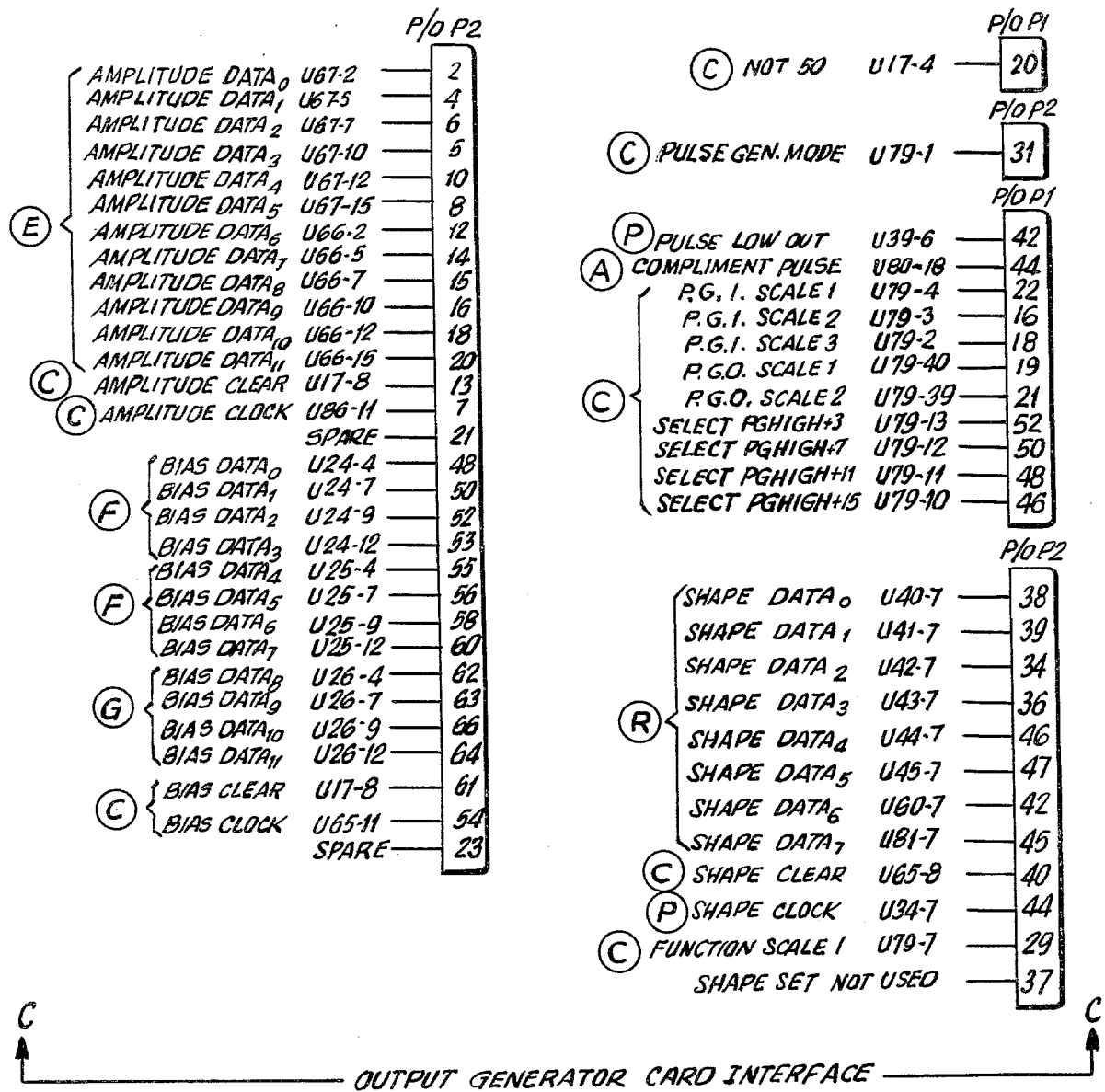
Figure 7A:
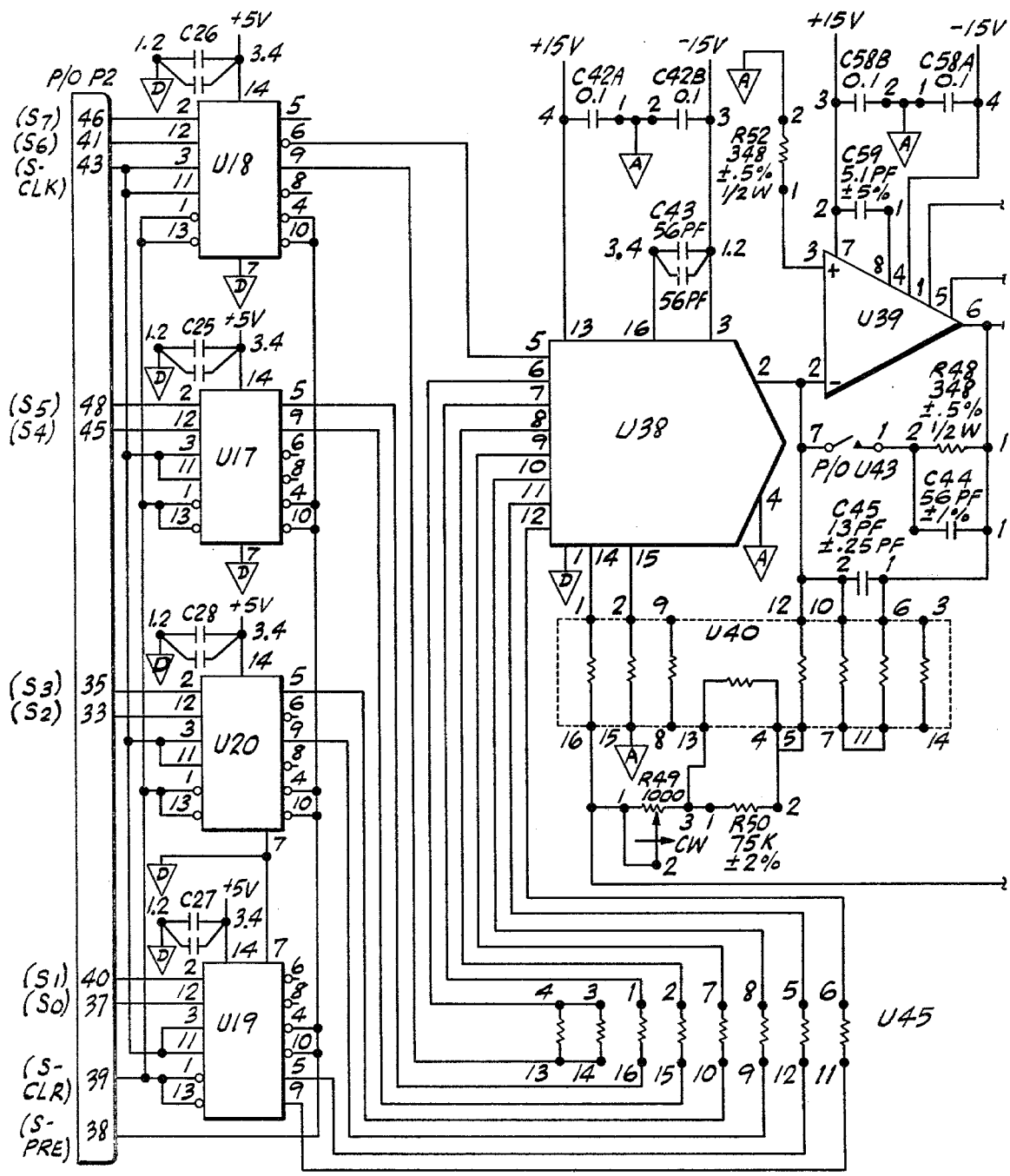
FIGS. 7a–i is a schematic diagram of the analog output network.
Figure 7B:
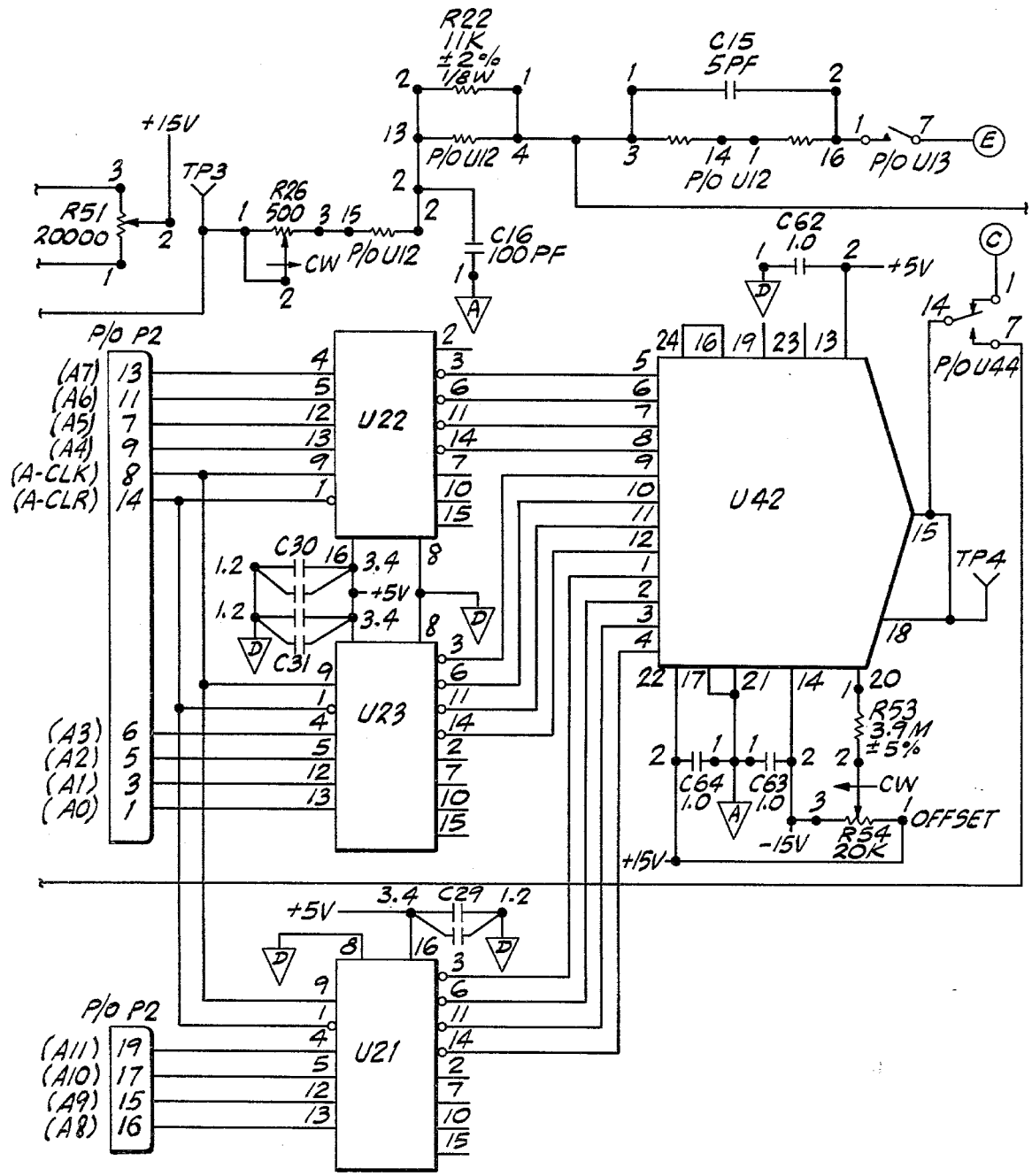
Figure 7C:
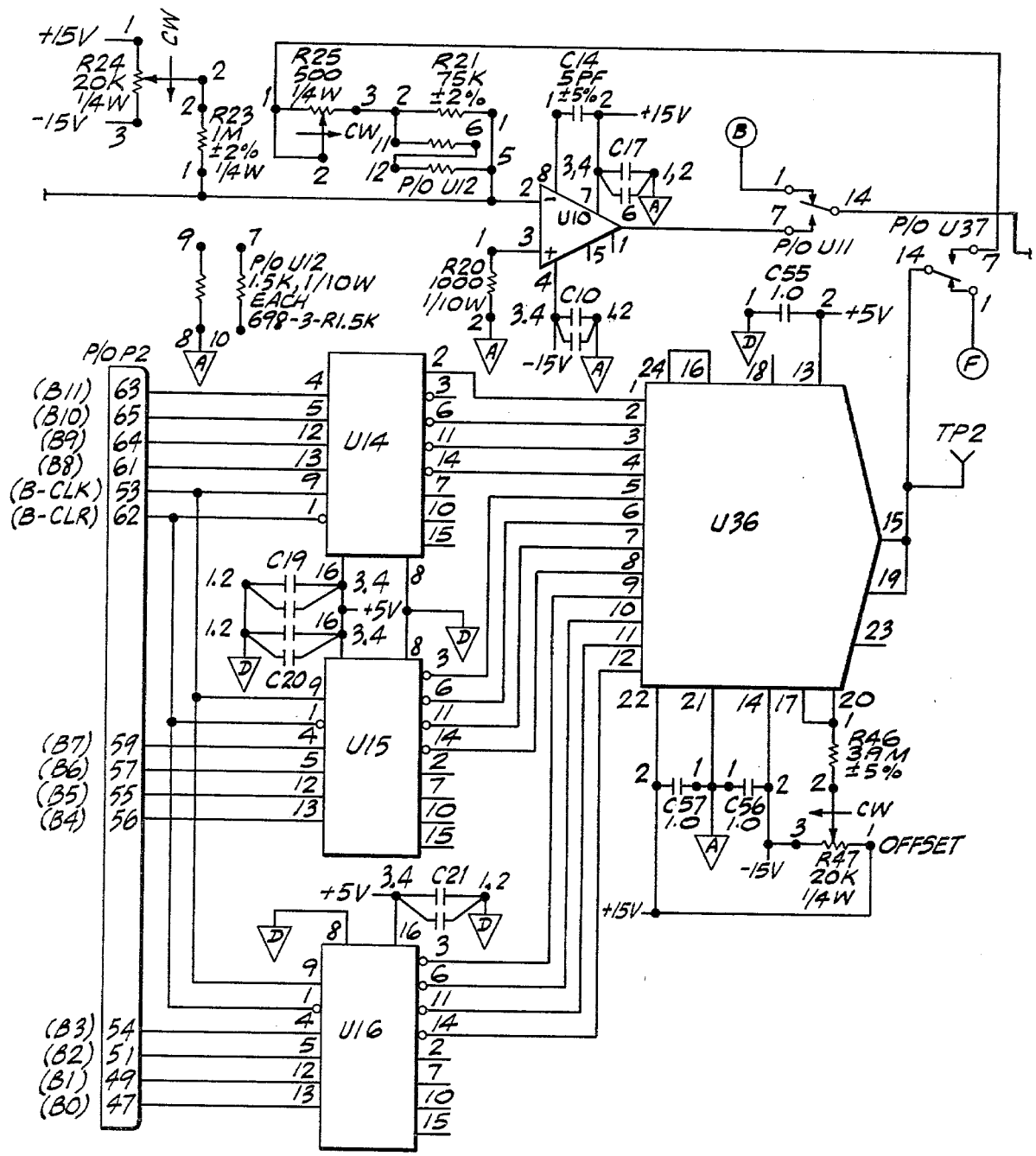
Figure 7D:
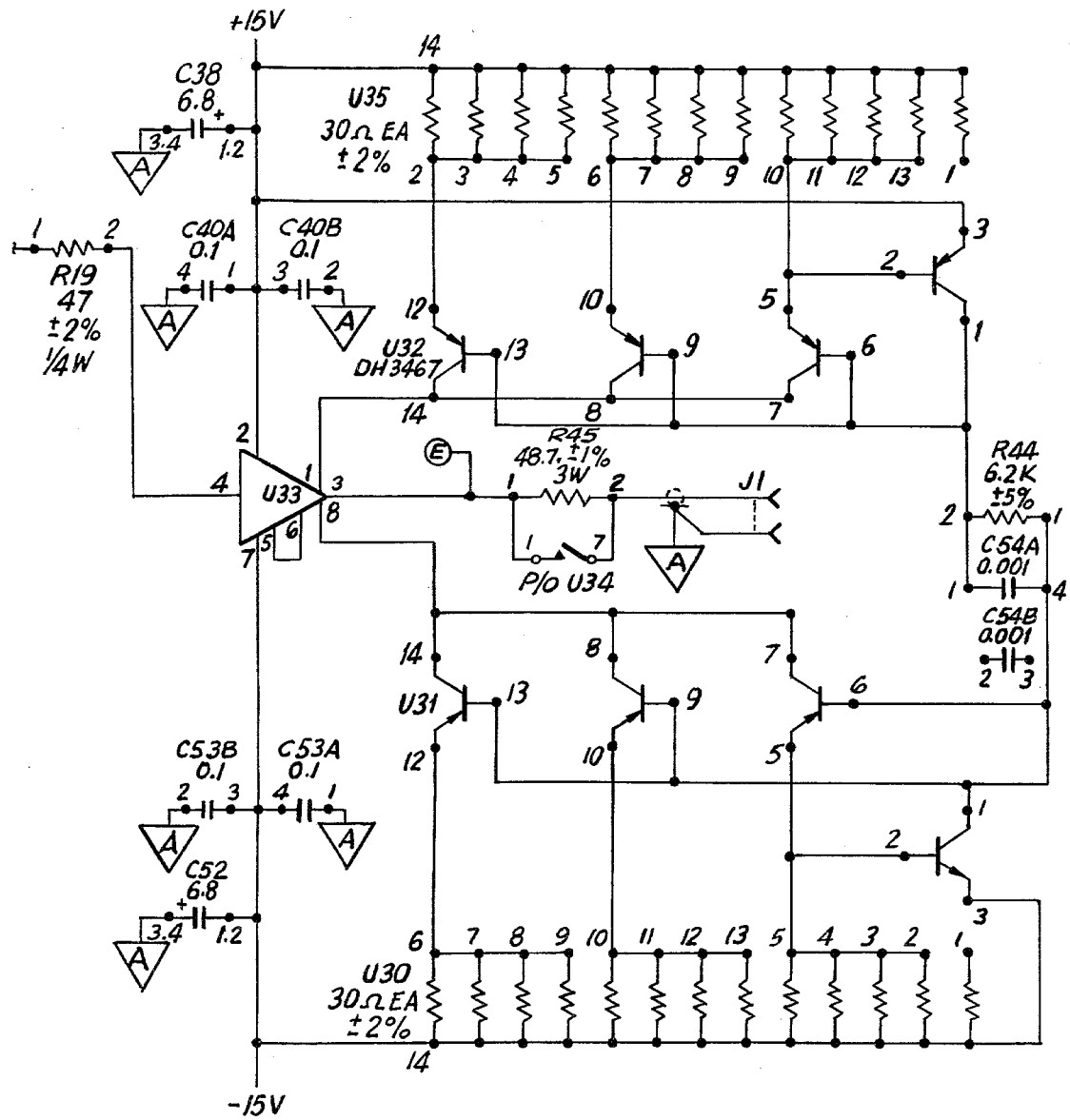
Figure 7E:
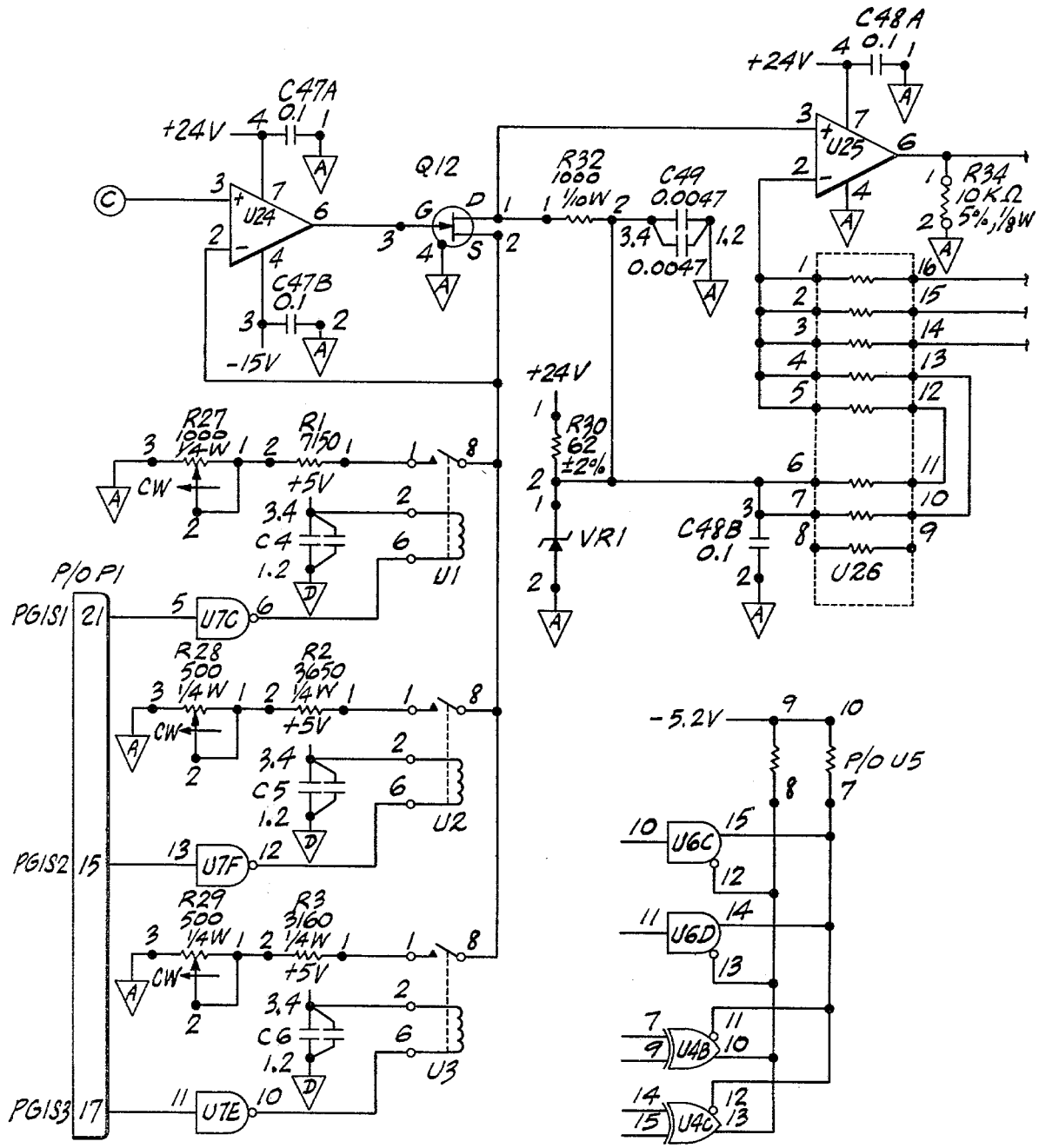
Figure 7F:
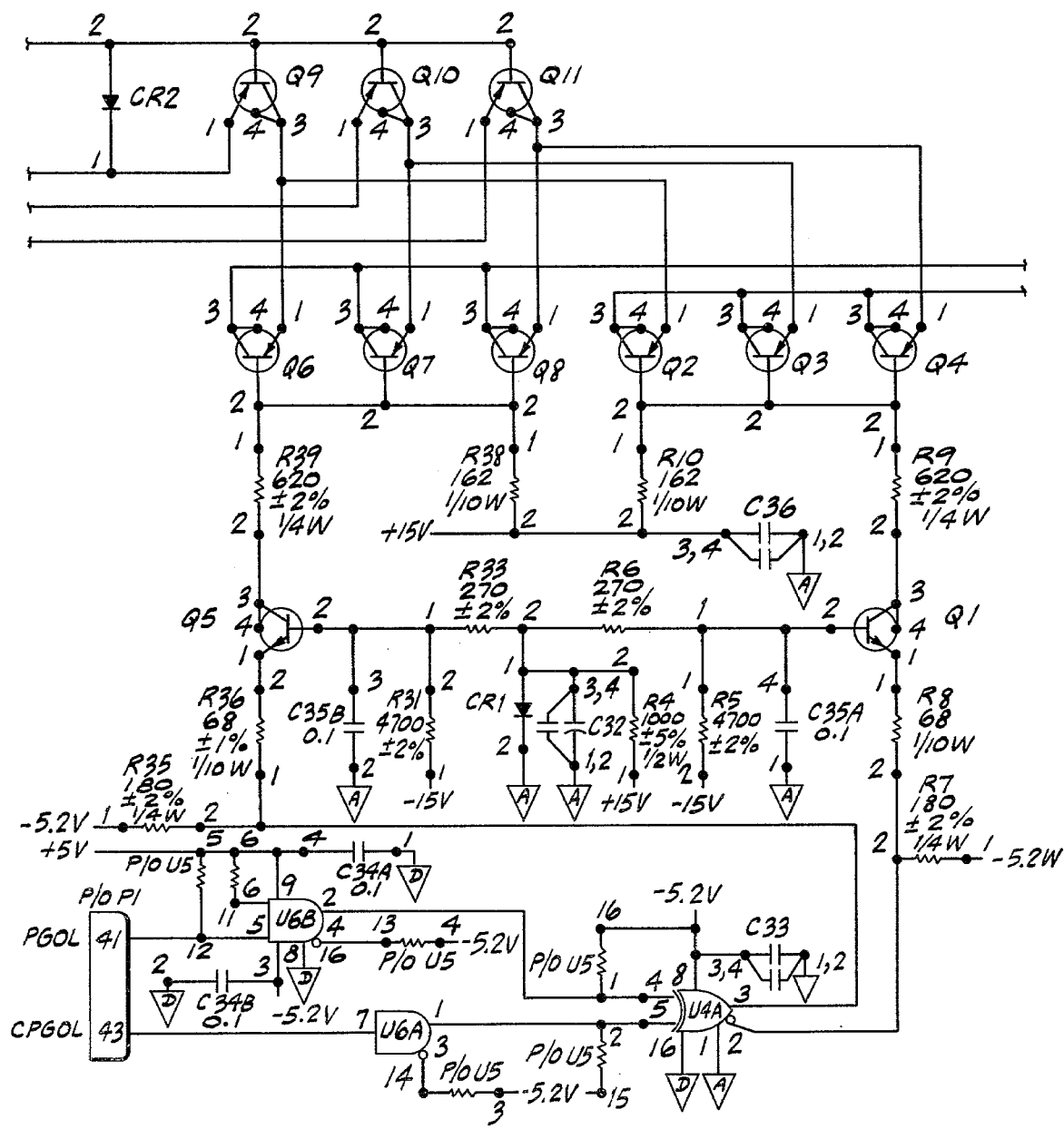
Figure 7G:
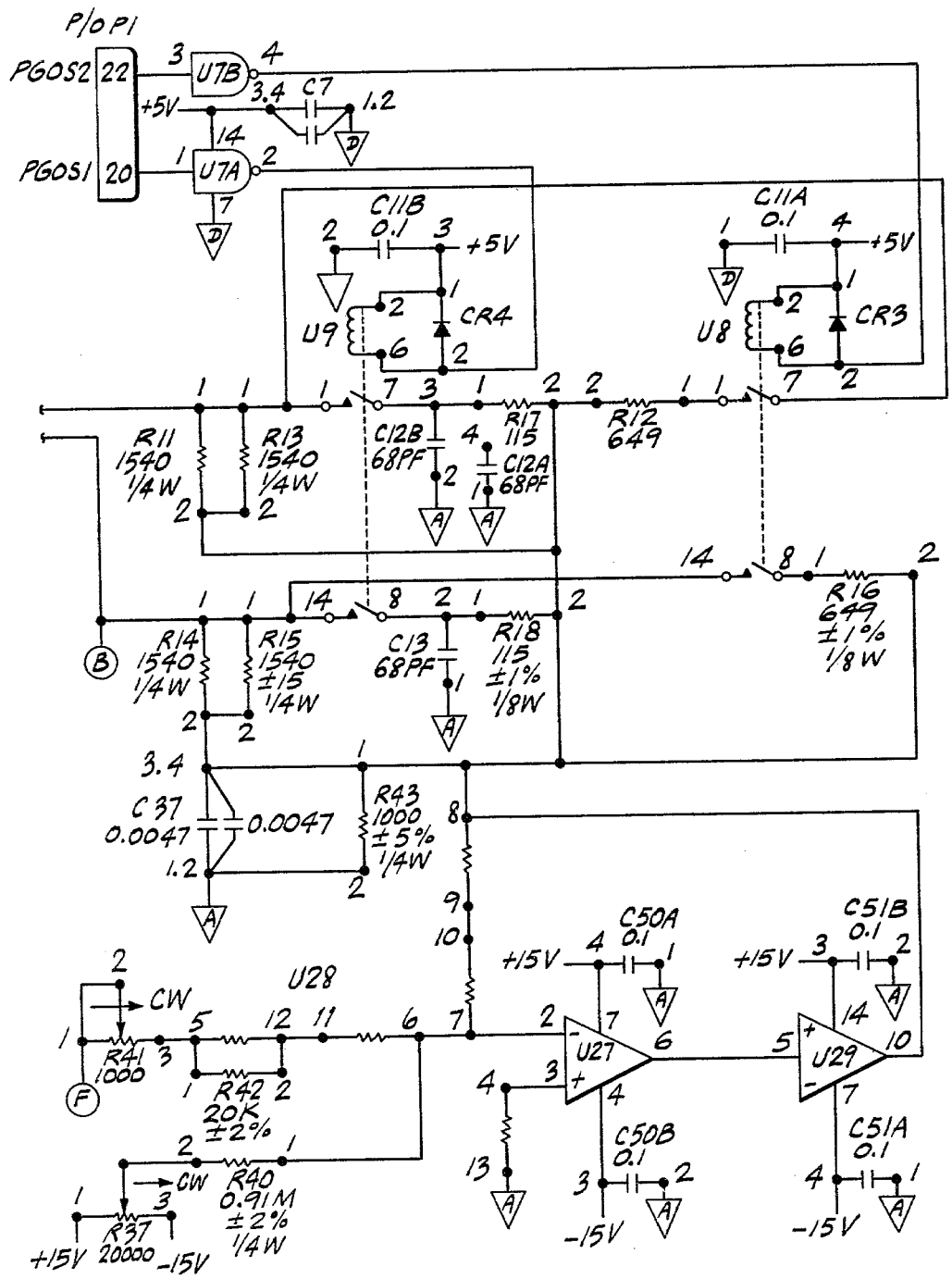
Figure 7H:
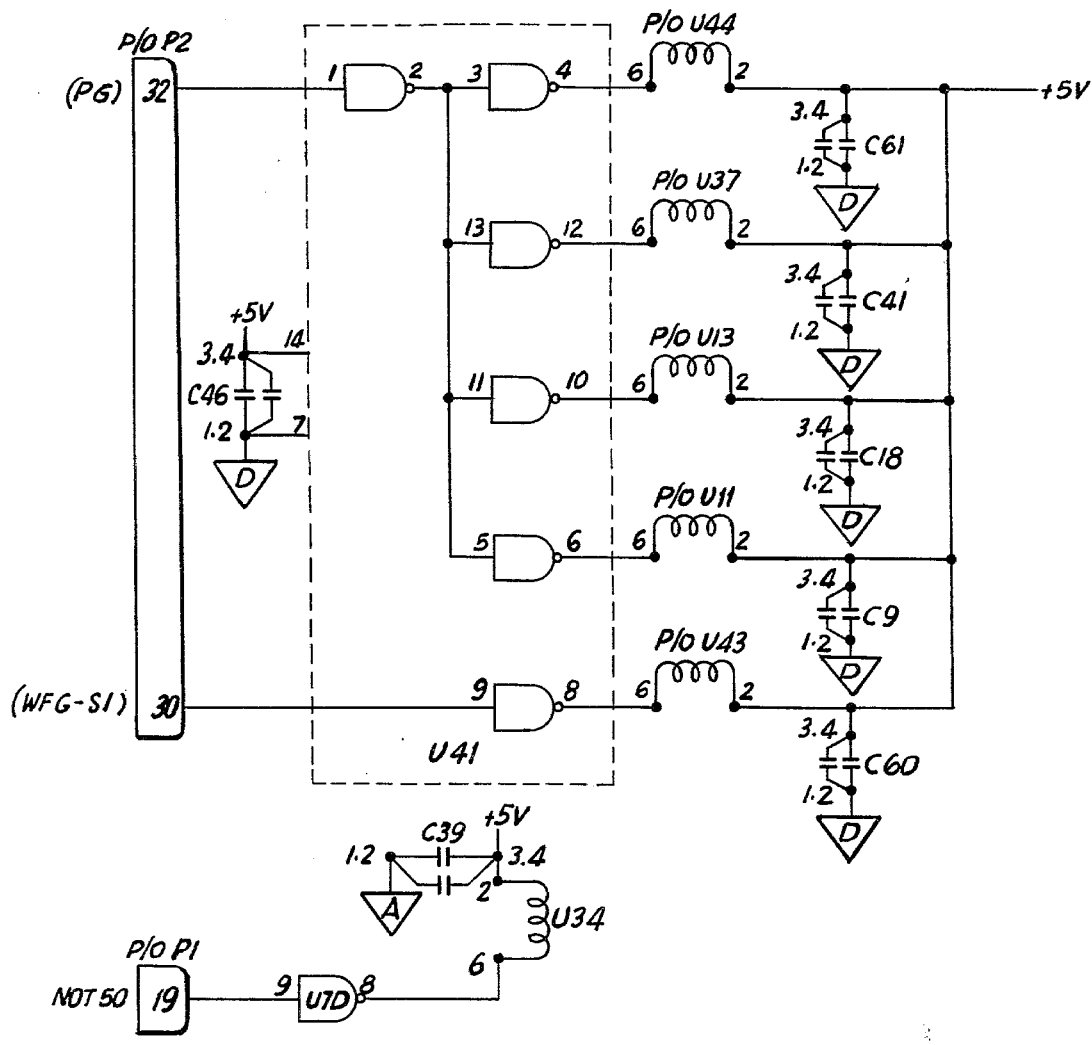
Figure 7I:
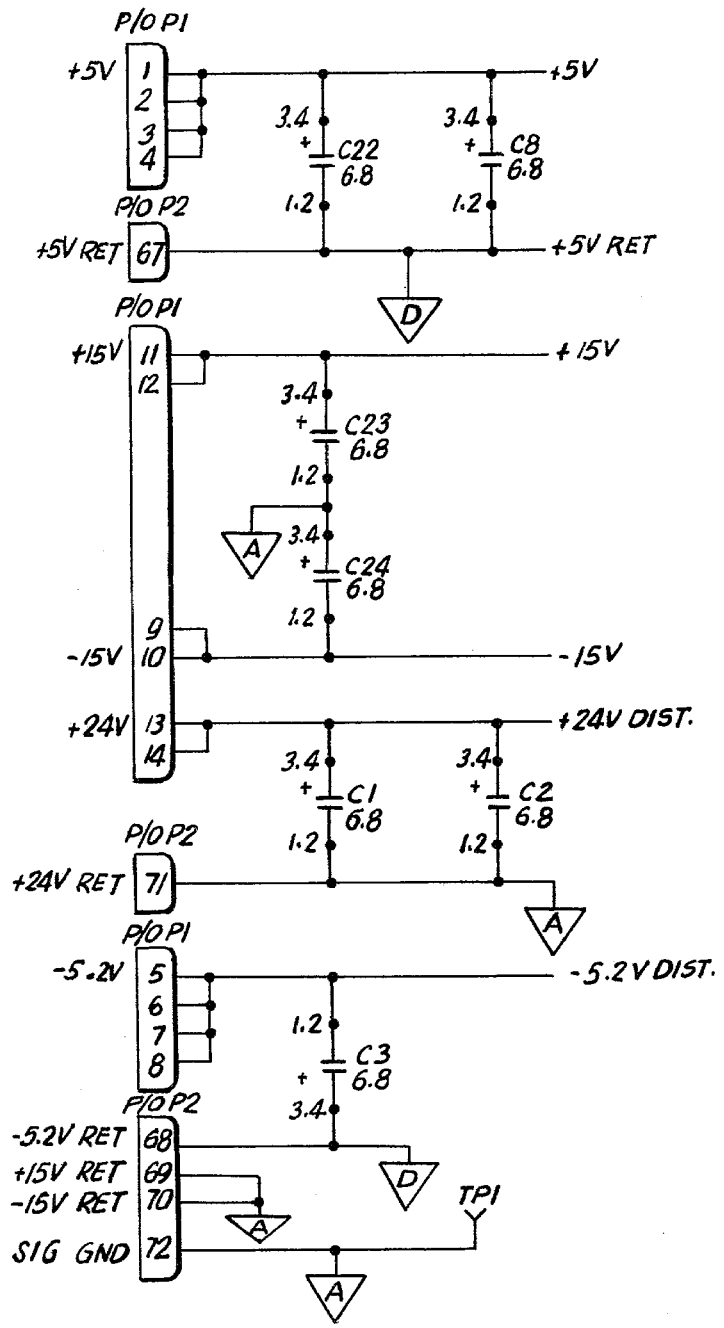

A schematic diagram of the TTL network is illustrated in FIGS. 6a–s. As shown therein, the microprocessor bus interface consists of: seven programmable interface circuits, U74 through U80; hex D input flip-flops, U18 through U22, U46 through U52, U61, U62, U63, U66, U67, J82, U84, and U87; load timing pulse generator quad D input flip-flop U73; and various NAND, AND, and inverter circuits.

The programmable interface circuits, U74 through U78, are each programmed to be three MODE 0 (No Handshake) output ports (A, B, C). Programmable interface circuit U79 has its port B programmed as a MODE 0 input port. Programmable interface circuit U80 has its port B programmed as a MODE 1 (One Way Handshake) output port.

Each programmable interface circuit has four addresses associated with it. Three addresses are used for writing data in or reading data out of ports A, B, and C. The fourth address is used to program the programmable interface.

The hex D input flip-flops are used as buffers. They permit the simultaneous changing of all bits of multibyte data loaded into the programmable interface ports. When writing into, or reading out of, port B of programmable interface circuit U80, three sequential 0.5 nsec timing pulses are generated by quad D flip-flop U73. These timing pulses initiate transfer of programmable interface data to the hex buffers for the three counters and, if enabled, to the hex buffers for amplitude and bias data; transfer of amplitude and bias data to the analog network; and load or increment the RAM address counter when it is under program control and, if enabled, load port B data from the programmable interface circuit U80 into the high speed function shape RAM U40 through U45, U60 and U81.

The delay counter consisting of U3, U29, U55, and U69 counts clock pulses generated by the ECL network. The ECL network also provides a load data pulse in addition to the first clock pulse. The two's complement of the number of clock periods to count is loaded into the delay counter. Upon reaching the maximum count, i.e., all bits equal to logic 1, a last count pulse is generated and sent to the ECL network which stops generation of clocks. All clock periods, except the first, are 100 nsec in duration. The first clock period can be from 50 to 140 nsec. The counter can be set to count from 1 to 65536 clocks enabling delay programming in 10 nsec increments from 50 nsec to 6.55364 msec.

When operating in the pulse mode, the timing counter, U30 through U33, and the RAM address counter, U36 through U38, function as a single counter capable of counting from 1 to 268,435,456 clock periods. As is the case with the delay counter, all clock periods but the first are 100 nsec; the first clock period being 50 to 140 nsec. When the combined counters (Timing and RAM address) reach maximum count, the JK inputs to the pulse level flip-flop are enabled. The flip-flop changes state on the next ECL network generated clock pulse. A load counter signal is generated by the ECL network during the last count period. Loading of pulse-high time is alternated with the loading of pulse-low time by multiplexers U5 through U9, and U14 through U16 as determined by the state of the pulse level flip-flop U39A.

When operating in the function mode, the timing counter and the RAM address counter function as separate counters. The timing counter functions to determine the period of the 30 nsec wide clock pulse that the ECL network generates for the RAM address counter. The timing counter also counts from 1 to 65536 clocks, however, in this case, the first clock period is from 80 to 170 nsec duration. The period of the clock pulse generated for the RAM address counter therefore varies from 80 nsec to 6.55367 msec. The pulse level flip-flop is locked to one state in the function mode by holding its set input low. The RAM address counter can count from 2 to 1024 clocks. The number of clocks that are counted for a function depends upon the output frequency. The two's complement of the number of points (clocks to count) defining the function is loaded into the RAM address counter. The ten least significant bits of the counter are used as the high speed RAM address. The data is loaded into the RAM under control of the microprocessor subsystem. When generating the function, the data that was stored in the RAM is read out and transferred to the analog network by way of a 30 nsec wide clock that is delayed by 60 to 70 nsecs from the RAM address counter clock. This delay is necessary to allow the data to stabilize before transfer to the analog output network.

A TTL level synchronization signal is generated in both the pulse and function modes. In the pulse mode the signal precedes the pulse by 30 to 50 nsecs. In the function mode the signal relationship to the main output is determined by the input data to the synch timing comparator, U10 through U13, and U34. The synch output is generated when this input data matches the RAM address counter value. In some modes of operation it is necessary to enable the channel to respond to only one trigger/synch. Quad D, U58, flip-flops A and B associated gates perform this function. Transfer and/or change of amplitude and bias data to the analog output network occurs (if programmed) upon receiving a first-last clock signal from the ECL network.

A schematic diagram of the analog output network is illustrated in FIGS. 7a–i. As shown therein, the analog output network can operate in either the function mode or the pulse mode.

The Function Mode is selected by a logic low on P2-32 (PG), causing hex inverter U41 to energize relays U11, U13, U37, and U44. Relays U11 and U13 transfer the output of amplifier U33 from the pulse circuitry to the function circuitry. Relay U37 transfers the bias input from the pulse circuitry to the function circuitry. Relay U44 transfers the amplitude input from the pulse circuitry to the function circuitry. The peak-to-peak value of any function is programmed as a 12 bit value to "D" type registers U21, U22, and U23. The positive edge of input P2-8 (ACLK) latches the data as an input to U42 (DAC 80). U42 is connected as a unipolar digital-to-analog converter (DAC) with a full scale range of plus ten volts. The offset error of U42 is set to zero with resistor R53. With U44 energized, the output of U42 is applied as the reference voltage of U38 (DAC 08), through reference resistor network U40. The output of U42 is also supplied through resistor network U40 as a bias offset to output amplifier U39 to convert its output to a bipolar voltage.

The shape of any function is determined by the sequential clocking of eight parallel bits of data through high speed "D" registers U17, U18, U19, and U20 to U38 (DAC 08). Clocking is on the positive edge of input P2-43 (S-CLK). The current output of U38 is transformed to a voltage by output amplifier U39 and either resistor network U40 alone (scale 2), or in parallel with resistor R48 (scale 1). Scale 1 is selected by closing relay U43 with a logic high on P2-30. The shape signal is then summed with the programmable bias offset signal through resistor network U12 by output amplifier U10. The bias offset is programmed as a 12 bit value to "D" registers U14, U15, U16. The positive edges of input P2-53 (BCLK) latches the data as an input to U36 (DAC 80). U36 is connected as a bipolar DAC with the range of minus ten volts to plus ten volts. Line Driving is provided by booster amplifier U33. Short circuit protection is provided by current limiting circuitry U30, U31, U32, U35.

The Pulse Mode is selected by a logic high on P2-32 (PG); relays U11, U13, U37, U44 are not energized. The peak-to-peak pulse amplitude is derived from the 12 Bit DAC (U42) and changed into a programmed current source by amplifier U24 and resistors R1, R2, or R3. The appropriate resistor is selected for scale 1, scale 2, or scale 3 by energizing relays U1, U2, or U3 respectively. The programmed current is amplified by resistor network U26 and amplifier U25. The amplified current source is then directed into the appropriate output scaling resistors R14, R15, R16 and R18 or a dummy load consisting of resistors R11, R12, R13, and R17. The appropriate scaling Resistor is selected by relays U8 or U9. The output pulse is high when transistors Q2, Q3, and Q4 are conducting since Q1 has been turned on by making U4 pin 2 ECL logic low. The input at P1-41 (PGOL) determines the pulse width and output frequency of the pulse generator. This input is exclusive or'd with the input at P1-43 (PNI) at U4A. Then with P1-43 high the output goes low when the input at P1-41 goes high. The complement of the pulse can be easily obtained by not changing the input sequence to P1-41 and setting P1-43 low.

The bias offset is programmed as in the function mode, but the output of U36 is now routed through amplifiers U27 and U29 and summed at the low end of the scaling resistors R11 and R18. The combined pulse and bias signal then connects to the input of line driver U33. Data input coding for both the pulse and function modes is given in the table illustrated in FIG. 8.

It is clear that the above description or the preferred embodiment in no way limits the scope of the present invention which is defined by the following claims.

What is claimed is:

1. Apparatus for generating an analog function in conjunction with an external data pattern comprising:
   (a) programmable function generating means responsive to said data pattern for generating a plurality of digital words representative of said analog function, said programmable function generating means including digital logic means activated by a clocking means;
   (b) control means for selectively transferring said data pattern to said programmable function generating means, said control means including microprocessor means adapted to receive said data pattern via an interface means; and
   (c) synthesizing means responsive to said programmable function generating means for converting said plurality of digital words to said analog function.

2. Apparatus as recited in claim 1 wherein said synthesizing means includes means for producing a sync output signal having a predetermined phase relationship with respect to said analog function.

3. Apparatus responsive to an external clocking means for generating an analog function in accordance with a data pattern stored in a host computer comprising:
   (a) programmable function generating means responsive to said data pattern for generating a plurality of digital words representative of said analog function, said programmable function generating means including digital logic means activated by said external clocking means;
   (b) control means for selectively transferring said data pattern to said programmable function generating means, said control means including microprocessor means adapted to receive said data pattern via an interface means;
   (c) synthesizing means responsive to said programmable function generating means for converting said plurality of digital words to said analog function; and
   (d) means for effecting communication of said data pattern between said host computer and said interface means.

4. Apparatus as recited in claim 3 wherein said stored data pattern is ASCII format compatible; and said interface means is IEEE-488 compatible.

5. Apparatus as recited in claim 4 wherein said synthesizing means including means for producing a sync output signal having a predetermined phase relationship with respect to said analog function.

6. Apparatus responsive to an external clocking means for generating an analog function in accordance with an ASCII format compatible data pattern stored in a host computer comprising:
   (a) programmable function generating means responsive to said data pattern for generating a plurality of digital words representative of said analog function, said programmable function generating means including high speed digital logic means activated by said external clocking means;
   (b) microprocessor control means for selectively transferring said data pattern to said programmable function generating means, said control means adapted to receive said data pattern via an IEEE-488 compatible interface;
(c) high speed synthesizing means responsive to said programmable function generating means for converting said plurality of digital words to said analog function; and
(d) bi-directional means for effecting communication of said data pattern between said host computer and said interface means.

7. Apparatus as recited in claim 6 wherein said synthesizing means includes means for producing a sync output signal having a predetermined phase relationship with respect to said analog function.

8. Apparatus as recited in claim 7 wherein said high speed digital logic means is configured to operate in conjunction with an external triggering means.

9. Apparatus as recited in claim 8 wherein said high speed digital logic means is configured to operate in conjunction with an external gating means.

10. Apparatus responsive to an' external clocking means for generating a plurality of independent analog functions in conjunction with an external data pattern comprising:
(a) a plurality of programmable function generating means responsive to said data pattern, each of said plurality of programmable function generating means including means for generating a corresponding plurality of digital words representative of one of said plurality of analog functions, each of said plurality of programmable function generating means further including digital logic means activated by said external clocking means;
(b) control means for selectively transferring said data pattern to each of said plurality of programmable function generating means, said control means including microprocessor means adapted to receive said data pattern via an interface means; and
(c) a plurality of synthesizing means, each of said plurality of synthesizing means responsive to one of said plurality of programmable function generating means, each of said plurality of synthesizing means including means for converting said corresponding plurality of digital words to one of said plurality of analog functions.

11. Apparatus as recited in claim 10 wherein each of said plurality of synthesizing means includes means for producing a sync output signal having a predetermined phase relationship with respect to one of said plurality of analog functions.

12. Apparatus responsive to an external clocking means for generating a plurality of independent analog functions in accordance with a data pattern stored in a host computer comprising:
(a) a plurality of programmable function generating means responsive to said data pattern, each of said plurality of programmable function generating means including means for generating a corresponding plurality of digital words representative of one of said plurality of analog functions, each of said plurality of programmable function generating means further including digital logic means activated by said external clocking means;
(b) control means for selectively transferring said data pattern to each of said plurality of programaable function generating means, said control means including microprocessor means adapted to receive said data pattern via an interface means;
(c) a corresponding plurality of synthesizing means responsive to said plurality of programmable function generating means, each of said plurality of synthesizing means including means for converting said corresponding plurality of digital words to one of said plurality of analog functions; and
(d) means for effecting communication of said data pattern between said host computer and said interface means.

13. Apparatus as recited in claim 12 wherein said stored data pattern is ASCII format compatible; and said interface means is IEEE-488 compatible.

14. Apparatus as recited in claim 13 wherein each of said plurality of synthesizing means includes means for producing a sync output signal having a predetermined phase relationship with respect to one of said plurality of analog functions.

15. Apparatus responsive to an external clocking means for generating a plurality of independent analog functions in accordance with an ASCII format compatible data pattern stored in a host computer comprising:
(a) a plurality of programmable function generating means responsive to said data pattern, each of said plurality of programmable function generating means including means for generating a corresponding plurality of digital words representative of one of said plurality of analog functions, each of said plurality of programmable function generating means further including high speed digital logic means activated by said external clocking means;
(b) microprocessor control means for selectively transferring said data pattern to each of said plurality of programmable function generating means, said control means adapted to receive said data pattern via an IEEE-488 compatible interface means;
(c) a corresponding plurality of high speed synthesizing means responsive to said plurality of programmable function generating means, each of said plurality of synthesizing means including means for converting said corresponding plurality of digital words to one of said plurality of analog function; and
(d) bi-directional means for effecting communication of said data pattern between said host computer and said interface means.

16. Apparatus as recited in claim 15 wherein each of said plurality of synthesizing means includes means for producing a sync output signal having a predetermined phase relationship with respect to one of said plurality of analog functions.

17. Apparatus as recited in claim 16 wherein said high speed digital logic means is configured to operate in conjunction with an external triggering means.

18. Apparatus as recited in claim 17 wherein said high speed digital logic means is configured to operate in conjunction with an external gating means.

19. Apparatus responsive to an external clocking means for generating independent analog functions in accordance with an ASCII format compatible data pattern stored in a host computer comprising:
(a) first programmable function generating means responsive to said data pattern for generating a first plurality of digital words representative of a first analog function, said first programmable function generating means including high speed digital logic means activated by said external clocking means;

(b) second programmable function generating means responsive to said data pattern for generating a second plurality of digital words representative of a second analog function, said second programmable function generating means including high speed digital logic means activated by said external clocking means;

(c) third programmable function generating means responsive to said data pattern for generating a third plurality of digital words representative of a third analog function, said third programmable function generating means including high speed digital logic means activated by said external clocking means;

(d) microprocessor control means for selectively transferring said data pattern to said first, second and third programmable function generating means, said control means adapted to receive said data pattern via an IEEE-488 compatible interface means;

(e) first high speed synthesizing means responsive to said first programmable function generating means for converting said first plurality of digital words to said first analog function;

(f) second high speed synthesizing means responsive to said second programmable function generating means for converting said second plurality of digital words to said second analog function;

(g) third high speed synthesizing means responsive to said third programmable function generating means for converting said third plurality of digital words to said third analog function; and (h) bi-directional means for effecting communication of said data pattern between said host computer and said interface means.

20. Apparatus as recited in claim 19 wherein said first synthesizing means includes means for producing a first sync output signal having a predetermined phase relationship with respect to said first analog function; said second synthesizing means includes means for producing a second sync output signal having a predetermined phase relationship with respect to said second analog function; and said third synthesizing means includes means for producing a third sync output signal having a predetermined phase relationship with respect to said third analog function.

21. Apparatus as recited in claim 20 wherein said high speed digital logic means is configured to operate in conjunction with an external triggering means.

22. Apparatus as recited in claim 21 wherein said high speed digital logic means is configured to operate in conjunction with an external gating means.

23. Apparatus as recited in claim 22 wherein said first programmable function generating means is adapted to operate in conjunction with one of said external triggering means and said external gating means and said second sync output signal and said third sync output signal; said second programmable function generating means is adapted to operate in conjunction with one of said external triggering means and said external gating means and said third sync output signal and said first sync output signal; and said third programmable function generating means is adapted to operate in conjunction with one of said external triggering means and said external gating means and said first sync output signal and said second sync output signal.

* * * * *